(12) United States Patent
Igaki et al.

(10) Patent No.: US 9,185,753 B2
(45) Date of Patent: Nov. 10, 2015

(54) LIGHTING SYSTEM

(75) Inventors: Masaru Igaki, Kyoto (JP); Kohei Mizuta, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 132 days.

(21) Appl. No.: 13/554,087

(22) Filed: Jul. 20, 2012

(65) Prior Publication Data

US 2013/0020955 A1 Jan. 24, 2013

(30) Foreign Application Priority Data

| Jul. 21, 2011 | (JP) | 2011-159637 |
| Jul. 26, 2011 | (JP) | 2011-163063 |
| Aug. 12, 2011 | (JP) | 2011-176790 |
| Sep. 2, 2011 | (JP) | 2011-192125 |
| Sep. 7, 2011 | (JP) | 2011-195247 |
| Sep. 21, 2011 | (JP) | 2011-205920 |
| Sep. 30, 2011 | (JP) | 2011-217173 |
| May 28, 2012 | (JP) | 2012-121061 |

(51) Int. Cl.
*H05B 33/08* (2006.01)

(52) U.S. Cl.
CPC .......... *H05B 33/0803* (2013.01); *H05B 33/086* (2013.01); *H05B 33/0815* (2013.01); *Y02B 20/346* (2013.01)

(58) Field of Classification Search
None
See application file for complete search history.

(56) References Cited

U.S. PATENT DOCUMENTS

| 8,134,300 B2* | 3/2012 | Maglica et al. ........... 315/200 A |
| 8,207,680 B2* | 6/2012 | Nakada et al. ............... 315/291 |
| 8,274,232 B2* | 9/2012 | Nerone ...................... 315/209 R |
| 8,373,346 B2* | 2/2013 | Hoogzaad et al. ........ 315/185 R |
| 8,508,148 B1* | 8/2013 | Carley et al. .................. 315/291 |
| 8,508,150 B2* | 8/2013 | Kuo et al. ..................... 315/291 |
| 8,541,955 B2* | 9/2013 | Okawa ......................... 315/291 |
| 8,710,752 B2* | 4/2014 | Jin et al. ........................ 315/186 |
| 2011/0175536 A1* | 7/2011 | Fujita et al. ............... 315/185 R |
| 2011/0227492 A1* | 9/2011 | Du et al. ....................... 315/186 |

FOREIGN PATENT DOCUMENTS

| CN | 201582601 U | 9/2010 |
| CN | 201766754 U | 3/2011 |
| JP | 11-233283 | 8/1999 |
| JP | 11-312591 | 11/1999 |
| JP | 2007-122950 | 5/2007 |
| JP | 2007-265818 | 10/2007 |
| JP | 2008-108598 | 5/2008 |
| JP | 2008-300124 | 12/2008 |

(Continued)

*Primary Examiner* — Douglas W Owens
*Assistant Examiner* — Dedei K Hammond
(74) *Attorney, Agent, or Firm* — Hamre, Schumann, Mueller & Larson, P.C.

(57) ABSTRACT

A lighting system includes a main power source, a power switch, a daylight white color light source driver, an incandescent color light source driver, a first light source unit, and a second light source unit. The power switch includes a first terminal connected to the main power source, a second terminal and a control terminal. The two drivers are connected to the second terminal of the power switch. The first light source unit is driven by the daylight white color light source driver. The second light source unit is driven by the incandescent color light source driver. A switch driving circuit for applying power-saving switch signals is connected to the control terminal of the power switch, and a signal processing circuit for outputting instruction signals is connected to the switch driving circuit.

12 Claims, 72 Drawing Sheets

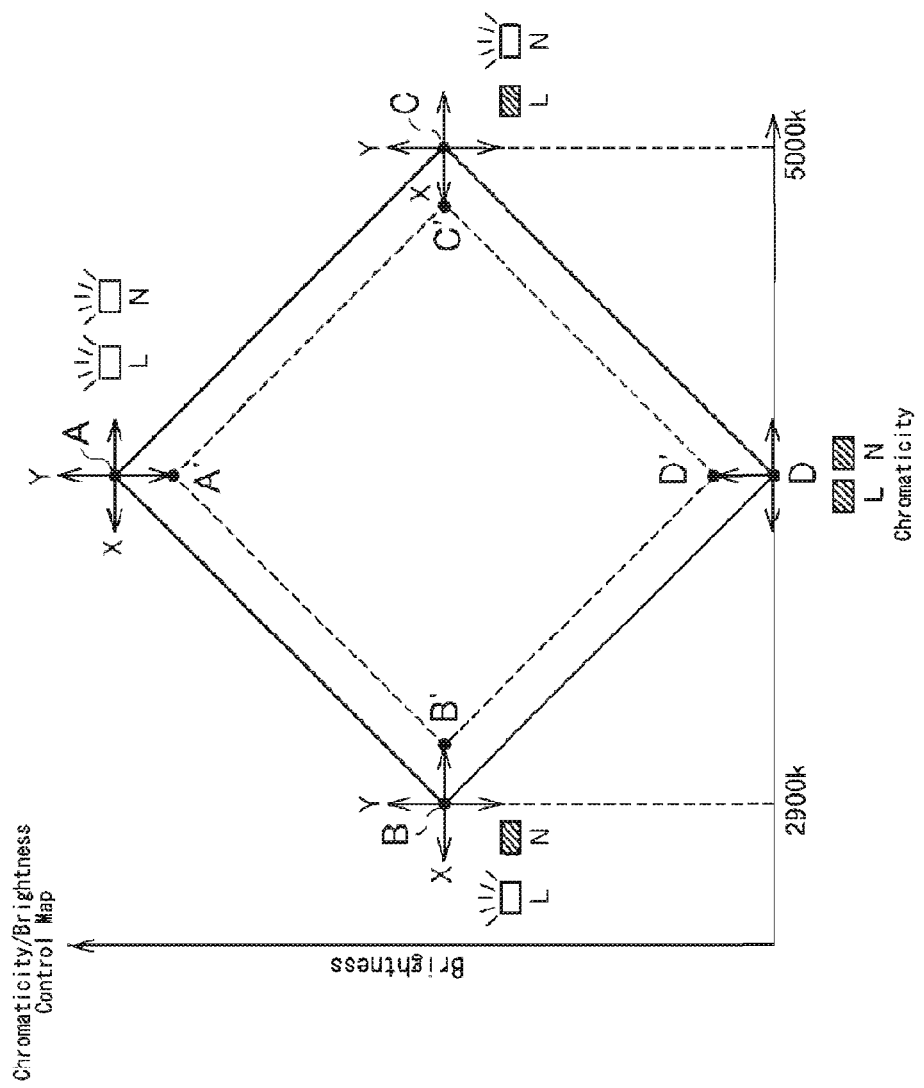

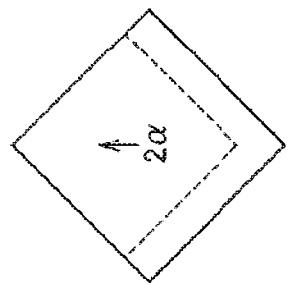
FIG.14D Down Shift
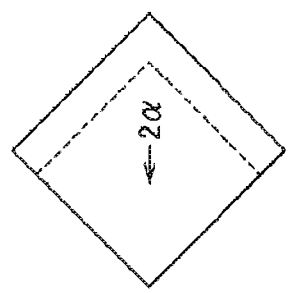
FIG.14C Right Shift
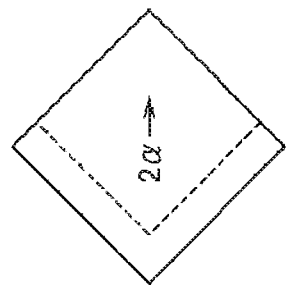
FIG.14B Left Shift
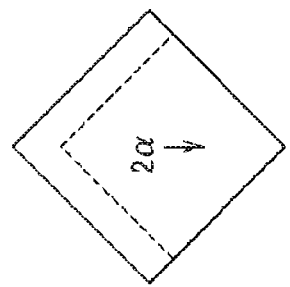
FIG.14A Up Shift

FIG.15A

|   | A | B | C | D |
|---|---|---|---|---|
| L | 100% | 100% | 0% | 0% |
| N | 100% | 0% | 100% | 0% |

FIG.15B

|   | A' | B' | C' | D' |
|---|---|---|---|---|
| L | (100−α)% | (100−α)% | (0+α)% | (0+α)% |
| N | (100−α)% | (0+α)% | (100−α)% | (0+α)% |

LIGHTING SYSTEM

BACKGROUND OF THE INVENTION

1. Field of the Invention

The present invention relates to a lighting system configured to reduce the standby power.

A variation of the present invention relates to an LED lighting apparatus that uses LEDs (light emitting diodes) as the light source.

A variation of the present invention relates to an LED lighting apparatus which uses LEDs (light emitting diodes) as the light source and which is configured to be operable by remote control.

A variation of the present invention relates to an LED lighting apparatus including LED chips.

2. Description of the Related Art

Reduction of use of electric power and power-saving have long been demanded and are in increasing demand in recent years. In response to such a demand, LED lighting using LEDs (light emitting diodes) is increasingly used mainly at home. LED lighting is superior to lighting using an incandescent lamp, fluorescent lamp etc. in terms of lower power consumption, lower heat generation, longer life, higher reliability and higher response speed.

Patent Document 1 (JP-A-H11-233283) discloses a lighting system, in which an AC power source is connected to a lamp via a rectifier, a chopper, and an inverter. The chopper is provided with a starting circuit connected from the rectifier or another rectifier connected to the AC power source. In this arrangement, when DC power is not supplied to the chopper controller, the starting circuit is not operational, so that the standby power reduces.

Patent Document 2 (JP-A-H11-312591) discloses a lighting system including a light source, a lighting device for driving the light source, a microcomputer for controlling the state of the light source by controlling the lighting device, a receiving part for sending a signal to the microcomputer on receiving a remote control signal, and a signal detecting part for detecting the signal from the receiving part. When the light source is in the OFF state, the microcomputer is supplied with no DC power and is in a stand-by state, while the receiving part and the signal detecting part are intermittently supplied with DC power and are in a stand-by state. When the receiving part outputs a signal upon receiving a remote control signal, DC power is supplied to the microcomputer in response to the signal outputted from the signal detecting part, and DC power is continuously supplied to the receiving part and the signal detecting part.

Patent Document 3 (JP-A-2009-4206) discloses a lighting device, a lighting apparatus and a lighting system. A microcomputer for controlling the lighting of a discharge lamp is supplied with voltage only during its operation and when the first switching element is kept on after its operation, and is not supplied with voltage in other conditions including a stand-by state. With this arrangement, the stand-by power of the lighting device can be kept nearly 0.

Patent Document 4 (JP-A-2007-265818) discloses lighting apparatus which uses in combination two types of LEDs having a low color temperature and a high color temperature. With this lighting apparatus, light emission of five colors, i.e., an incandescent color, a warm white color, a white color, a daylight white color and a daylight color can be achieved by changing the brightness of at least one of the two types of LEDs.

Patent Document 5 (JP-A-2007-122950) discloses a lighting system having high color rendering properties. The lighting system includes two or more lamps selected from a group consisting of lamps having LEDs only and lamps including LEDs and a fluorescent substance to be excited by the light from the LEDs. The lighting system further includes a controller for controlling light output from these lamps.

FIG. 12 is a circuit diagram of a conventional lighting system applicable to e.g. a ceiling light. A ceiling light is a lighting apparatus to be fixed directly to the ceiling of a room to illuminate the entire room. To illuminate the entire room by using a single lighting system, the lighting system needs to have a size and brightness sufficient for the size of the room.

The lighting system 1200 includes a main power source 11, a control circuit 12, a daylight white color light source driver 21, an incandescent color light source driver 22, a first light source unit 31 and a second light source unit 32. The control circuit 12 includes an AC/DC converter 13, a transformer 14, a DC/DC converter 15, a signal processing circuit 16, and a remote controller receiver 17.

The main power source 11 is e.g. a commercial power source, and its AC voltage AC1 is e.g. 100V. The AC/DC converter 13, the transformer 14, the DC/DC converter 15 are provided for generating a DC voltage for driving the signal processing circuit 16. The signal processing circuit 16 is connected to a remote controller receiver 17. The remote controller receiver 17 responds to a signal transmitted from a remote controller transmitter, not shown. The lighting part of the ceiling light, i.e., the first light source unit 31 and the second light source unit 32 are turned on or off in accordance with the signal transmitted to the remote controller receiver 17.

The signal processing circuit 16 supplies a Pulse Width Modulation (PWM) signal to the daylight white color light source driver 21 and the incandescent color light source driver 22.

The daylight white color light source driver 21 and the incandescent color light source driver 22 drive the first light source unit 31 having a color temperature of 5000 K (Kelvin) and the second light source unit 32 having a color temperature of 2900 K (Kelvin), respectively. Each of the first light source unit 31 and the second light source unit 32 includes e.g. a LED or a plurality of LEDs connected in series.

In the conventional lighting system 1200 shown in FIG. 12, the daylight white color light source driver 21 and the incandescent color light source driver 22 are held in a stand-by state even when the first light source unit 31 and the second light source unit 32, i.e., the ceiling light is in the OFF state. For instance, when the standby power at the control circuit 12 is 0.5 W and the standby power of each of the daylight white color light source driver 21 and the incandescent color light source driver 22 is 0.5 W, the entire lighting system 1200 requires a standby power of 1.5 W.

For easier understanding, the lighting system 1200 shown in FIG. 12 is described as including two light source drivers, i.e., the daylight white color light source driver 21 and the incandescent color light source driver 22. However, a larger number of light source drivers may be employed, and the standby power increases with the number of the light source drivers.

Conventionally, a lighting system including a light source such as an incandescent lamp, a fluorescent lamp or the like has been used as a lighting system for illuminating a room in a house and so on. In recent years, however, in accordance with the enhancement in brightness of light emitting diodes (hereinafter referred to as LEDs), various lighting systems have been proposed which use LEDs having a smaller size, a lower power consumption and a longer life, instead of conventional light sources.

For instance, an LED lamp including an LED chip has been proposed as a replacement for an incandescent lamp. Further, an LED lighting system is also proposed which has the function of adjusting the brightness and chromaticity of the light. For instance, some LED lighting systems incorporate a plurality of types of LED lamps that emit light of different color temperatures, so that light of a desired color is obtained by adjusting the brightness of each type of the LED lamps. Such LED lighting systems are used as a downlight or a ceiling light, for example.

Among such LED lighting systems, there exists an LED lighting system, as disclosed in e.g. Patent Document 6 (JP-A-2008-300124), which is configured to generate composite light of white LEDs and red LEDs while setting the chromaticity of light from the white LEDs to a certain range, in order to obtain a composite light having a desired color temperature and high color rendering properties.

However, since such a conventional LED lighting system uses white LEDs of different color temperatures, variations of LEDs are produced in the manufacturing process, resulting in variations in brightness. Such variations in brightness of the LEDs lead to non-uniform brightness. Further, when LEDs of different color temperatures are employed, such variations in brightness leads to variations in color of composite light. Thus, before mounting the LEDs, the LEDs are classified into e.g. nine groups based on the combination of brightness and color, and LEDs of a certain group having variations in a limited range are mounted.

However, in the above-described method, measurement needs to be performed with respect to each of the LEDs for classification into groups, which needs much time and cost. Further, even when variation is suppressed to a certain degree by the classification, the brightness or chromaticity of the LEDs may not correspond to the brightness or chromaticity satisfactory to the user.

An LED lighting apparatus including an LED chip has been developed as a replacement for a lighting apparatus of a type for attaching e.g. a fluorescent lamp. Some of lighting apparatuses to be fixed to a ceiling are configured such that operations such as turning on or off the light and adjustment of the light can be performed by remote control (See Patent Document 7 (JP-A-2008-108598), for example).

FIG. 26 schematically illustrates an example of LED lighting apparatus designed to be fixed to a ceiling to illuminate a room. The LED lighting apparatus 90 shown in FIG. 26 includes a main body 91 to be fixed to a ceiling, and a remote controller 92 for operating the main body 91. The main body 91 includes a plurality of LED chips and a control unit for controlling the lighting of the LED chips in accordance with a signal from the remote controller 92. The LED lighting apparatus 90 is designed to allow adjustment of the brightness of the main body 91 and adjustment of the color of the light emitted from the main body 91. Accordingly, the remote controller 92 includes a button 92a for brightness adjustment and a button for color adjustment, in addition to a button for turning on or off the light.

For instance, the LED lighting apparatus 90 can be designed such that the brightness of the main body 91 increases by a predetermined one step when the brightness adjustment button 92a is pressed shorter than 1.25 sec. and that the brightness of the main body 91 increases continuously when the brightness adjustment button 92a is pressed longer than 1.25 sec. With this arrangement, the operation to increase the brightness step by step and the operation to increase the brightness continuously can be performed by using the same button 92a, which allows the remote controller 92 to be made simple.

However, the sense of time is different from person to person, so that even when the user, who intended to continuously change the brightness, thinks that they have pressed the brightness adjustment button 92a for a sufficiently long time, the actual pressing time of the brightness adjustment button 92a may be shorter than 1.25 sec. In such a case, brightness changes by one step, centrally to the user's intension. Such a situation where the user cannot operate the lighting apparatus as desired may cause the user to feel stress.

An LED lighting apparatus including an LED chip has been developed as a replacement for a lighting apparatus of a type for attaching e.g. a fluorescent lamp. A lighting apparatus to be fixed to a ceiling is generally called a ceiling light. For instance, Patent Document 8 (JP-A-2008-300203) discloses a conventional LED lighting apparatus used as a ceiling light.

FIG. 47 shows an example of ceiling light. The LED lighting apparatus 900 shown in the figure is in the form of a thin disc as a whole and used as fixed to a ceiling. The LED lighting apparatus 900 includes a plurality of LED chips 910D, a plurality of substrates 920D, and a cover 930 covering the LED chips 910D. As shown in FIG. 47, each substrate 920D is curved along the circumferential direction. Each substrate 920D is prepared by cutting a rectangular substrate material. As compared with cutting rectangular substrates out of a rectangular substrate material, cutting substrates having a curved shape out of a rectangular substrate provides a smaller number of substrates. Moreover, when any failure occurs, the substrate 920D needs to be disposed of, which leads to waste and an increase in the manufacturing cost.

Moreover, when rectangular substrates are simply arranged in a circular region, the LED chip 910D cannot be arranged uniformly, so that part of the LED lighting apparatus 900 may become dark.

An LED lighting apparatus including an LED chip has been developed as a replacement for a lighting apparatus of a type for attaching e.g. a fluorescent lamp. A lighting apparatus to be fixed to a ceiling is generally called a ceiling light.

FIG. 65 shows an example of conventional LED lighting apparatus for use as a ceiling light (see Patent Document 8, for example). The LED lighting apparatus 900 shown in the figure has a thin circular shape as a whole and is used as attached to a ceiling 800. The LED lighting apparatus 900 includes a plurality of light source units 910, a reflective surface 920 and a cover 930. The light source units 910 incorporate LED chips (not shown) and are arranged on a circle. The reflective surface 920 is a surface of a metal plate that is painted white, for example. As shown in the figure, the reflective surface 920 is arranged on the radially inner side of the light source units 910 arranged on a circle. Light from the light source units 910 is reflected by the reflective surface 920 to travel downward in the figure. The cover 930 is made of e.g. a resin material that transmits light while diffusing, and hence, transmits the light, reflected by the reflective surface 920, downward in the figure while diffusing.

The LED lighting apparatus 900 is designed such that light is emitted through the cover 930 covering the light source units 910 and the reflective surface 920. Thus, the LED lighting apparatus 900 as a whole has a relatively large thickness. To enhance the appearance of a living room or the like to which the LED lighting apparatus 900 is installed, further thickness reduction of the LED lighting apparatus 900 is demanded. In addition to the LED lighting apparatus 900 used as a ceiling light to be fixed to a ceiling 800, an LED lighting apparatus of a type called a pendant light is also demanded which emits light toward the floor from a position spaced a certain distance from the ceiling.

An LED lighting apparatus including an LED chip has been developed as a replacement for a lighting apparatus of a type for attaching e.g. a fluorescent lamp. A lighting apparatus to be fixed to a ceiling is generally called a ceiling light.

FIG. 77 shows an example of conventional LED lighting apparatus for use as a ceiling light (see Patent Document 8, for example). The LED lighting apparatus 900 shown in the figure is used as attached to a ceiling 800. The LED lighting apparatus 900 includes a plurality of light source units 910, a reflective surface 920 and a cover 930. The light source units 910 incorporate LED chips (not shown). The reflective surface 920 is a surface of a metal plate that is painted white, for example. Light from the light source units 910 is reflected by the reflective surface 920 to travel downward in the figure. The cover 930 is made of e.g. a resin material that transmits light while diffusing, and hence, transmits the light, reflected by the reflective surface 920, downward in the figure while diffusing. The LED lighting apparatus 900 is designed to achieve both the good appearance along a ceiling and the uniform illumination of a room.

However, reduction in thickness of the LED lighting apparatus 900 accompanies increased limitation on the shape of the reflective surface 920. Such limitation hinders uniform illumination by the LED lighting apparatus 900.

An LED lighting apparatus including an LED chip has been developed as a replacement for a lighting apparatus of a type for attaching e.g. a fluorescent lamp. A lighting apparatus to be fixed to a ceiling is generally called a ceiling light. For instance, Patent Document 8 discloses an LED lighting apparatus for use as a ceiling light.

FIG. 88 shows an example of ceiling light. The LED lighting apparatus 900 shown in the figure has a thin circular shape as a whole and used as fixed to a ceiling. The LED lighting apparatus 900 includes a plurality of LED substrates 910G, a plurality of LED chips 920G mounted on each of the LED substrates 910G, and a cover 930 covering the LED substrates 910G. The plurality of LED substrates 910G are arranged such that the edges of each LED substrate face edges of adjacent LED substrates, thereby forming a ring-like shape. A pair of connectors 940, 950 are provided at facing edges of adjacent LED substrates 910G.

To each of the connectors 940, 950 is connected a connection end of a wiring 960, which is made of a single core wire. The connectors 940, 950 of each pair are arranged such that the connection portions face each other. Thus, both the connection direction (first connection direction) of a connection end to the connector 940 and the connection direction (second connection direction) of a connection end to the connector 950 are along the circumferential direction n1 of the LED substrates 910G. To achieve proper connection to each connector 940, 950, the wiring 960 is made to have a certain margin and curved along the LED substrate 910G, as shown in FIG. 88.

However, according to the above-described structure in which the connectors 940 and 950 face each other, the wiring 960 rotates easily when rotation moment is exerted between the connectors 940, 950 and the wiring 960. Thus, in using the LED lighting apparatus 900, the curved portion of the wiring 960 may move and hinder the progress of the light from the LED chips 920G, making part of the LED lighting apparatus 900 dark.

Patent Document 1: JP-A-H11-233283
Patent Document 2: JP-A-H11-312591
Patent Document 3: JP-A-2009-4206
Patent Document 4: JP-A-2007-265818
Patent Document 5: JP-A-2007-122950
Patent Document 6: JP-A-2008-300124
Patent Document 7: JP-A-2008-108598
Patent Document 8: JP-A-2008-300203

SUMMARY OF THE INVENTION

The present invention provides a lighting system configured to reduce the standby power. In particular, the invention provides a lighting system configured to reduce the standby power even when the system is constructed as a high power comsumption type with a number of light source drivers.

A variation of the present invention, which is conceived to solve the above-described problem, aims to provide an LED lighting system which is configured to correct variations in brightness or chromaticity of LEDs after the mounting and which eliminates the need for strictly correcting such variations.

A variation of the present invention, which is conceived to solve the above-described problem, aims to provide an LED lighting apparatus that operates precisely in accordance with the user's intention.

A variation of the present invention, which is conceived to solve the above-described problem, aims to provide an LED lighting apparatus that can achieve uniform illumination while using rectangular substrates.

A variation of the present invention, which is conceived to solve the above-described problem, aims to provide an LED lighting apparatus that can achieve thickness reduction, and an LED lighting apparatus that can be used as a ceiling light or a pendant light.

A variation of the present invention, which is conceived to solve the above-described problem, aims to provide an LED lighting apparatus that can achieve more uniform illumination and good appearance.

A variation of the present invention, which is conceived to solve the above-described problem, aims to provide an LED lighting apparatus that is suitable for more uniform illumination.

A lighting system according to the present invention comprises: a main power source; a power switch including a first terminal, a second terminal and a control terminal, the first terminal being connected to the main power source; a light source driver connected to the second terminal of the power switch; a light source unit driven by the light source driver; and a signal processing circuit for supplying to the control terminal of the power switch a switching signal for electrically connecting or disconnecting the power switch.

Preferably, in the lighting system according to the present invention, the light source driver includes a first light source driver and a second light source driver, the light source unit includes a first light source unit and a second light source unit, and the first light source driver and the second light source driver drive the first light source unit and the second light source unit, respectively.

Preferably, in the lighting system according to the present invention, the first light source driver and the second light source driver are commonly connected to the second terminal of the power switch.

Preferably, in the lighting system according to the present invention, the first light source unit and the second light source unit include at least two white light sources of colors selected from a daylight color, a daylight white color, a white color, a warm white color and an incandescent color.

Preferably, in the lighting system according to the present invention, the first light source unit comprises an LED for a daylight white color, whereas the second light source unit comprises an LED for an incandescent color.

Preferably, in the lighting system according to the present invention, the power switch comprises a mechanical relay or a solid state relay.

Preferably, in the lighting system according to the present invention, the light source driver is driven by a pulse width modulation (PWM) signal outputted from the signal processing circuit.

Another lighting system according to the present invention comprises: an AC power source; a power switch including a first terminal, a second terminal and a control terminal, the first terminal being connected to the AC power source; an AC/DC converter connected to the second terminal of the power switch; a smoothing capacitor that is connected to an output of the AC/DC converter, includes a first terminal and a second terminal, and generates a first power source voltage between the first terminal and the second terminal; a chopper circuit to which the first power source voltage generated by the smoothing capacitor is inputted and which generates a second DC voltage lower than the first power source voltage; and a light source unit to which the second DC voltage is supplied and which includes a plurality of LEDs connected to each other. The AC/DC converter is electrically connected or disconnected based on a switching signal applied to the control terminal of the power switch.

In the above-described structure, the power switch is arranged between the main power source and light source drivers having a relatively large power consumption. With this arrangement, by disconnecting the power switch, power consumption at the light source driver and the light source unit connected to the light source driver is stopped, which leads to standby power reduction and power saving of the entire lighting system.

BRIEF DESCRIPTION OF THE DRAWINGS

FIG. 13 illustrates a chromaticity/brightness control map representing a rated output range of an LED lighting system of 1B embodiment according to a variation of the present invention;

FIGS. 14A-14D show examples of patterns for changing the rated output range represented by the chromaticity/brightness control map;

FIGS. 15A and 15B show duty ratios of PWM signals corresponding to the maximum and minimum points and the rated output range of the chromaticity/brightness control map shown in FIG. 13;

DETAILED DESCRIPTION OF THE PREFERRED EMBODIMENTS

First Embodiment

Figure 1:
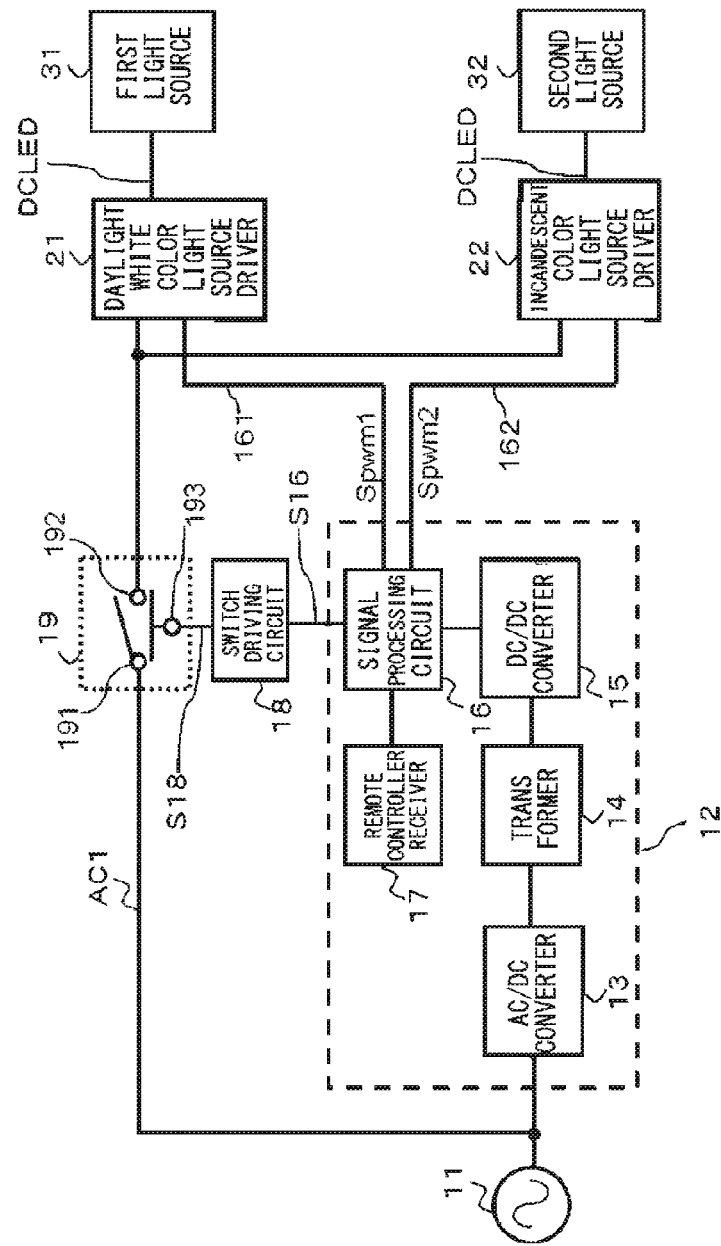
FIG. 1 is a circuit diagram of a lighting system according to a first embodiment of the present invention.
Figure 12:
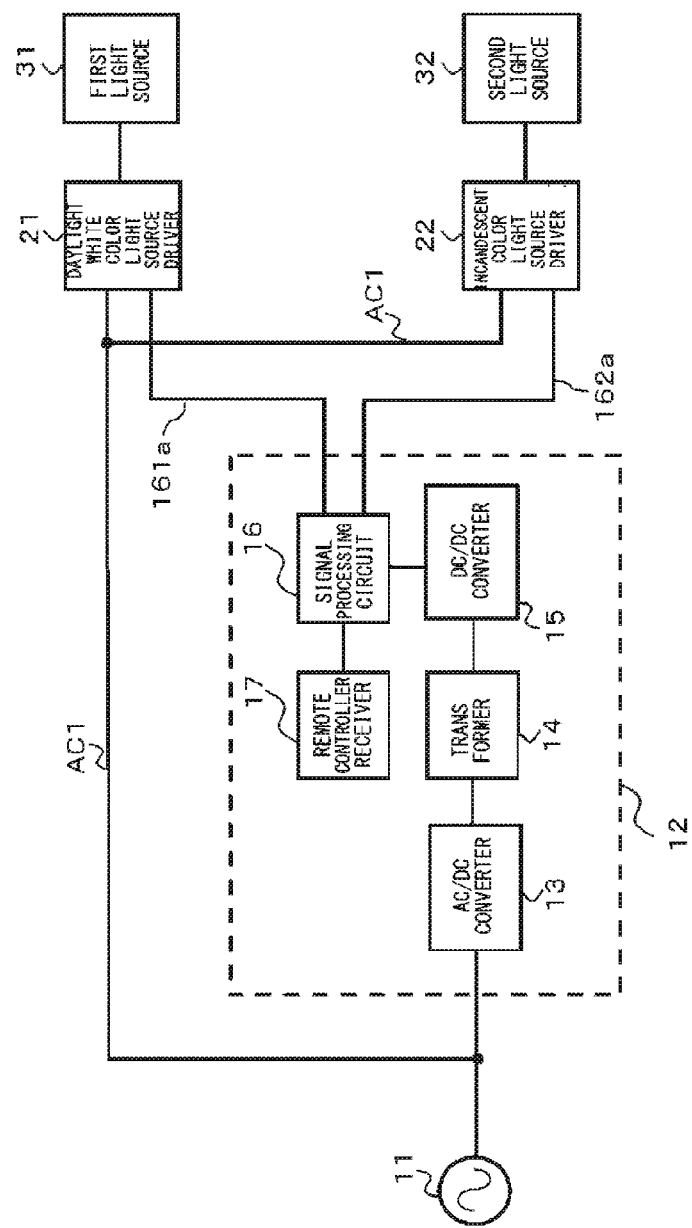
FIG. 12 is a circuit diagram of a conventional lighting system.

FIG. 1 shows a lighting system according to the present invention. The lighting system 100 differs from the conventional lighting system 1200 shown in FIG. 12 in that the lighting system 100 includes a switch driving circuit 18 and a power switch 19. The switch driving circuit 18 is arranged between a signal processing circuit 16 and the power switch 19. The switch driving circuit 18 responds to an instruction signal S16 outputted from the signal processing circuit 16.

For the power switch 19, a mechanical relay or a solid state relay can be used. Examples of known mechanical relay include an electromagnetic relay. Examples of known solid state relay include phototriac relay and a Photo-MOS relay. Either type of relay can be used as long as it is suitable for turning on and off a relatively high voltage of AC 100 V or higher.

To stop the operation of the daylight white color light source driver 21 and the incandescent color light source driver 22, i.e., to shut off (turn off) the first light source unit 31 and the second light source unit 32, the power switch 19 is made open, i.e., the first terminal 191 and the second terminal 192 of the power switch 19 are disconnected. FIG. 1 shows the switch-open state, i.e., the state where the first terminal 191 and the second terminal 192 are disconnected. Selection between connection and disconnection of the first terminal 191 and the second terminal 192 is made in accordance with a signal transmitted from a remote controller transmitter, not shown, and received by the remote controller receiver 17.

The instruction signal S16 outputted from the signal processing circuit 16 and the power-saving switch signal S18 outputted from the switch driving circuit 18 do not necessarily need to have the same polarity. That is, when the instruction signal S16 is at a high level, the power-saving switch signal S18 does not necessarily need to be at a high level. When the instruction signal S16 is at a low level, the power-saving switch signal S18 does not necessarily need to be at a low level. This is because the polarity of the power-saving switch signal S18 to be outputted from the switch driving circuit 18 can be set to either a high level or a low level, regardless of the polarity of the instruction signal S16. Further, the power switch 19 can be brought into either a conduction state or a non-conduction state, regardless of the polarity of the signal outputted from the switch driving circuit 18.

To the first terminal 191 of the power switch 19 is applied an AC voltage AC1, which is e.g. a commercial power source. When the first terminal 191 and the second terminal 192 are connected, i.e., short-circuited, the AC voltage AC1 is supplied to the second terminal 192 as well. The AC voltage AC1 is supplied to both the daylight white color light source driver 21 and the incandescent color light source driver 22.

In addition to the AC voltage AC1, PWM signals Spwm 1, Spwm 2 are supplied from the signal processing circuit 16 to the daylight white color light source driver 21 and the incandescent color light source driver 22. Specifically, PWM signals are supplied to the daylight white color light source driver 21 and to the incandescent color light source driver 22 via a signal line 161 and a signal line 162, respectively. It is preferable that the PWM signals used in the present invention have a frequency of 500 Hz or higher.

The first light source unit 31 and the second light source unit 32 are turned on by the daylight white color light source driver 21 and the incandescent color light source driver 22, respectively, by e.g. duty control.

Generally, in a lighting system, duty control is one of methods to control the brightness of e.g. LEDs. Of course, instead of employing the duty control, the brightness of an LED can be adjusted by changing the magnitude of the forward current flowing to the LED. With such a method, however, the brightness changes greatly even with a small change in the forward current, so that fine adjustment of the brightness is difficult. For this reason, the duty control is employed which causes an LED to blink quickly, with the current flowing to the LED kept constant.

LEDs can be used for the first light source unit 31 and the second light source unit 32. Instead of LEDs, use may be made of organic EL (Electro Luminescence) devices, high intensity discharge (HID) lamps, fluorescent lamps, electric lamps, for example.

In the lighting system 100 shown in FIG. 1, the first light source unit 31 and the second light source unit 32 emit light of the daylight white color and light of the incandescent color, respectively, which are defined in JIS standard Z9112, and each color of light is adjusted independently to obtain the brightness between these two.

The feature of the lighting system of the present invention shown in FIG. 1 is summarized as follows: The lighting system 100 includes a main power source 11, and a power switch 19 including a first terminal 191, a second terminal 192 and a control terminal 193. The first terminal 191 of the power switch 19 is connected to the main power source 11. The lighting system 100 further includes a light source driver 21 (22) connected to the second terminal 192 of the power switch 19, a light source unit 31 (32) driven by the light source driver 21(22), and a signal processing circuit 16 for supplying a power-saving switch signal S18 for turning on or off the power switch 19 to the control terminal 193 of the power switch 19.

In the lighting system 100 shown in FIG. 1, a first light source driver corresponding to the daylight white color light source driver 21 and a second light source driver corresponding to the incandescent color light source driver 22 are provided as the light source driver. Further, the first light source unit 31 and the second light source unit 32 are provided as the light source unit. The first light source driver 21 and the second light source driver 22 drive the first light source unit 31 and the second light source unit 32, respectively. According to this circuit structure, the power source voltage for the first light source driver and the second light source driver are commonly supplied from the second terminal 192 side of the power switch 19. Thus, by controlling the power switch 19, power source voltage supply to these two drivers can be started or shut off at the same time, which effective for reducing the standby power.

Second Embodiment

Figure 2:
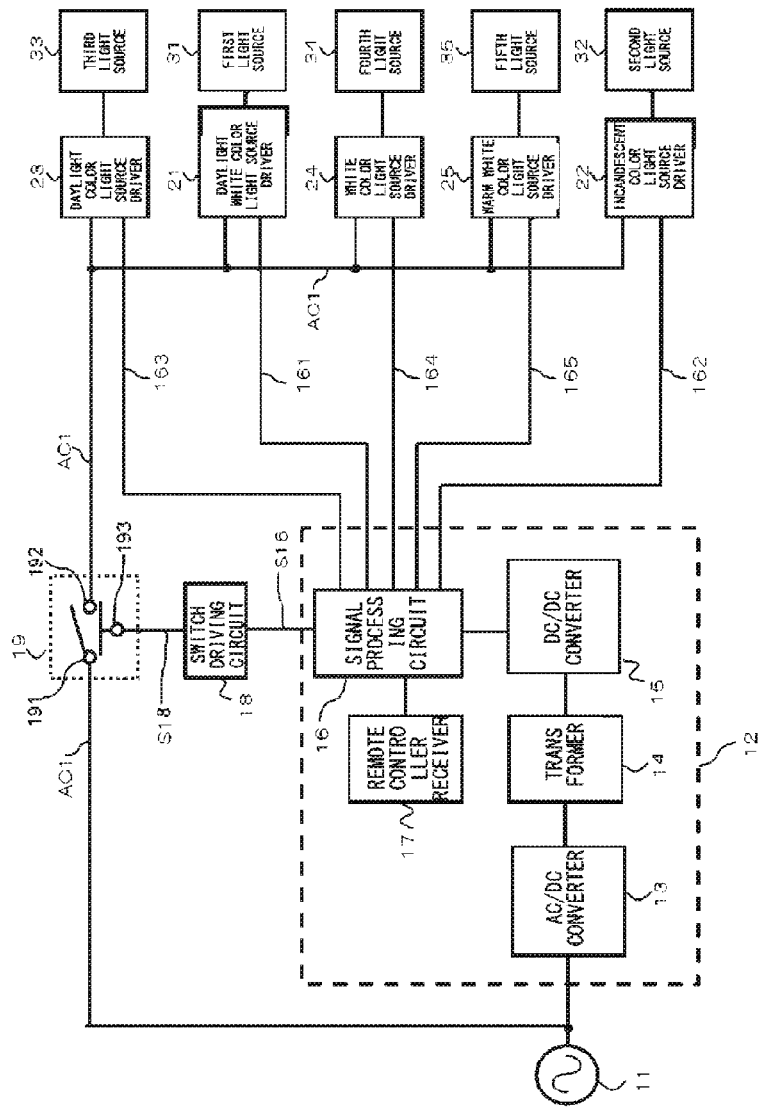
FIG. 2 shows a lighting system according to a second embodiment of the present invention.

FIG. 2 shows a second embodiment of a lighting system according to the present invention. The second embodiment differs from the first embodiment shown in FIG. 1 in that the second embodiment includes a larger number of light source units and light source drivers. Thus, the second embodiment has larger power consumption at the light source drivers than the first embodiment.

As shown in FIG. 2, the lighting system of the second embodiment includes a daylight color light source driver 23, a white color light source driver 24, and a warm white color light source driver 25, in addition to the daylight white color light source driver 21 and the incandescent color light source driver 22 employed in the first embodiment.

Further, the lighting system of the second embodiment includes a third light source unit 33, a fourth light source unit 34, and a fifth light source unit 35, in addition to the first light source unit 31 and the second light source unit 32 employed in the first embodiment.

The second embodiment shown in FIG. 2 is a lighting system conceived in view of the Japanese Industrial Standards (JIS) Z9112. That is, JIS Z9112 defines five white light colors, i.e., a daylight color, a daylight white color, a white color, a warm white color, and an incandescent color. The second embodiment includes five light source units for emitting these five colors of light, and five light source drivers for individually driving the five light source units. The color temperatures of the daylight color, the daylight white color, the white color, the warm white color and the incandescent color are 6500 K (Kelvin), 5000 K, 4200 K, 3500 K, and 2900 K, respectively.

Similarly to the lighting system shown in FIG. 1, when the standby power at the control circuit 12 is 0.5 W and the standby power at each of the light source drivers is 0.5 W, the entire lighting system 200 consumes the power of 3.0 W. Accordingly, the second embodiment seems to require twice the standby power of the first embodiment shown in FIG. 1.

According to the present invention, however, the power switch 19 can shut off the five light source drivers at the same time, so that only the standby power for the control circuit 12 is necessary. Thus, the standby power is equal to that of the lighting system 100 shown in FIG. 1. That is, in the lighting system according to the present invention, the standby power is required only at the control circuit 12 regardless of the number of the light source drivers, and hence provides greater advantage as the system is made larger and the electric power is higher.

Figure 3:
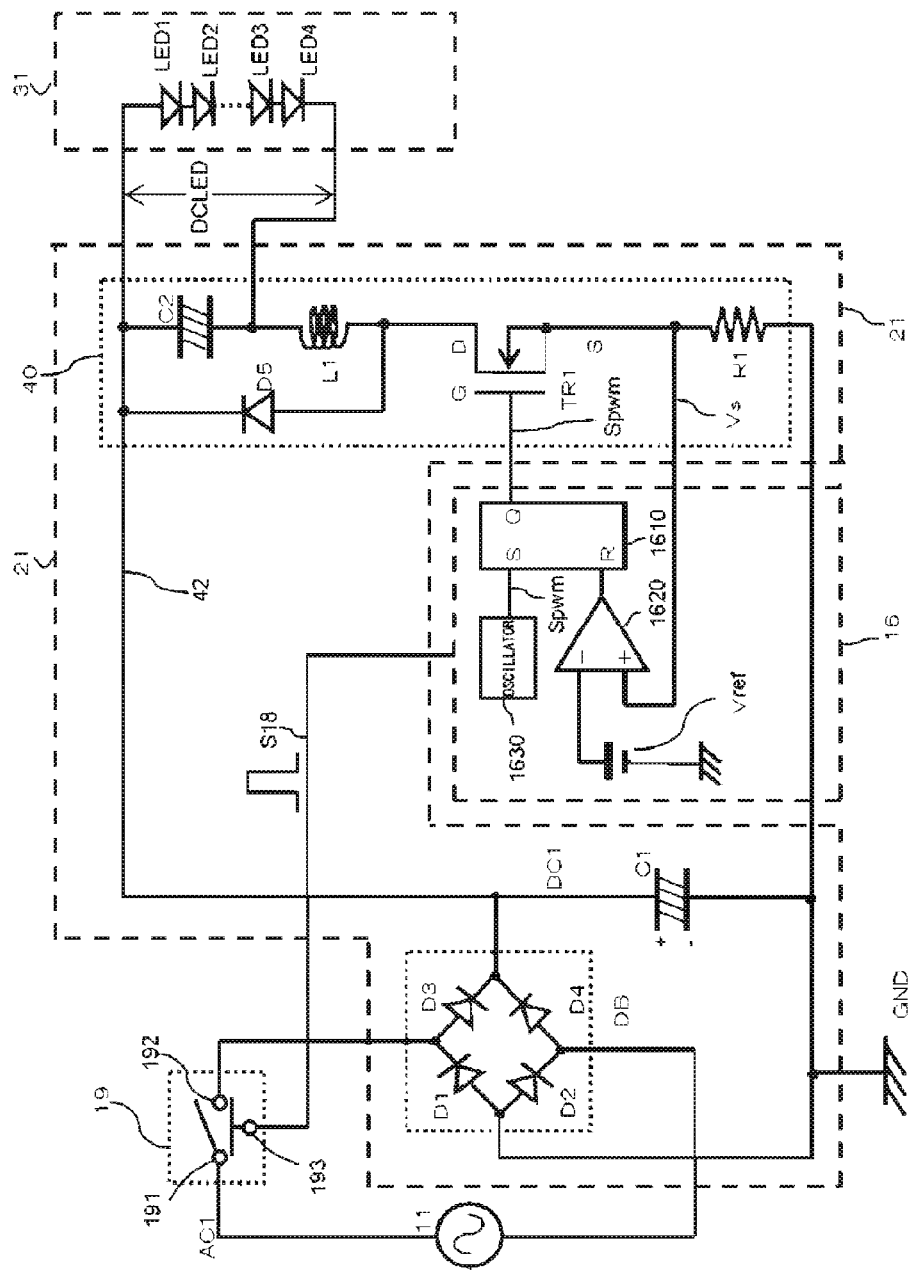
FIG. 3 is a circuit diagram of a light source driver of the present invention.

FIG. 3 more specifically shows the power switch 19, the daylight white color light source driver 21, and the first light source unit 31 shown in FIGS. 1 and 2. Although FIG. 3 illustrates the daylight white color light source driver 21 and the first light source unit 31 as examples for easier understanding, this structure is also applicable to the circuit structure comprising the power switch 19, the incandescent color light source driver 22, and the second light source unit 32. Further, the circuit shown in FIG. 3 is also applicable to the circuit structure shown in FIG. 2 which comprises the power switch 19, the daylight color light source driver 23 and the third light source unit 33, the circuit structure comprising the power switch 19, the white color light source driver 24 and the fourth light source unit 34, or the circuit structure comprising the power switch 19, the warm white color light source driver 25, and the fifth light source unit 35.

Although the first light source unit 31 is illustrated in FIG. 3 as including four LEDs LED1-LED4 for the convenience of drawing, the number of LEDs is not limited to four.

In FIG. 3, the main power source 11 supplies AC voltage AC1 to the first terminal 191 of the power switch 19. To the second terminal 192 of the power switch 19 is connected a diode bridge circuit DB. The diode bridge circuit DB consists of four rectifier diodes D1-D4. Such a structure is well known to those skilled in the art as a full-wave rectification diode bridge circuit. In this way, the power switch 19 is provided not on the downstream of the diode bridge circuit DB but directly downstream of the main power source 11. In other words, the power switch 19 is arranged on the upstream of the diode bridge circuit DB. By arranging the power switch 19 directly downstream of the main power source 11, standby power consumption of the entire lighting system is considerably reduced.

The output from the diode bridge circuit DB is supplied to the common cathode side of the rectification diodes D3 and D4. To this common cathode side is connected the first terminal i.e., the positive (+) pole of the smoothing capacitor C1 and a power source voltage supply line 42. The power source voltage supply line 42 is used for supplying a first power source voltage DC1 to the chopper circuit 40 and the first light source unit 31 provided on the downstream side. The first power source voltage DC1 is about DC 140 V, for example. The diode bridge circuit DB provides one of the AC/DC converters of the present invention. More precisely, combination of the diode bridge circuit DB and the smoothing capacitor C1 provides the AC/DC converter.

The daylight white color light source driver 21 further includes a light source lighting power source circuit (chopper circuit) 40, in addition to the diode bridge circuit DB. The chopper circuit 40 is a voltage-drop-type DC/DC converter generally called "chopper circuit" and converts the first power source voltage DC1 to a lower DC voltage.

The chopper circuit 40 includes a switching transistor TR1, a current detection resistor R1, a coil L1, a capacitor C2, and a diode D5. As noted above, the chopper circuit 40 reduces the first power source voltage DC1 to a voltage DCLED for application to the LEDs, which is a voltage suitable for driving the first light source unit 31.

The capacitor C2 and the coil L1 are connected in series to each other, and this series connection is connected in parallel the diode D5. That is, the anode of the diode D5 is connected to the common connection node of the capacitor C2 and the coil L1, whereas the cathode of the diode D5 is connected to the power source voltage supply line 42.

The common connection node of the coil L1 and the diode D5 is connected to the drain D of the switching transistor TR1.

When the switching signal Spwm applied to the gate G of the switching transistor TR1 is at a high level, the switching transistor TR1 is brought into a conduction state. At this time, current flows through the first light source unit 31, the coil L1, the switching transistor TR1, and the current detection resistor R1 through the power source voltage supply line 42. Since the voltage generated at the switching transistor TR1 and the current detection resistor R1 is small, the voltage obtained by subtracting the voltage DCLED from the first power source voltage DC1, i.e., the voltage DC1-DCLED is applied across the coil L1. For instance, when the first power source voltage DC1 applied across the smoothing capacitor C1 is 140V and the voltage DCLED applied to the first light source unit 31 is 40V, the voltage (140−40=) 100 V is applied to the coil L1.

When the switching transistor TR1 is in a non-conduction state, i.e., the switching signal Spwm is at a low level, counter electromotive force is generated at the coil L1. Due to the counter electromotive force, current flows from the coil L1 to the first light source unit 31 via the diode D5. In this way, regardless of the conduction or non-conduction of the switching transistor TR, current is kept supplied to the first light source unit 31, so that the first light source unit 31 is kept lit.

The magnitude of the voltage applied to the first light source unit 31 depends on e.g. the number of LEDs constituting the first light source unit 31. For instance, when a forward voltage for one LED is 3 V and 10 LEDs are connected in series, the voltage DCLED for application to the LEDs is 3 V×10=30 V. Similarly, when 20 LEDs are connected in series, the DCLED for application to the LEDs is 3 V×20=60 V. The connection of LEDs in the LED light source unit is not limited to series connection, and parallel connection may also be employed in combination to drive the LEDs. For instance, when 20 LEDs are used, two strings of LEDs, each string made up of 10 LEDs connected in series, may be connected in parallel to each other (10 LEDs×2 rows), or four strings of LEDs, each string made up of five LEDs connected in series, may be connected in parallel to each other (5 LEDs×4 rows). The manner of connection can be selected appropriately in accordance with the specification of the lighting system.

The duty ratio of the switching signal Spwm to be applied to the gate G of the switching transistor TR1 is determined by the magnitude of the first power source voltage DC1 and the magnitude of the voltage DCLED for application to the LEDs. For instance, when the first power source voltage DC1 is 140 V and the voltage DCLED for application to the LEDs is 40 V, the duty ratio of the switching signal Spwm is 40/140=0.286, i.e., 28.6%. Further, when the first power source voltage DC1 is 140 V and the voltage DCLED for application to the LEDs is 60 V, the duty ratio of the switching signal Spwm is 60/140=0.429, i.e., 42.9%.

In FIG. 3, the power-saving switch signal S18 for bringing the power switch 19 into a conduction state or a non-conduction state is supplied from the signal processing circuit 16.

To control the on/off of the switching transistor TR1, the signal processing circuit 16 includes a flip-flop 1610, a comparator 1620 and an oscillator 1630. The flip-flop 1610 includes a set terminal S, a reset terminal R and an output terminal Q. When a set signal is inputted into the set terminal S, an ON signal is outputted from the output terminal Q. When a reset signal is inputted into the reset terminal R, the output from the output terminal Q is stopped.

The comparator 1620 compares the voltage Vs detected at the current detection resistor R1 with a reference voltage Vref, and supplies a reset signal to the reset terminal R of the flip-flop 1610 when the voltage Vs has reached the reference voltage Vref.

The oscillator 1630 outputs a set signal to the set terminal S of the flip-flop 1610 with a predetermined cycle. When the oscillation frequency needs to be changed in accordance with the magnitude of the first power source voltage DC1, a voltage-controlled oscillator (VCO) may be used.

Figure 4:
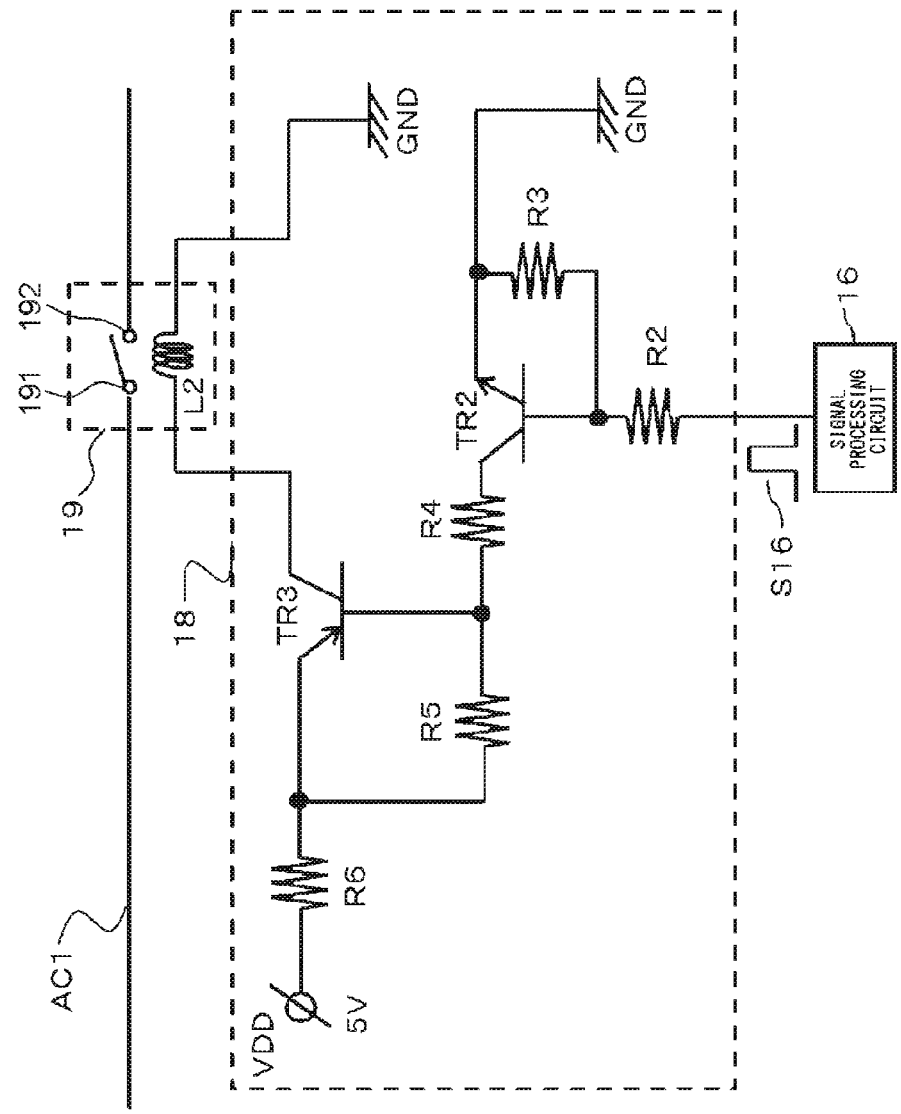
FIG. 4 is a circuit diagram of a switch driving circuit of the present invention.

FIG. 4 shows the specific circuit structure of the switch driving circuit 18 of the present invention shown in FIGS. 1 and 2. For instance, the switch driving circuit 18 is made up of transistors TR2, TR3 and resistors R2, R3, R4, R5, R6. Although the transistors TR2, TR3 are bipolar transistors in this example, these may be MOS transistors.

The resistor R3 is connected between the base and the emitter of the transistor TR2. The resistor R3 determines the magnitude of the current flowing to the base side of the transistor TR2. The emitter of the transistor TR2 is connected to the ground potential GND.

The collector of the transistor TR2 is connected to the first terminal of the resistor R4, and the second terminal of the resistor R4 is connected to the base of the transistor TR3 and the first terminal of the resistor R5. The second terminal of the resistor R5 is connected to the emitter of the transistor TR3 and the first terminal of the resistor R6. The second terminal of the resistor R6 is connected to the power source voltage VDD. The power source voltage VDD is set to e.g. 5 V.

The resistors R6, R5, R4 determine the current to flow through the transistor TR2.

An instruction signal S16 is applied from the signal processing circuit 16 to the base of the transistor TR2 via the resistor R2. The transistor TR2 is conducted when the instruction signal S16 is at a high level and held in a non-conduction state when the instruction signal S16 is at a low level. That is, the transistor TR2 responds to the level of the instruction signal S16.

The switching between the conduction state and the non-conduction state of the transistor TR2 and the transistor TR3 are in synchronism with each other. That is, when the transistor TR2 is in a conduction state, the transistor TR3 is also in a conduction state. Similarly, when transistor TR2 is in a non-conduction state, the transistor TR3 is also in a non-conduction state.

When the instruction signal outputted from the signal processing circuit 16 is at a low level, current does not flow through the coil L2. In this state, the first terminal 191 and the second terminal 192 of the power switch 19 are held open. This type of switching is herein called a normally open system. Conversely, the switching system in which the first terminal 191 and the second terminal 192 are held short-circuited i.e., electrically connected to each other when the current is not flowing through the coil 12 is herein called a normally closed system.

In the normally open system, when the instruction signal S16 changes to a high level, current flows through the coil L12, and the first terminal 191 and the second terminal 192 shift from the open state to the short-circuited state. On the other hand, in the normally closed system, the first terminal 191 and the second terminal 192 shift from the short-circuited state to the open state.

The power switch 19 used in the lighting system of the present invention may be either of the normally open system or of the normally closed system.

It is also possible to arrange such that current does not flow through the coil L2 when the instruction signal S16 is at a high level and flows when the instruction signal S16 is at a low level. In this way, selection between the supply and shut off of the current to the coil L2 in accordance with the high level and the level of the instruction signal S16 can be arranged appropriately, by changing the circuit structure of the switch driving circuit 18, which can be easily performed.

In any case, to reduce the standby power in the lighting system 100, 200, power supply to the daylight white color light source driver 21, the incandescent color light source driver 22, the daylight color light source driver 23, the white color light source driver 24, and the warm white color light source driver 25 need to be shut off, i.e., the first terminal 191 and the second terminal 192 of the power switch 19 need to be set to be disconnected or open.

Figure 5:
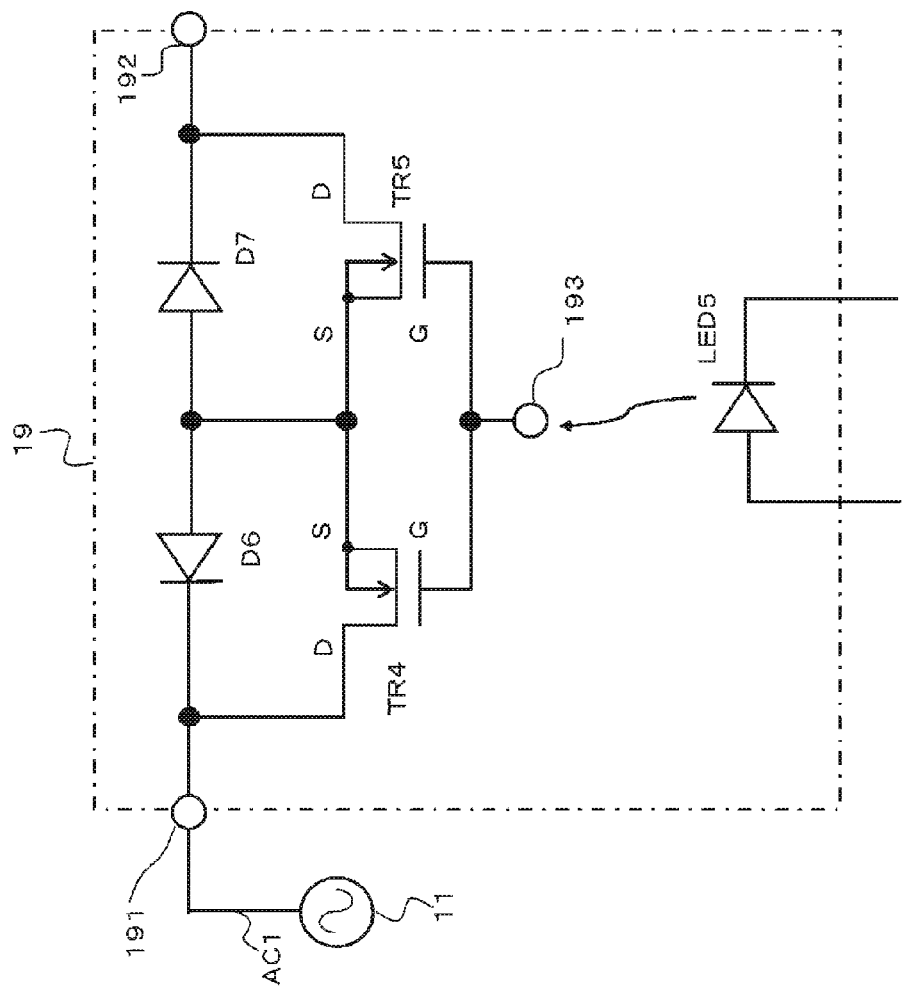
FIG. 5 shows another example of a circuit structure of a power switch of the present invention.

FIG. 5 shows a lighting system of the present invention in which a Photo-MOS relay is used as the power switch 19. A Photo-MOS relay is one of known solid state relays.

The power switch 19 includes transistors TR4, TR5 and diodes D6, D7. Each of the transistors TR4, TR5 may comprise e.g. an N-channel MOS transistor. Of course, an NPN bipolar transistor may be used instead. The respective sources S of the transistors TR4 and TR5 are commonly connected.

The drain D of the transistor TR4 and the cathode of the diode D6 are commonly connected, and the common connection node is connected to the first terminal 191 of the power switch 19. To the first terminal 191, AC voltage AC1 from the main power source 11 is applied.

The respective anodes of the diode D6 and the diode D7 are commonly connected, and the common connection node is connected to the sources S of the transistor TR4, TR5.

The drain D of the transistor TR5 and the cathode of the diode D7 are commonly connected, and the common connection node is connected to second terminal 192 of the power switch 19.

The respective gates G of transistors TR4 and TR5 are commonly connected. The commonly connected gates G are connected to the control terminal 193. Actually, a photo-electric conversion cell, not shown, is disposed on the common gate G side. When the light emitting diode LED 5 is lit, the photo-electric conversion cell increases the voltage between the gate G and the source S to cause conduction.

A voltage, not shown, generated due to the light from the light emitting diode LED5 is applied to the control terminal 193. Signals received by the remote controller receiver 17 shown in FIGS. 1 and 2 can be applied to the LED 5. Further, the power-saving switch signal S18 outputted from the switch driving circuit 18 or an optical signal generated based on the instruction signal S16 outputted from the signal processing circuit 16 can also be applied to the LED 5.

There are two types of Photo-MOS relays, i.e., "make" type and "break" type. The "make" type corresponds to the normally open system described above. That is, with the "make" type, the transistors TR4 and TR5 are held in a non-conduction state when the LED 5 is not lit, and the voltage between the gate G and the source S of the transistor TR4, TR5 is increased to cause conduction when the LED 5 is lit.

The "break" type corresponds to the normally closed system described above. With the "break" type, the transistors TR4 and TR5 are held in a conduction state when the LED 5 is not lit, while the transistors TR4 and TR5 are brought into a non-conduction state when the LED is lit, by reversing the direction between the gate G and the source S of the transistors TR4, TR5.

The power switch 19 of the present invention can employ either the "make" type Photo-MOS relay or the "break" type Photo-MOS relay.

In the Photo-MOS relay shown in FIG. 5, the transistors TR4, TR5 operate in response to the voltage applied to control terminal 193 of the power switch 19, whereby the conduction and non-conduction between the first terminal 191 and the second terminal 192 is controlled. In this way, for the power switch 19 of the lighting system 100, 200 of the present invention, not only a mechanical relay but also a solid state relay may be employed.

Figure 6:
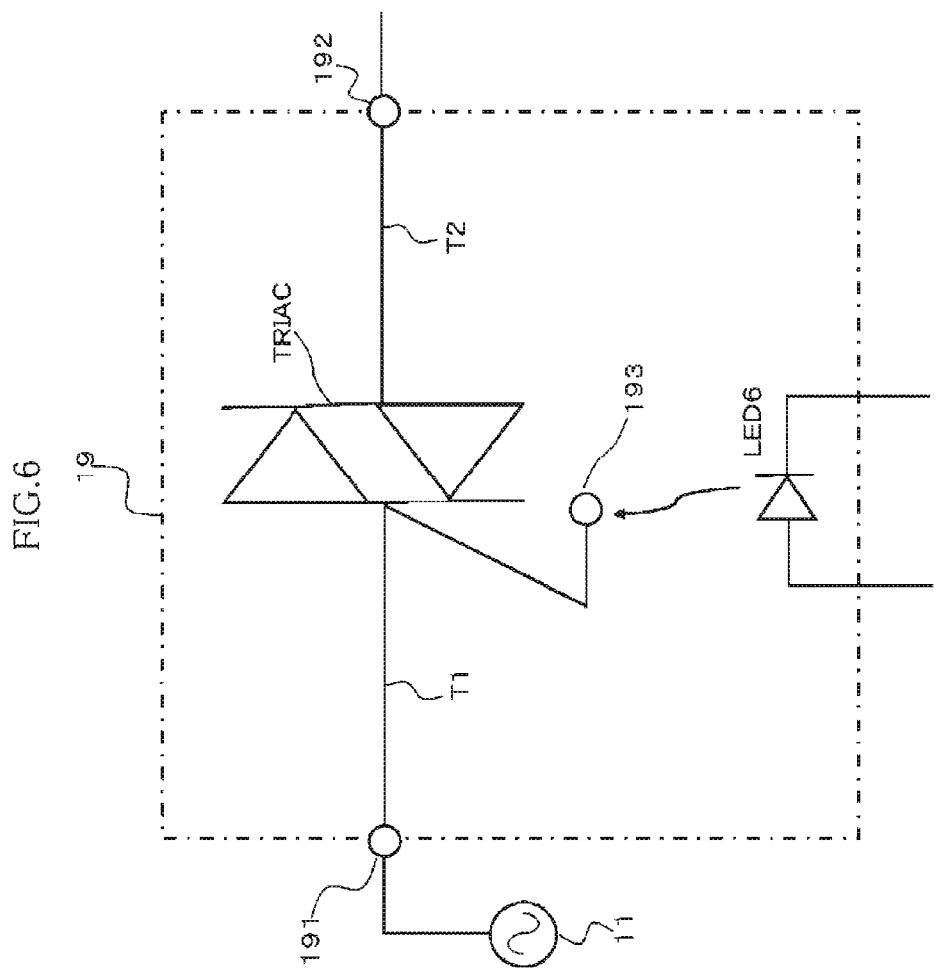
FIG. 6 shows another example of a circuit structure of a power switch of the present invention.

FIG. 6 schematically illustrates a power switch 19 in which a photo triac relay is used. The photo triac relay is a type of solid state relay. A triac is a semiconductor element in which two thyristors are arranged in antiparallel connection for allowing current to flow in both directions. The photo triac relay in the present invention comprises a combination of a so-called triac and a photo triac.

The power switch 19 includes a triac TRIAC. The triac TRIAC has a first terminal T1 connected to the first terminal 191 of the power switch 19, and a second terminal T2 connected to the second terminal 192. A so-called trigger electrode for controlling the triac TRIAC is connected to the control terminal 193.

The photo triac relay is illustrated as simplified in FIG. 6. Actually, however, on the control terminal 193 side is arranged a photo triac or a photo coupler optically coupled to the infrared light emitting diode LED 6. Further, a zero-cross circuit or a trigger circuit for triggering the triac TRIAC is often connected to the control terminal 193 side. Further, it is well known to arrange a surge absorption circuit between the first terminal T1 and the second terminal T2 of the triac TRIAC.

Figure 7:
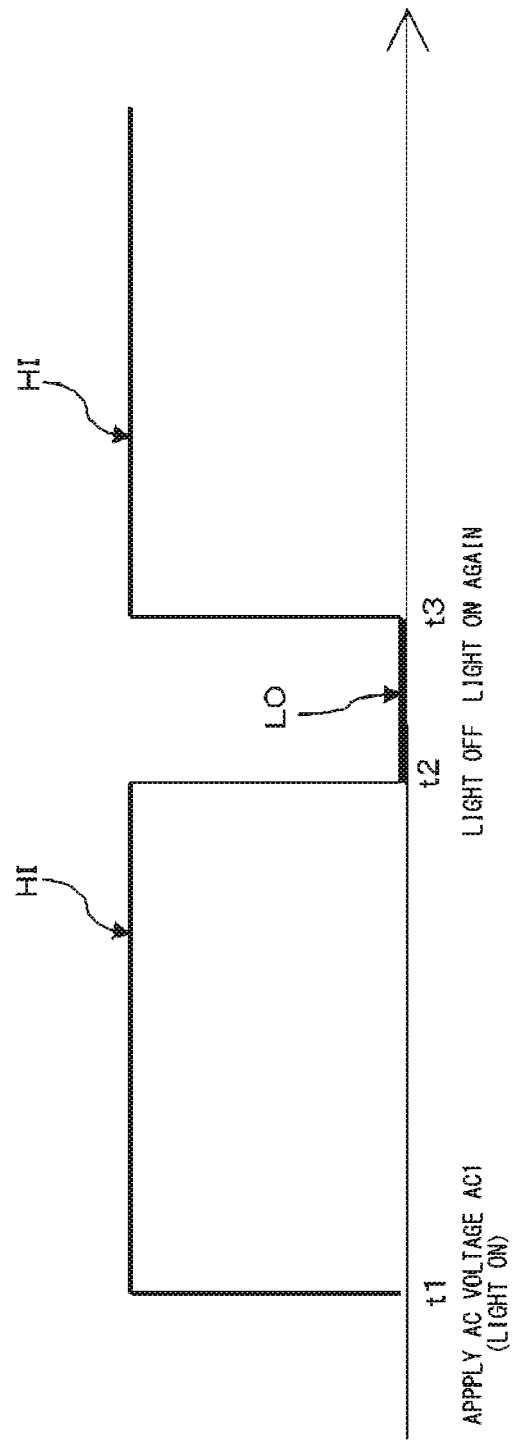
FIG. 7 is a timing chart of electrically connecting or disconnecting a power source driver according to the present invention.

FIG. 7 schematically shows an example of the power-saving switch signal S18 that is outputted from the switch driving circuit 18 and brings the daylight white color light source driver 21, the incandescent color light source driver 22, the daylight color light source driver 23, the white color light source driver 24, and the warm white color light source driver 25 into a conduction state or a non-conduction state.

The power-saving switch signal S18 becomes a high level HI at the time t1 at the same time as the AC voltage AC1 is applied. At this time, the first through the fifth light source units 31-35 are turned on. At time t2, the power-saving switch signal S18 is shifted from the high level HI to the low level LO to turn off these light source units. The light off period continues to the time t3, when the light source units are turned on again.

In the example shown in FIG. 7, each light source unit is turned on when the power-saving switch signal S18 is at a high level HI and turned off when the power-saving switch signal S18 is at a low level LO. However, as noted before, a reverse arrangement is also possible. That is, the system can be easily arranged such that each light source unit is turned on when the power-saving switch signal S18 is at a low level LO and turned off when the power-saving switch signal S18 is at a high level HI.

Third Embodiment

Figure 8:
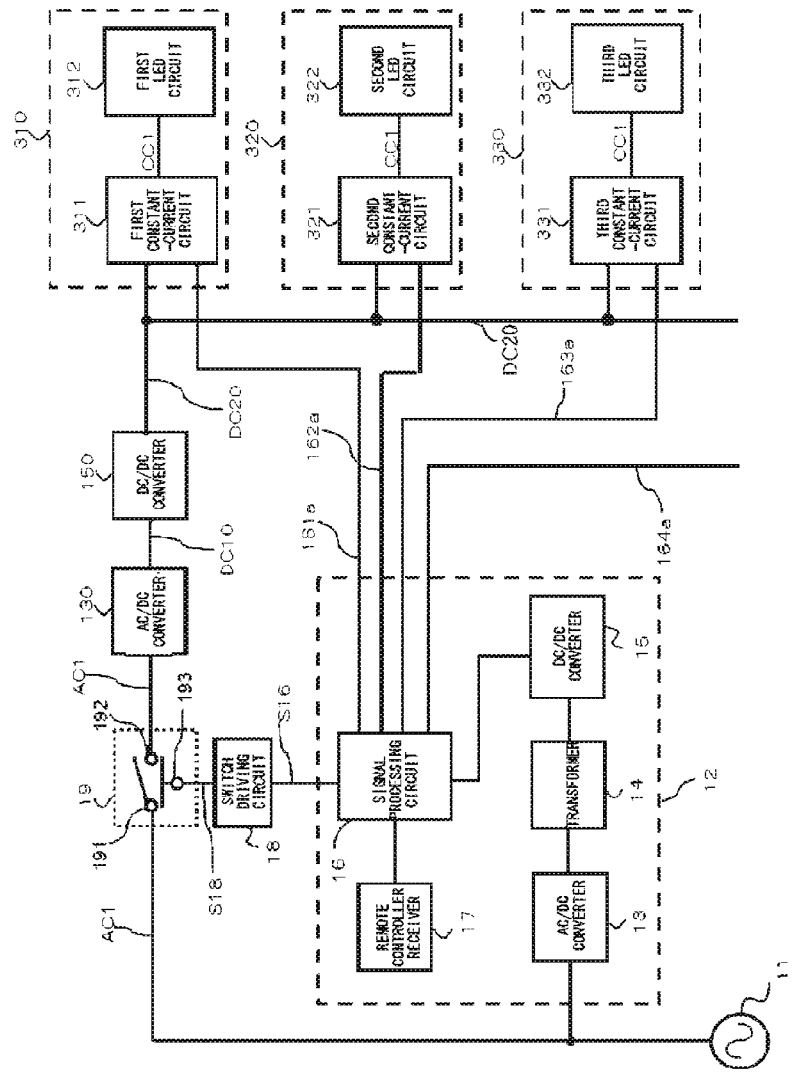
FIG. 8 shows a lighting system according to a third embodiment of the present invention.

FIG. 8 shows a third embodiment of a lighting system according to the present invention. The third embodiment is similar to the embodiments shown in FIGS. 1 and 2 in that the third embodiment also includes the main power source 11, the control circuit 12, the switch driving circuit 18, and the power switch 19. Unlike the first and the second embodiment, the third embodiment includes a first LED lighting unit 310, a second LED lighting unit 320, and a third LED lighting unit 330.

The first LED lighting unit 310 includes a first constant-current circuit 311 and a first LED circuit 312. The first constant-current circuit 311 supplies a constant current CC1 to the first LED circuit 312. The second LED lighting unit 320 includes a second constant-current circuit 321 and a second LED circuit 322. The second constant-current circuit 321 supplies a constant current CC1 to the second LED circuit 322. The third LED lighting unit 330 includes a third constant-current circuit 331 and a third LED circuit 332. The third constant-current circuit 331 supplies a constant current CC1 to the third LED circuit 332. These three lighting units can be set to a single color temperature. For instance, all the three LED lighting units may be for the daylight white color light source. Alternatively, all the three LED lighting units may be for the incandescent color light source. Alternatively, these LED lighting units may be designed for a color temperature corresponding to one of the daylight color, the white color and the warm white color defined in JIS Standard Z-9912. Alternatively, similarly to the first and the second embodiments shown in FIGS. 1 and 2, these LED lighting units may provide a plurality of light sources of different color temperatures.

Although three LED lighting units, i.e., the first through the third LED lighting unit 310-330 are shown in FIG. 8, more than three LED lighting units or less than three LED lighting units may be provided.

As a large difference of the third embodiment shown in FIG. 8 from the first and the second embodiments shown in FIGS. 1 and 2, an AC/DC converter 130 and a DC/DC converter 150 are provided directly downstream of the power switch 19. The AC/DC converter 130 converts the AC voltage AC1 into a DC voltage DC10, and the DC/DC converter 150 converts the DC voltage DC10 into a DC voltage DC20. The DC voltage DC20 is supplied to the first LED circuit 312 via the first constant-current circuit 311. The DC voltage DC20 is also supplied to the second LED circuit 322 via the second constant-current circuit 321. The DC voltage DC20 is also supplied to the third LED circuit 332 via the third constant-current circuit 331.

Although the AC/DC converter 130 and the DC/DC converter 150 in the lighting system 800 shown in FIG. 8 are used commonly for the three lighting units, i.e., the first LED lighting unit 310, the second LED lighting unit 320 and the third LED lighting unit 330, an AC/DC converter 130 and a DC/DC converter 150 may be provided individually for each of the LED lighting units.

Fourth Embodiment

Figure 9:
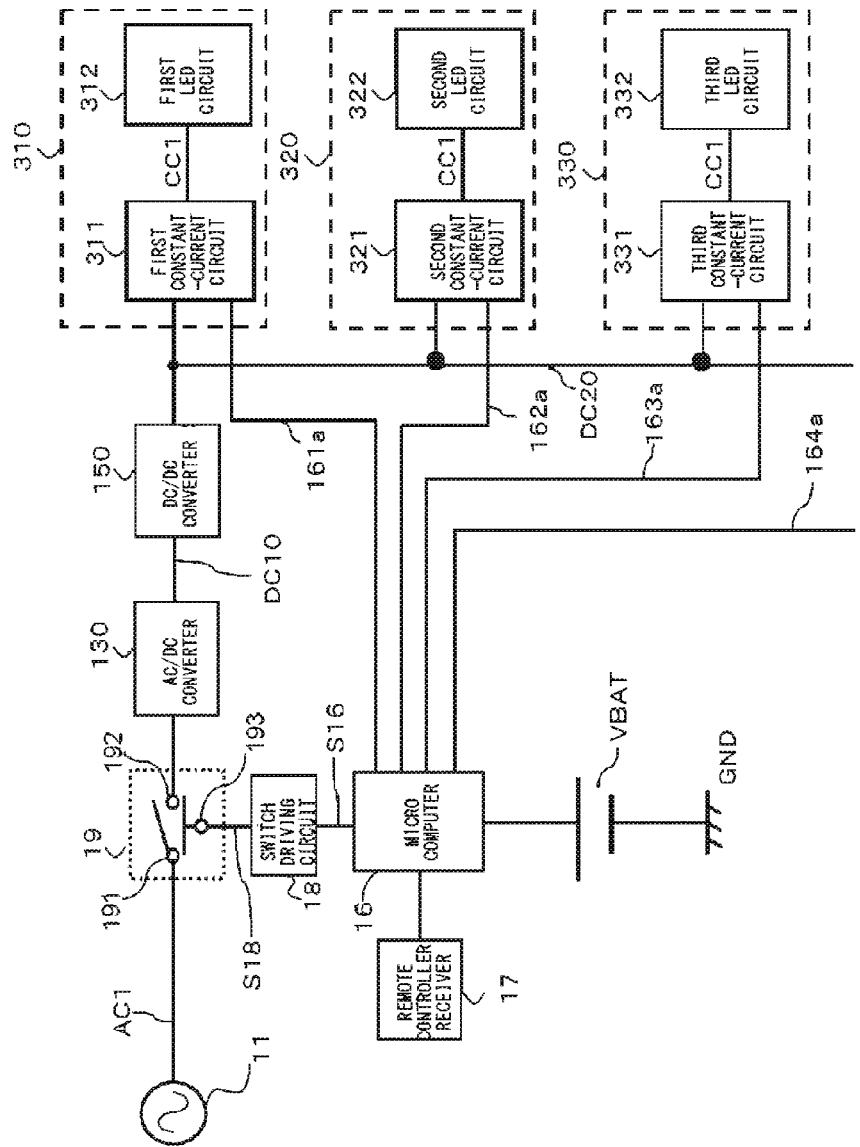
FIG. 9 shows a lighting system according to a fourth embodiment of the present invention.

FIG. 9 shows a lighting system 900 according to a fourth embodiment of the present invention. The fourth embodiment is obtained by changing part of the third embodiment shown in FIG. 8. Specifically, in the embodiment shown in FIG. 8, the control circuit 12 is provided to generate a power source voltage for driving the signal processing circuit 16, and the AC/DC converter 13, the transformer 14 and the DC/DC converter 15 are provided in the control circuit 12. Unlike this, the embodiment shown in FIG. 9 does not use these circuit portions but uses a DC voltage source VBAT instead. The DC voltage source VBAT may comprise a battery of 3.3 V or 5.0 V. According to the fourth embodiment, the size and cost of the entire lighting system can be reduced as compared with the first, the second and the third embodiments.

Fifth Embodiment

Figure 10:
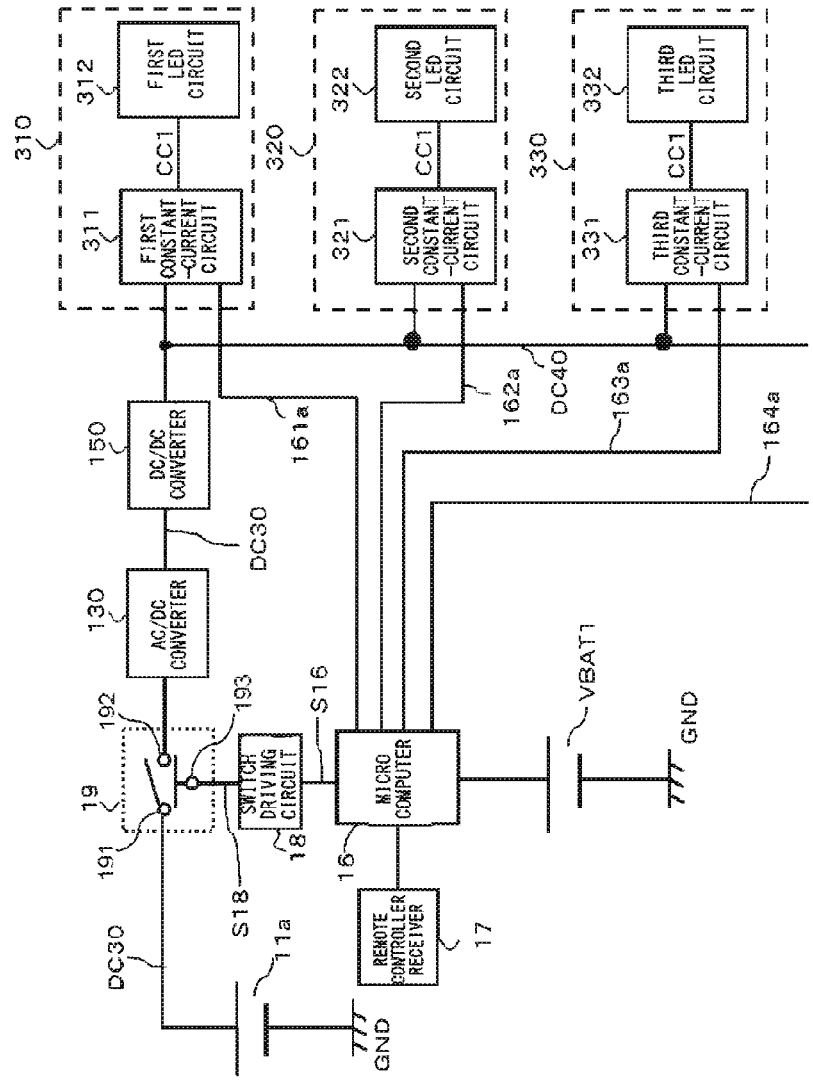
FIG. 10 shows a lighting system according to a fifth embodiment of the present invention.

FIG. 10 shows a lighting system 1000 according to a fifth embodiment of the present invention. In the fourth embodiment shown in FIG. 9, an AC voltage AC1 is supplied from the main power source 11 to the power switch 19. Unlike this, in the embodiment of FIG. 10, a main power source 11a of DC voltage is provided. That is, although the main power source 11 supplies an AC voltage AC1 in all the first through the fourth embodiments, the main power source 11a of the fifth embodiment shown in FIG. 10 supplies a DC voltage. At present, a ceiling light directly fixed to the ceiling of a room is usually operated with an AC voltage from a commercial power source. However, it is expected that in the future a larger number of LED lamps, organic EL devices, fluorescent lamps or high intensity discharge (HID) lamps are operated with a DC power source provided by a private electricity generation system. The lighting system of the present invention is also applicable to such a situation.

Figure 11:
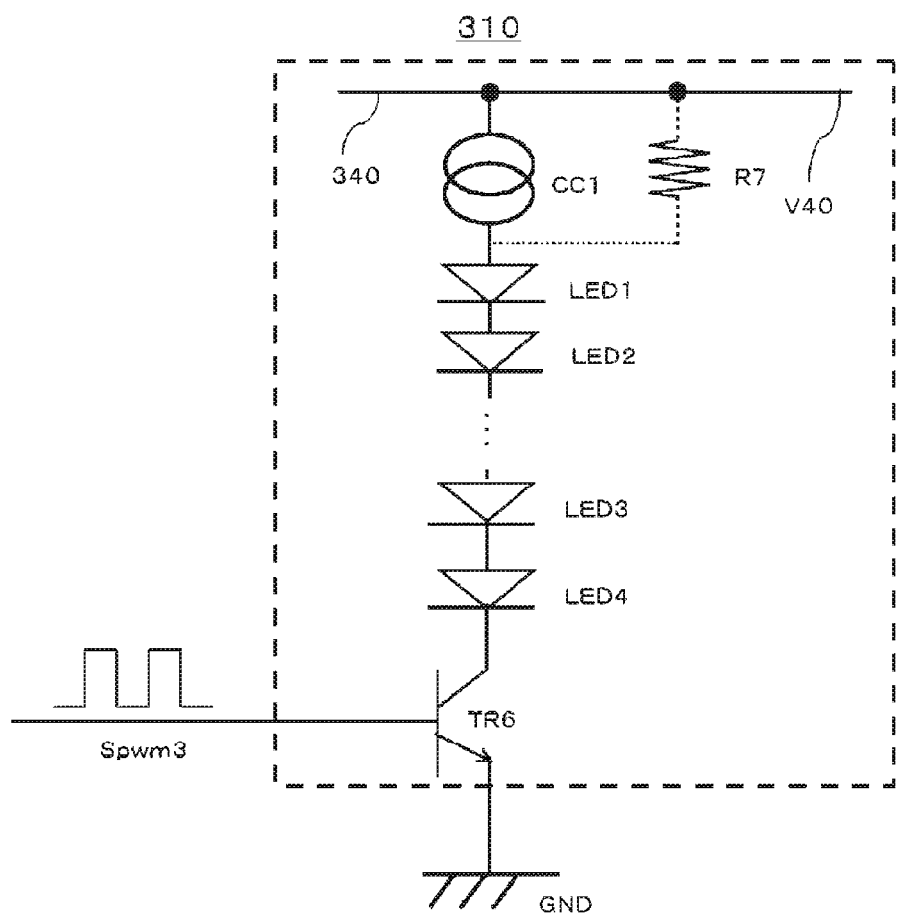
FIG. 11 is a circuit diagram of a first LED lighting unit according to third through fifth embodiments of the present invention.

FIG. 11 shows a specific circuit structure of the first LED lighting unit 310 shown in FIGS. 8, 9 and 10. It is to be noted that the specific circuit structures of the second LED lighting unit 320 and the third LED lighting unit 330 are basically the same as that shown in FIG. 11.

To the first LED lighting unit 310 shown in FIG. 11, DC voltage V40 is supplied through the DC voltage supply line 340. The constant current CC1 generated at the first constant-current circuit 311 flows through the DC voltage supply line 34 to the light emitting diodes LED1, LED2, LED3, and LED4 in the mentioned order. To this series connection of the light emitting diodes LED1, LED2, LED3, LED4 is connected the collector of a transistor TR6. To the base of the transistor TR6 is applied a pulse signal. The pulse width of the pulse signal is controlled so that the brightness of the light emitting diodes LED1-LED4 is adjusted. Namely, the brightness of the light from the light emitting diodes LED1-LED4 is controlled based on the pulse width of the PWM signal Spwm. In this way, the circuit structure shown in FIG. 11 employs a method of adjusting brightness by duty control, using a constant current. As already described with reference to FIG. 3, the LED light sources of the present invention do not necessarily need to be connected in series, and parallel connection may also be used in combination.

As illustrated by the broken line in FIG. 11, the constant current CC1 may be replaced with a resistor R7. Such a structure is known as a brightness adjustment method by duty control using a constant voltage. This circuit structure has an advantage that the structure is simple as compared with the circuit for the constant-current method, though there may be a disadvantage that the brightness of the light changes when the forward voltages of the light emitting diodes LED1-LED4 are biased.

As described above, the lighting system according to the present invention ensures considerable standby power reduction. The present invention is particularly applicable to a lighting system which needs to provide a high brightness or a large-size lighting system having high power consumption.

1B Embodiment

Described below with reference to the drawings is a 1B embodiment according to a variation of the present invention. In the drawings referred to below, the elements that are identical or similar are designated by the same or similar reference signs. The drawings are only schematic and the dimensional relationship or ratio between corresponding parts may differ between the drawings.

Figure 16:
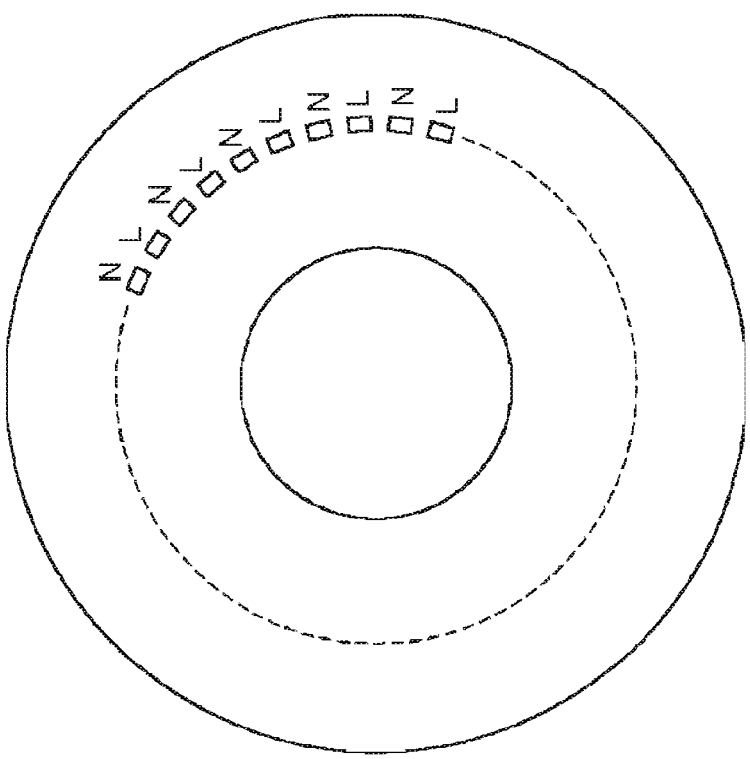
FIG. 16 shows an example of arrangement of daylight white color LEDs and incandescent color LEDs in the LED lighting apparatus according to a variation of the present invention.

Shown in FIG. 13 is a chromaticity/brightness control map for describing a method of adjusting the brightness and/or chromaticity of light emitted from an LED lighting apparatus according to the variation of the present invention. As shown in FIG. 16, the LED lighting apparatus according to the variation of the present invention includes two types of white LEDs (light emitting diodes) which emit light of different color temperatures (hues).

As defined also in JIS standard, the white color range includes, from a higher color temperature, a daylight color (color temperature: about 5700-7100 K), a daylight white color (color temperature: about 4600-5400 K), a white color (color temperature: about 3900-4500 K), a warm white color (color temperature: about 3200-3700 K), and an incandescent color (color temperature: about 2600-3158 K), and LEDs of any of these hues may be employed. In other words, the light emitting portion according to the variation of the present invention may comprise two groups of LEDs selected from a daylight color LED group, daylight white color LED group, a white color LED group, a warm white color LED group and an incandescent color LED group.

Preferably, the light emitting portion comprises LEDs of the daylight white color LED group and the incandescent color LED group.

Specifically, as shown in FIG. 16, a plurality of LEDs of the incandescent color (hereinafter referred to as "L color") and a plurality of LEDs of the daylight white color (hereinafter referred to as "N color") are alternately arranged in a circle. That is, LEDs of the L color and LEDs of the N color are used in combination as arranged to form a circle generally concentric with the power source cover provided at the center. With this arrangement, when the brightness of the incandescent color LEDs or the brightness of the daylight white color LEDs is changed, both the chromaticity and brightness change. When the light output from the both types of LEDs is increased without changing the ratio between the brightness of the incandescent color LEDs and that of the daylight white color LEDs, the brightness increases, with the chromaticity remains unchanged. When the light output from both types of LEDs is reduced, the brightness decreases, with the chromaticity remains unchanged.

Herein, each LED element comprises e.g. an n-type semiconductor layer made of a GaN-based semiconductor, a p-type semiconductor layer, and an active layer sandwiched between these semiconductor layers. The LED element emits e.g. blue light.

The LED element is covered with a sealing resin. The sealing resin is made of e.g. a transparent epoxy resin or a silicone resin mixed with a fluorescent substance. The fluorescent substance emits yellow light when excited by blue light emitted from the LED element. The yellow light is mixed with blue light emitted from the LED element, whereby white light is obtained. The sealing resin may contain a fluorescent substance that emits red light when excited by blue light and a fluorescent substance that emits green light when excited by blue light.

The chromaticity/brightness control map shown in FIG. 13 indicates how the chromaticity changes with changes in brightness of the incandescent color (L color) LEDs and changes in brightness of the daylight white color (N color) LEDs. At the point A in the chromaticity/brightness control map, both the output from the L-color LEDs and the output from the N-color LEDS are at the maximum. That is, at the point A, the brightness obtained by the two types of LEDs is at the maximum, and the color temperature ratio between the L color and the N color is 1:1. At the point B, the output from the L-color LEDs is at the maximum, whereas the output from the N-color LEDs is 0 ("light OFF" state). That is, the brightness at the point B is half the brightness at the point A, and the color temperature (chromaticity) at the point B is the lowest (2900 K).

At the point C, the output from the L-color LEDs is 0 ("light OFF" state) and the output from the N-color LEDs is at the maximum. That is, the brightness at the point C is equal to the brightness at the point B and half the brightness at the point A. The color temperature (chromaticity) at the point C is the highest (5000 K). At the point D, both the output from the L-color LEDS and the output from the N-color LEDs are 0 ("light OFF" state). That is, the brightness by the two types of LEDs at the point D is at the minimum ("light OFF" state). The color temperature (chromaticity) at the point D is equal to that at the point A, i.e., just in the middle of the point B and the point C.

By changing the respective outputs from the L-color LEDs and the N-color LEDs between 0 ("light OFF" state) and the maximum, the range surrounded by the square shown in the figure, which is defined by the solid lines connecting the four points A, B, C and D, is considered to be covered. However, both the L-color LEDs and the N-color LEDs have variations in output. Thus, the brightness and chromaticity in the square surrounded by the four points A, B, C and D may not be fully covered. That is, in some lighting systems, the coverable range of the chromaticity and brightness does not correspond to the square of the four points A, B, C and D shown in FIG. 13.

Thus, taking variations in output of the LEDs into consideration, instead of setting the range defined by the four points A, B, C, and D covering the maximum light output as the rated output range for chromaticity and brightness, the range surrounded by the broken lines in the figure which connect four points A', B', C' and D' positioned inward of the points A, B, C, D is set as the rated output range.

Generally, an LED is connected to a constant-current source and driven by a PWM (pulse width modulation) signal by electric current. Thus, in order to change the output from an LED, the duty ratio of the ON period of a PWM signal outputted from the LED driver is changed. To maximize the light output from an LED, the LED is driven with the duty ratio of 100%. To minimize the light output from an LED (turn off the LED), the LED is driven with the duty ratio of 0%. However, light output from the L-color LEDs and light output from the N-color LEDs are made neither maximum nor minimum at the points A', B', C' and D'.

Figure 21:
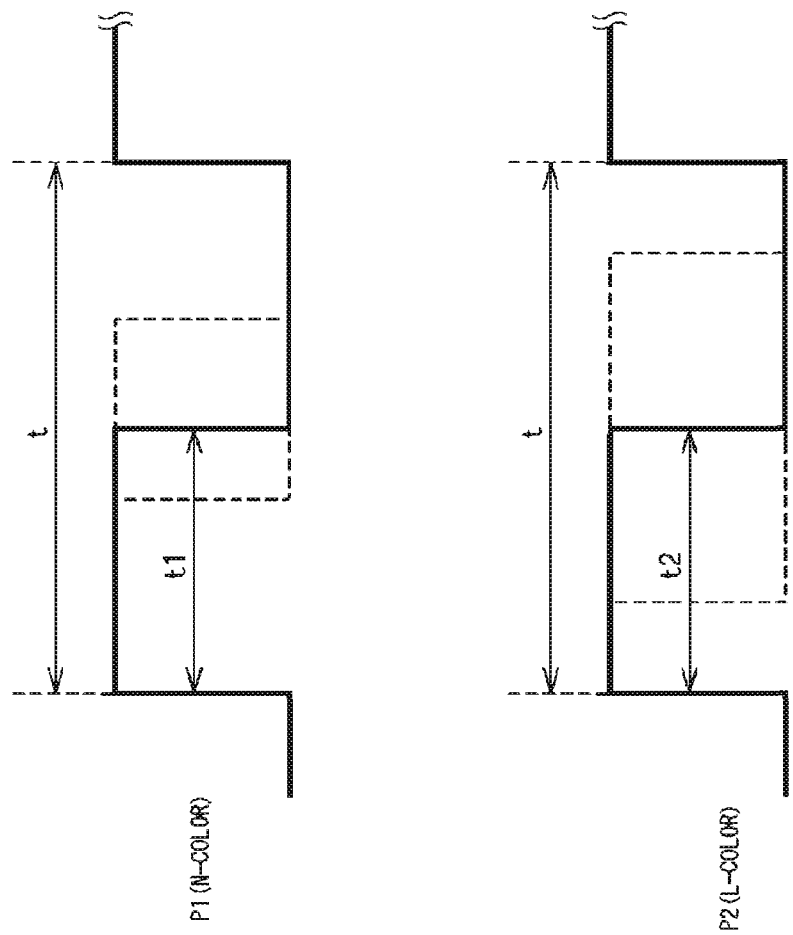
FIG. 21 shows examples of PWM signals for daylight white color LEDs and incandescent color LEDs of the LED lighting apparatus according to a variation of the present invention.

FIGS. 15A and 15B show a relationship between a PWM signal and the output from L-color LEDs or the output from the N-color LEDs. FIG. 21 shows examples of a PWM signal for the N-color LEDs and a PWM signal for the L-color LEDs. The pulse P1 in FIG. 21 is a PWM signal for the N-color LEDs, whereas the pulse P2 in FIG. 21 is a PWM signal for the L-color LEDs.

The pulse P1 is a pulse signal having a cycle t. The ON period is indicated by t1. The duty ratio of the pulse P1 is 100×(t1/t) %. The pulse 22 is a pulse signal having a cycle t. The ON period is indicated by t2. The duty ratio of the pulse P2 is 100×(t2/t) %. The light output from the N-color LEDs is changed by changing the ON period t1 in the pulse P1 to the period indicated by the broken lines (pulse width modulation). The light output from the L-color LEDs is changed by changing the ON period t2 in the pulse P1 to the period indicated by the broken lines (pulse width modulation).

For instance, when the duty ratio of the pulse P1 is 100%, the light output from the N-color LEDs is at the maximum. When the duty ratio of the pulse P1 is 0%, the light output from the N-color LEDs is at the minimum. These hold true for the pulse P2. For instance, when the ON period t2 of the pulse P2 is linearly increased, the duty ratio linearly increases, so that the brightness increases linearly (stepwise). When the ON period t2 is linearly decreased, the duty ratio linearly decreases, so that the brightness decreases linearly (stepwise). These hold true for the pulse P1.

For instance, when the ON period t1 of the pulse P1 is non-linearly increased, the duty ratio increases non-linearly, so that the brightness increases non-linearly. When the ON period t1 is non-linearly decreased, the duty ratio decreases non-linearly, so that the brightness decreases non-linearly. Examples of non-linear increase/decrease include exponential increase/decrease and increase/decrease based on quadratic function. These hold true for the pulse P2.

In FIGS. 15A and 15B, L indicates the L-color, whereas N indicates the N-color. FIG. 15A shows the duty ratios of a PWM signal for the LEDs at the four points A, B, C and D. At the point A, the duty ratio is 100% (maximum output) for both the L-color and the N-color. At the point B, the duty ratio for the L-color is 100%, whereas the duty ratio for the N-color is 0% (minimum output). At the point C, the duty ratio for the L-color is 0%, whereas the duty ratio for the N-color is 100%. At the point D, the duty ratio is 0% for both the L color and the N color.

FIG. 15B shows the duty ratios of a PWM signal for the LEDs at the four points A', B', C' and D'. At each of the four points, the light output from the L-color LEDs and the light output from the N-color LEDs have a margin (allowance) of α%. Herein, α>0. At the point A', the duty ratio is (100−α)% for both the L-color and the N-color. At the point B', the duty ratio for the L-color is (100−α)%, whereas the duty ratio for the N-color is α%. At the point C', the duty ratio for the L-color is α%, whereas the duty ratio for the N-color is (100−α)%. At the point D', the duty ratio is α% for both the L color and the N color.

That is, at the point A', the brightness is decreased by 2α% while the chromaticity is maintained, as compared with the point A. At the point B', the brightness is maintained while the chromaticity is increased by 2α%, as compared with the point B. At the point C', the brightness is maintained while the chromaticity is decreased by 2α%, as compared with the point C. At the point D', the brightness is increased by 2α% while the chromaticity is maintained, as compared with the point D.

By securing margins in this way, the rated output range for brightness and chromaticity can be adjusted as required, as shown in FIGS. 14A-14D, for example. As will be understood by referring to the position of FIG. 13, FIG. 14A indicates that the region surrounded by the four points A', B', C', D' can be translated upward by up to 2α%. In the state shown in FIG. 14A, the point A' corresponds to the point A. FIG. 14B indicates that the region surrounded by the four points A', B', C', D' can be translated leftward by up to 2α%. In the state shown in FIG. 14B, the point B' corresponds to the point B. FIG. 14C indicates that the region surrounded by the four points A', B', C', D' can be translated rightward by up to 2α%. In the state shown in FIG. 14C, the point C' corresponds to the point C. FIG. 14D indicates that the region surrounded by the four points A', B', C', D' can be translated downward by up to 2α%. In the state shown in FIG. 14D, the point D' corresponds to the point D.

That is, when a LED lighting apparatus is completed, brightness and chromaticity of the lighting apparatus are measured to make a chromaticity/brightness control map. The four points of the chromaticity/brightness control map should be at the positions of the points of A', B', C' and D', respectively. However, when the brightness is entirely low and the chromaticity/brightness control map is closer to the point D, the upward shift as shown in FIG. 14A is performed, i.e., adjustment is performed to make the four points of the map correspond to the points A', B', C' and D'. In this way, by performing adjustment within the margin of α, LED lighting apparatuses having a uniform rated output are obtained.

Preferably, the margin α is set to correspond to the variation range of the light output from the L-color LEDs and the light output from the N-color LEDs. A test performed with respect to some samples revealed the following: in the samples of L-color LEDs which had the largest variation in light output, when compared at the maximum output (duty ratio: 100%), the duty ratio of the LED having the highest brightness needs to be made 70% in order to make the brightness of that LED correspond to the brightness of the LED having the lowest brightness. On the other hand, in the samples which had the smallest variation in light output, when compared at the maximum output, the duty ratio of the LED having the highest brightness needs to be made 89% in order to make the brightness of that LED correspond to the brightness of the LED having the lowest brightness. It is to be noted that the minimum output of an LED indicates that the LED is completely put out. Thus, no variation exists, and the minimum value of the duty ratio is 0%. The results similar to the above were obtained with respect to the N-color LED samples. From these results, when largest variations in the light output from the L-color LEDs and the light output from the N-color LEDs are taken into consideration, it is preferable that 0<α<30(%).

In this way, by providing both the L-color LEDs and the N-color LEDs with a predetermined light output margin α and adjusting the light outputs based on the results of a test before shipment from the factory, all the LED lighting apparatuses can be adjusted to emit light in a uniform brightness/chromaticity range. Moreover, when a user cannot be satisfied with the brightness/chromaticity range set before the shipment, the LED lighting apparatus can be configured such that the user can set the range of α as desired.

Specifically, the average value of variations in chromaticity of the N-color LEDs is represented as $C_N$. The absolute value of the maximum variation in chromaticity of the N-color LEDs is represented as $C_{NM}$. The average value of variations in chromaticity of the L-color LEDs is represented as $C_L$. The absolute value of the maximum variation in chromaticity of the L-color LEDs is represented as $C_{LM}$. The average value of variations in brightness of the N-color LEDs is represented as $I_N$. The absolute value of the maximum variation in brightness of the N-color LEDs is represented as $I_{NM}$. The average value of variations in brightness of the L-color LEDs is represented as $I_L$. The absolute value of the maximum variation in brightness of the L-color LEDs is represented as $I_{LM}$. The average value of variations in chromaticity of all the LEDs including the N-color and the L-color is represented as CB. The absolute value of the maximum variation in chromaticity of all the LEDs including the N-color and the L-color is represented as $CB_M$. The average value of variations in brightness of all the LEDs including the N-color and the L-color is represented as IB. The absolute value of the maximum variation in brightness of all the LEDs including the N-color the L-color is represented as $IB_M$. Further, C1=MAX ($C_N$,$C_L$), I1=MAX ($I_N$, $I_L$), C2=MAX ($C_{NM}$, $C_{LM}$), I2=MAX ($I_{NM}$, $I_{LM}$), −C2≤C1≤C2, −I2≤I1≤I2. Herein, actually, C2 is about 4(%), and I2 is about 8(%).

The number of color tones as a whole is represented as a, the number of brightness levels as a whole is represented as b, the color tone and the brightness level when the N-color LEDs and the L-color LEDs are on are represented by x and y, respectively. Herein, for instance, a can be set to about 73, and b can be set to about 73. As shown in FIG. 21, the PWM signal for the N-color LEDs is represented as P1, the PWM signal for the L-color LEDs is represented as P2, the duty ratio of P1 is represented as PN, and the duty ratio of P2 is represented as PL. Herein, 0≤PN≤1, and 0≤PL≤1. When the mutual light emitting efficiency correction factor of the N-color LEDs and the L-color LEDs is represented by ω, PN=(1−C2−C1)×ω×(x/a)×(1−I2−I1)×(y/b) and PL=(1−C2−C1)×w×((a−x+1)/a)×(1−I2−I1)×(y/b). Herein, ω can be set to about 0.9.

(1−C2−C1)×(1−I2−I1) of PN or PL is equal to (1−(I2+I1)−(C2+C1)+(C2+C1)(I2+I1)), among which (C2+C1+I2+I1)+(C2+C1) (I2+I1) corresponds to the correction range or adjustment range α.

Figure 17:
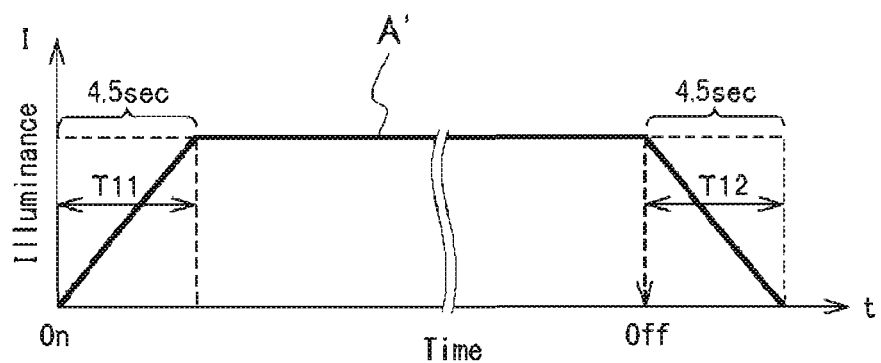
FIG. 17 shows a time chart of lighting operation and putting-out operation by a conventional LED lighting apparatus.

Conventionally, operations to light or put out an LED lighting apparatus such as a ceiling light is performed as shown in FIG. 17. First, when the power switch is turned on by the operation of e.g. a remote controller, brightness increases linearly (stepwise) for a brightness increasing operation period of T11, which may be 4.5 seconds, from the start of lighting to the completion of lighting. After 4.5 seconds, the brightness reaches the point A' shown in FIG. 13. On the other hand, when the power switch is turned off (at the point "OFF" indicated in the figure), the brightness decreases linearly for a brightness decreasing operation period of T12 which is equal to the brightness increasing operation period of T11, from the start of putting-out to the completion of putting-out, and the light is finally put out. Such linear increase and decrease of brightness is employed to prevent dazzling and provides a sense of high quality.

In the case of FIG. 17, when lighting is performed by linearly increasing the brightness from the non-lighting state to the completion of lighting, humans can easily notice the lighting operation sensuously. However, when putting-out of a light is performed by linearly decreasing brightness from the lighting state to the completion of put-out operation, it is sometimes difficult for humans to sensuously notice that the put-out operation is properly working. Thus, although the put-out operation is proceeding, the user may sometimes press the power switch again, making the process return to the lighting operation.

Figure 18:
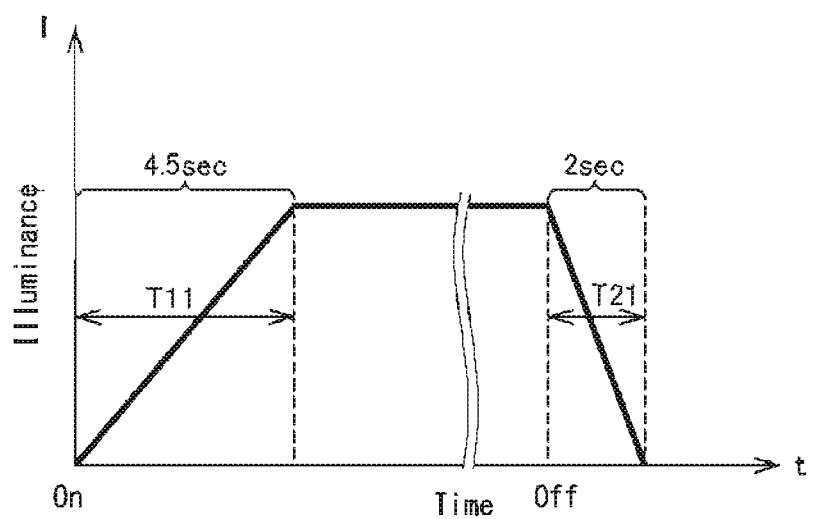
FIG. 18 shows a time chart of lighting operation and putting-out operation by the LED lighting apparatus according to a variation of the present invention.

To solve such a problem, the brightness decreasing operation period is made shorter than the brightness increasing operation period. FIG. 18 shows an example of brightness increasing operation period and brightness decreasing operation period. When the power source switch is turned on, the brightness increasing operation is performed for the brightness increasing operation period of T11 equal to that shown in FIG. 17, i.e., for 4.5 seconds, and lighting is completed after the lapse of the period T11. On the other hand, when the power switch is turned off, brightness is decreased linearly (stepwise) for two seconds, as indicated as the brightness decreasing period T21 shown in FIG. 18, and putting-out is completed finally. The brightness decreasing period T21 is two seconds, which is shorter than the brightness increasing period T11. The brightness decreasing operation performed linearly (stepwise) in a shorter period of time in this way is easy for humans to notice sensuously. Preferably, the brightness decreasing period T21 is half or less than the brightness increasing period T11. That is, $T21 \leq (½) \times T11$.

Figure 19:
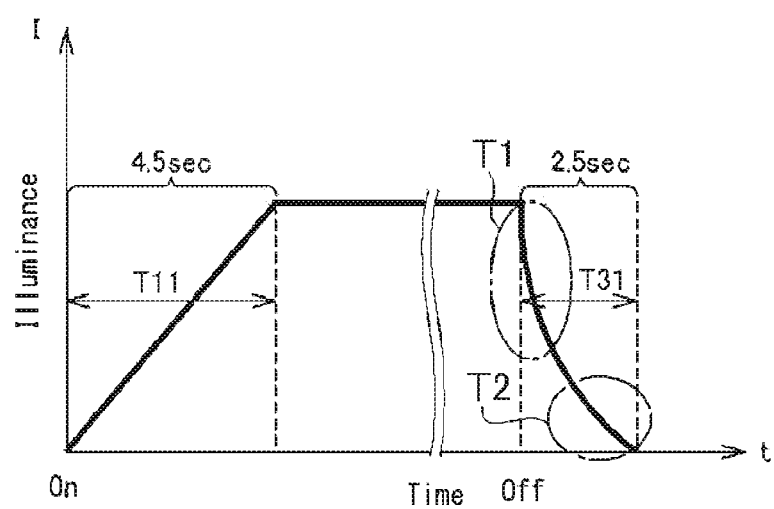
FIG. 19 shows a time chart of lighting operation and putting-out operation by the LED lighting apparatus according to a variation of the present invention.

Alternatively, the put-out operation may be performed as shown in FIG. 19. In the example shown in FIG. 19, the brightness increasing period is equal to that shown in FIGS. 17 and 18, whereas the brightness decreasing period T31 is 2.5 seconds. In the example shown in FIG. 19, the linear (stepwise) brightness decreasing operation like that shown in FIG. 18 is not performed. Instead, as indicated in the portion T1 in the figure, brightness is rapidly decreased in the first half period immediately after the power source switch is turned off. Then, in the latter half period, brightness is decreased slowly as indicated in the portion T2. In this way, a non-linear brightness decreasing operation period T31, in which brightness is decreased exponentially can also be employed. In this case, since the brightness decreases rapidly in the first half period, the user can easily notice sensuously. Further, since the brightness decreasing speed drops in the latter half period, the entire brightness decreasing period is sufficiently long, so that a sense of high quality can be provided.

The brightness decreasing operation to put out the light in FIGS. 18 and 19 is based on the assumption that both the brightness of the L-color LEDs and the brightness of the N-color LEDs are decreased, i.e., the duty ratios of the both PWM signals are reduced to put out the light. However, in the brightness decreasing operation of FIGS. 18 and 19, only the brightness of the N-color LEDs may be decreased, instead of decreasing brightness of both of the L-color LEDs and the N-color LEDs. It is known that humans can notice change in brightness more easily when the brightness of the N-color, which is closer to pale white, or has a higher color temperature, is decreased. Thus, this arrangement is suitable for preventing erroneous operation due to erroneous recognition.

Figure 20:
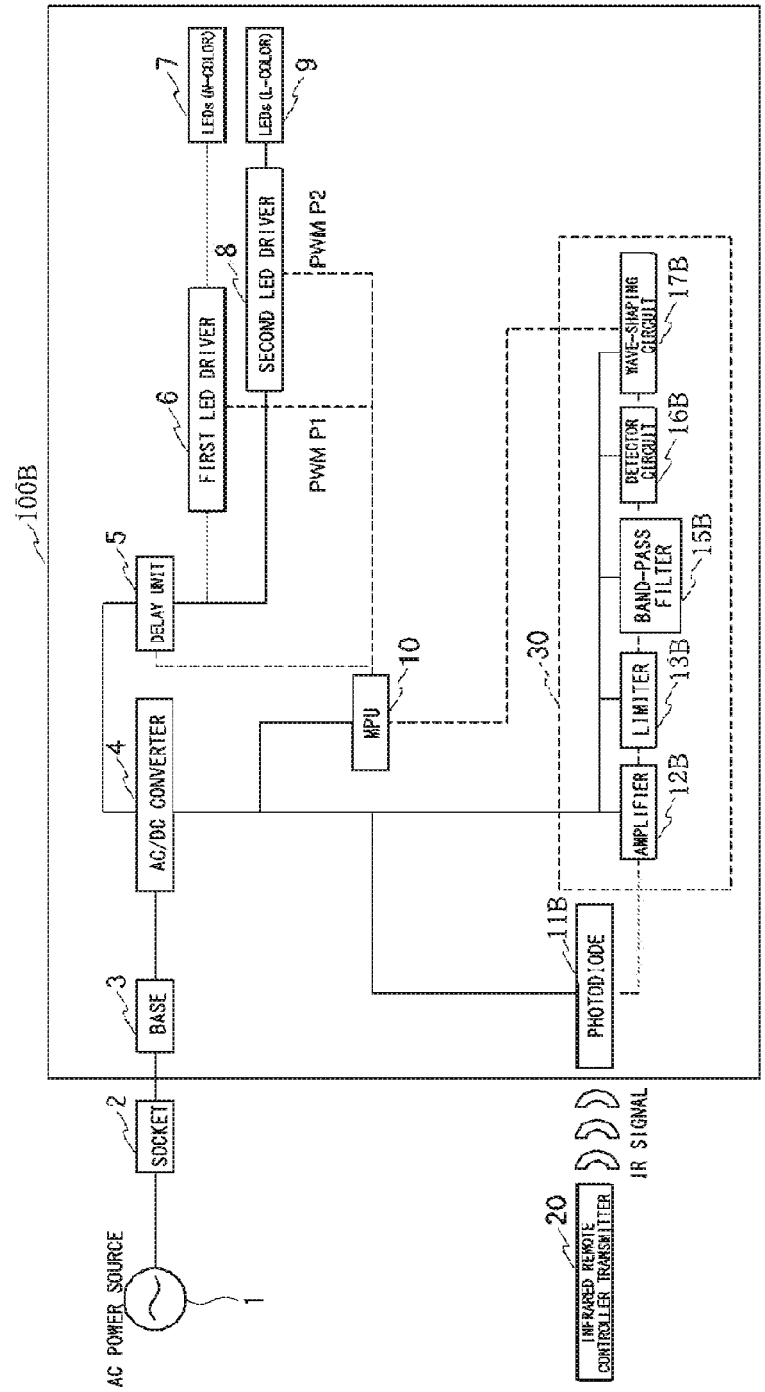
FIG. 20 is a block diagram showing an example of structure of the LED lighting apparatus according to a variation of the present invention.

FIG. 20 shows the specific structure of the LED lighting apparatus according to the variation of the present invention. The LED lighting apparatus 100B is connected to an AC power source 1 by attaching its base 3 to a socket 2. The LED lighting apparatus 100B includes an AC/DC converter 4, a delay unit 5, a first LED driver 6 for supplying a driving signal to the daylight white color LEDs 7, daylight white color LEDs 7, a second LED driver 8 for supplying a driving signal to the incandescent color LEDs 9, incandescent color LEDs 9, an MPU 10, a photodiode 11B, and a preamplifier 30. The MPU 10 is a microprocessor unit and controls each part, performs computations, and supplies a PWM signal to the first LED driver 6 and the second LED driver 8.

The first LED driver 6 and the second LED driver 8 are elements for driving the LEDs with a constant-current and performing brightness adjustment by a PWM (pulse width modulation) signal.

The AC voltage inputted is converted into a DC voltage at the AC/DC converter 4 and supplied to each of the delay unit 5, the first LED driver 6, the second LED driver 8, the MPU 10, the photodiode 11B and the preamplifier 30. In FIG. 20, the solid lines extending from the AC/DC converter 4 basically represent power lines, whereas the broken lines connecting blocks to each other basically represent signal lines.

The preamplifier 30 is made up of an amplifier 12B, a limiter 13B, a band-pass filter 15B, a detector circuit 16B, and a wave-shaping circuit 17B.

The AC power source 1 and the socket 2 are provided outside the LED lighting apparatus 100B. The infrared remote controller transmitter 20 is used to turn on or off the LED lighting apparatus 100B and adjust the range of brightness and chromaticity of the light to be emitted. The infrared remote controller transmitter 20 has a light emitting diode for emitting infrared and hence sends out an infrared signal (IR signal). The IR signal is a signal subjected to pulse position modulation (PPM) and amplitude modulation. This signal is received by the photodiode 11B provided in the LED lighting apparatus 100B.

First, when the lighting-start (full lighting) switch of the infrared remote controller transmitter 20 is pressed, an TR signal is outputted from the infrared remote controller transmitter 20, which is received by the photodiode 11B. The IR signal is a serial signal subjected to PPM or amplitude modulation, and the amplitude is modulated with a 38 kHz carrier wave. The IR signal is converted into a current signal at the photodiode 11B and then converted and amplified into a voltage signal by the amplifier 12B. The voltage signals of different amplitudes outputted from the amplifier 12B is amplified by the limiter 13B into voltage output signals of a constant amplitude.

Of the signals outputted from the limiter 15B, the band-pass filter passes only the signals within the frequency range of the carrier wave and removes pulse wave distortion, noises and so on, whereby signals are converted into a proper digital level.

The signal is then transmitted to the MPU 10. The MPU 10 supplies a PWM signal P1 and a PWM signal P2 to the first LED driver 6 and the second LED driver 8, respectively, to perform full lighting of the N-color LEDs 7 and the L-color LEDs 9. The PWM signal P1 and the PWM signal P2 are signals having the same pulse shape as the PWM signals P1 and P2 described with reference to FIG. 21. The difference lies in that, since the LEDs are driven by a current, the PWM signals P1 and P2, which are voltage signals of a digital circuit, are converted by the first LED driver 6 and the second LED driver 8 into current pulse signals within the range of the LED driving current.

In starting the lighting, as shown in FIGS. 18 and 19, the light output is linearly (stepwise) increased. Specifically, as described with reference to FIG. 21, brightness is increased by stepwise and linearly increasing the duty ratios of the PWM signal P1 and the PWM signal P2 by the control by the MPU 10. When the MPU 10 finally outputs the PWM signals P1 and P2 having the duty ratio of the point A' shown in FIGS. 13 and 15, the lighting is completed. By this, the LEDs 7 and the LEDs 9 are fully lighted.

Next, put-out operation is described. When the put-out switch of the infrared remote controller transmitter 20 is pressed, an IR signal is outputted from the infrared remote controller transmitter 20, which is received by the photodiode 11B. The subsequent process before the digital signal is transmitted to the MPU 10 is the same as the process in starting the lighting, so that the description is omitted. As described with reference to FIGS. 18 and 19, in putting out the light, brightness is decreased linearly or non-linearly. Specifically, as described with reference to FIG. 21, brightness is decreased by linearly or non-linearly decreasing the duty ratios of the PWM signal P1 and the PWM signal P2 by the control by the MPU 10. When the MPU 10 finally outputs the PWM signals P1 and P2 having the duty ratio of the point D' shown in FIGS. 13 and 15, the putting out is completed.

However, as shown in FIG. 14, depending on the correction method, with the duty ratio of the point D', the duty ratio cannot be made 0%. To completely put out the light, the DC power source voltage for supply to the first LED driver 6 and the second LED driver 8 needs to be turned off. Thus, the MPU 10 outputs an OFF signal to the delay unit 5. The delay unit 5 shuts off the power line after a delay of a predetermined time from the reception of the OFF signal from the MPU 10, and turns off the DC power source voltage supplied to the first LED driver 6 and the second LED driver 8.

The delay unit 5 has several delay lines. In the case of the put-out operation shown in FIG. 18, a delay line is selected which turns off the DC power source voltage after a delay of the period T21 from the reception of the OFF signal from the MPU 10. On the other hand, in the case of the put-out operation shown in FIG. 19, a delay line is selected which turns off the DC power source voltage after a delay of the period T31 from the reception of the OFF signal from the MPU 10. In this way, the put-out operation is completed.

In order for the user to be able to change the value of α shown in FIG. 15, the apparatus is configured such that the rated output range can be changed in accordance with a signal from the infrared remote controller transmitter 20 by changing the upper and the lower limits of the duty ratios of the PWM signals P1, P2 at the MPU 10.

The feature of the present variation of the invention is described below as Appendixes.

Appendix 1

An LED lighting apparatus comprising:

a light emitting portion including a first LED and a second LED having different color temperatures and arranged alternately; and a light output controller for generating a first PWM signal for driving the first LED and a second PWM signal for driving the second LED;

wherein a rated output range of each of a duty ratio of the first PWM signal and a duty ratio of the second PWM signal is set to a range of from $(0+\alpha)$ to $(100-\alpha)\%$, where α represents an output range for correction and satisfies $0<\alpha<30$.

Appendix 2

The LED lighting apparatus as set forth in Appendix 1, wherein each of the duty ratio of the first PWM signal and the duty ratio of the second PWM signal is linearly adjusted by the light output controller so that brightness increasing operation from start of lighting to completion of lighting is performed linearly, and time for brightness decreasing operation from start of putting-out to completion of putting-out is shorter than time for the brightness increasing operation.

Appendix 3

The LED lighting apparatus as set forth in Appendix 1 or 2, wherein the first LED is a daylight white color LED, whereas the second LED is an incandescent color LED.

Appendix 4

The LED lighting apparatus as set forth in Appendix 2 or 3, wherein the brightness decreasing operation from start of putting-out to completion of putting-out is performed linearly.

Appendix 5

The LED lighting apparatus as set forth in Appendix 4, wherein the brightness decreasing operation time is half or less than the brightness increasing operation time.

Appendix 6

The LED lighting apparatus as set forth in Appendix 2, wherein the brightness decreasing operation is performed rapidly immediately after the start of putting-out and performed slowly immediately before the completion of putting-out.

Appendix 7

The LED lighting apparatus as set forth in Appendix 6, wherein the brightness decreasing operation is performed exponentially.

Appendix 8

The LED lighting apparatus as set forth in any one of Appendixes 3-5, wherein the brightness decreasing operation is performed with respect to only the daylight white color LED.

Appendix 9

The LED lighting apparatus as set forth in Appendix any one of Appendixes 2-8, wherein the light output controller includes a first LED driver for driving the first LED, a second LED driver for driving the second LED, and a delay unit for providing a time from the start of putting-out to the completion of putting-out.

Appendix 10

The LED lighting apparatus as set forth in any one of Appendixes 1-9, wherein a plurality of the first LEDs and the same number of the second LEDs are arranged on a circle.

1C Embodiment

Figure 22:
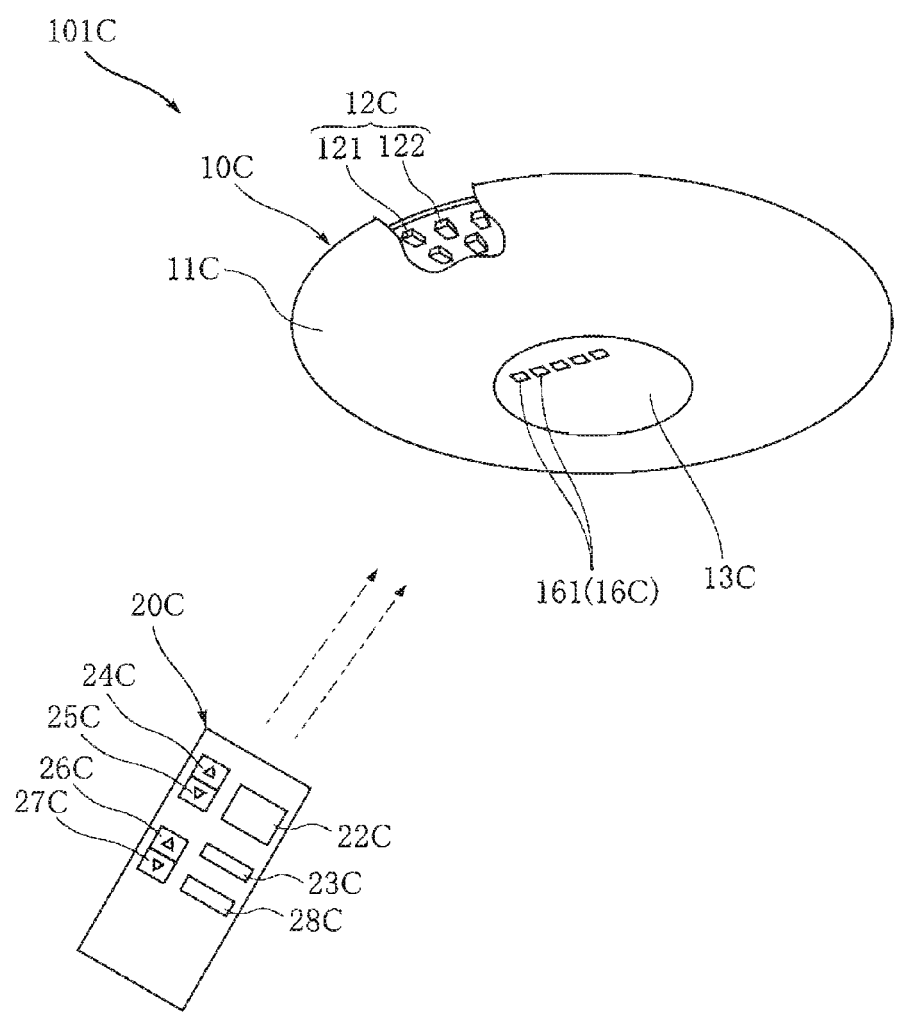
FIG. 22 shows an LED lighting apparatus of 1C embodiment according to a variation of the present invention.
Figure 23:
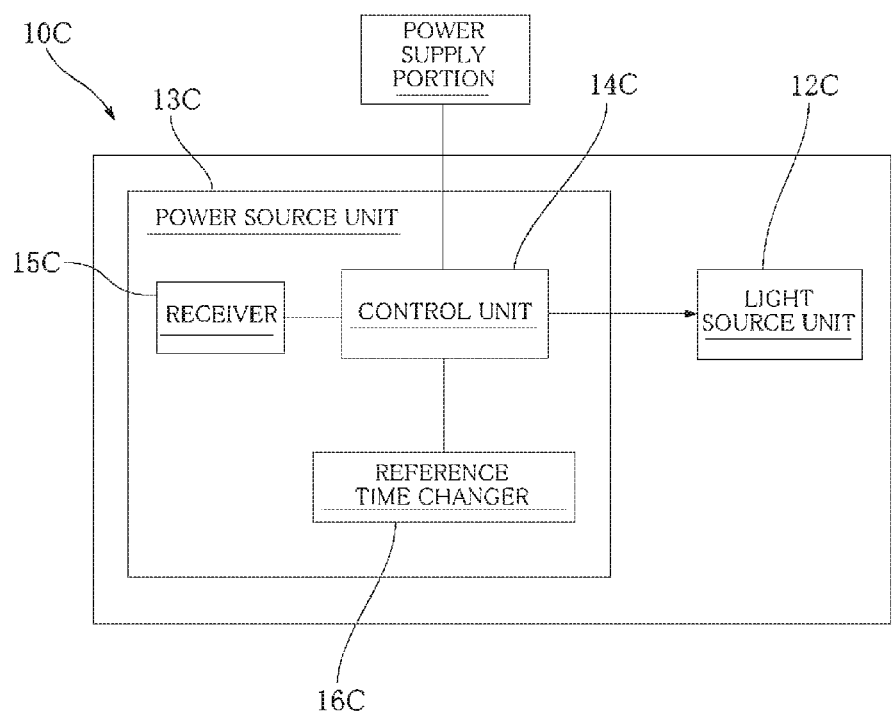
FIG. 23 is a schematic structural diagram of the main body shown in FIG. 22.
Figure 24:
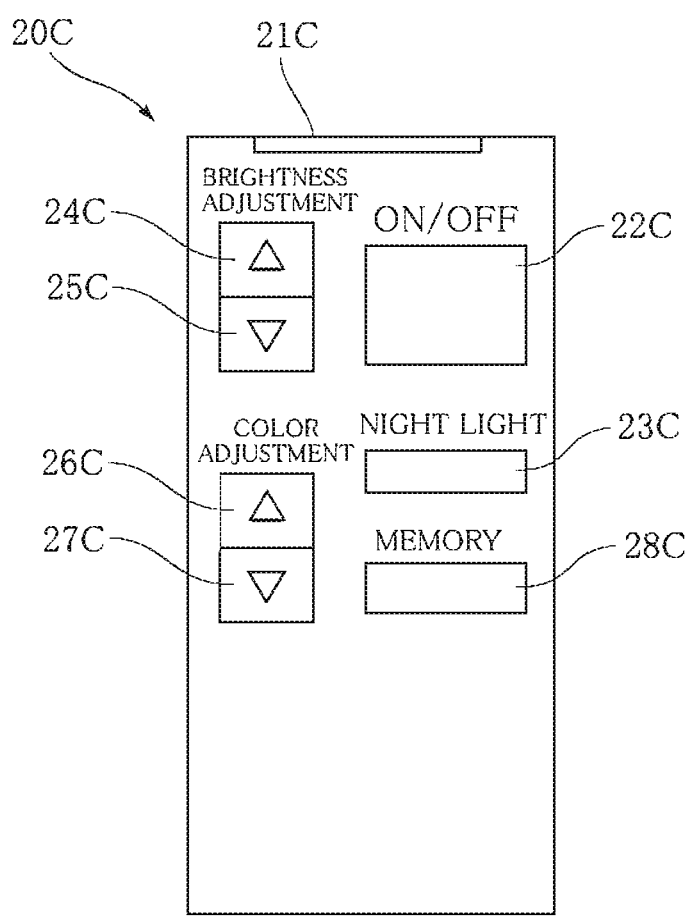
FIG. 24 is an enlarged plan view of the remote controller shown in FIG. 22.
Figure 25:
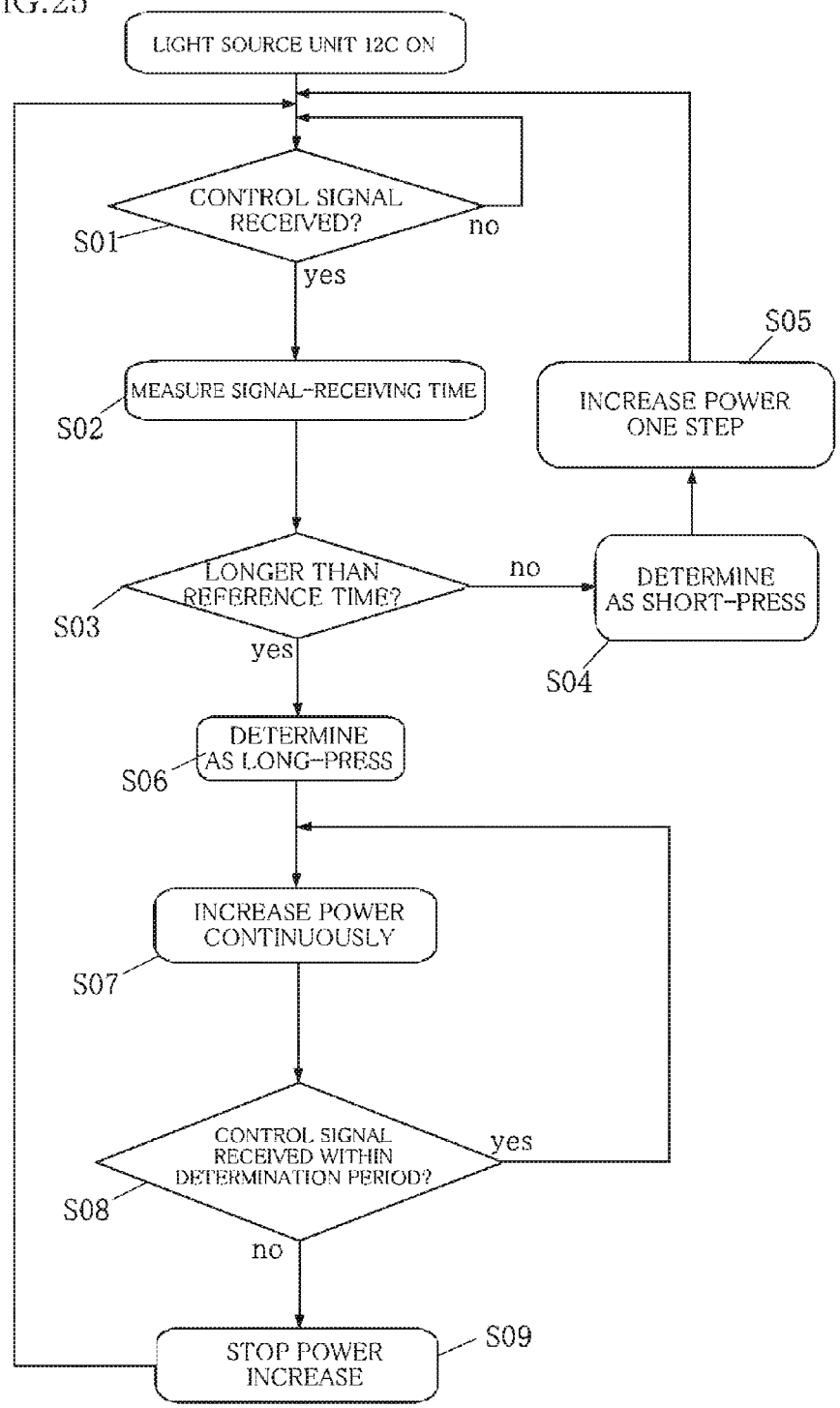
FIG. 25 shows an example of controlling process in the LED lighting apparatus shown in FIG. 22.
Figure 26:
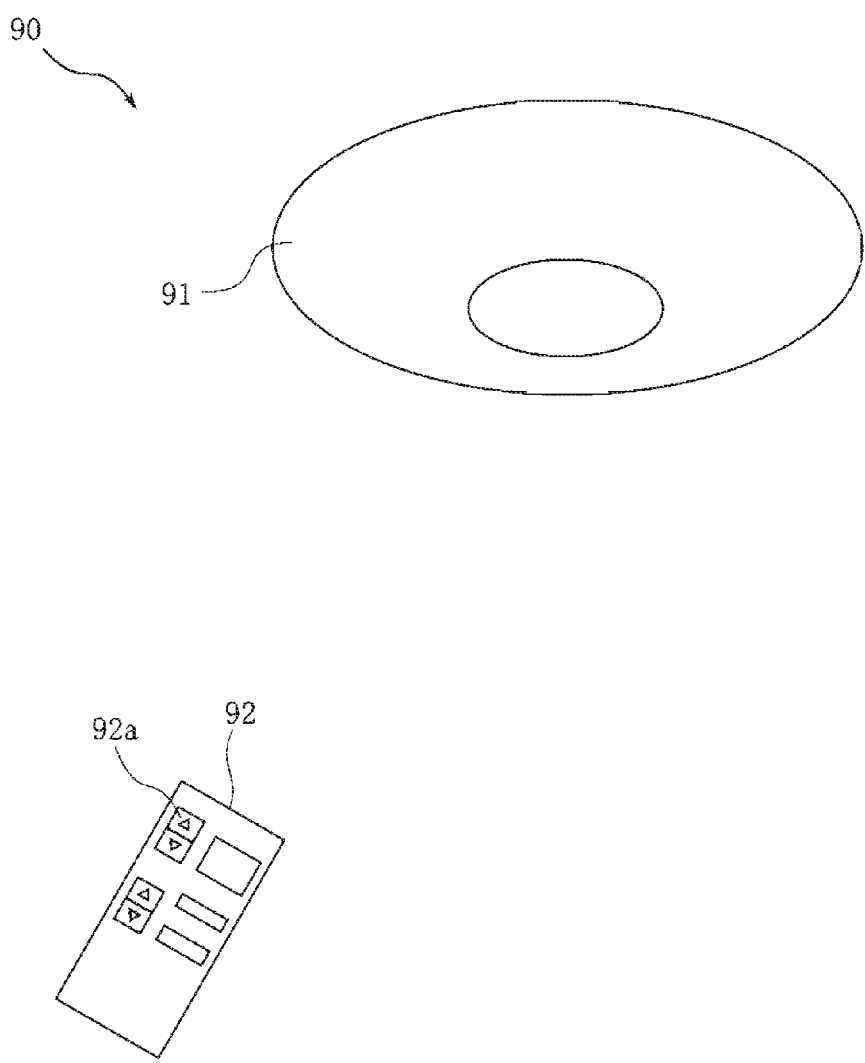
FIG. 26 shows an example of conventional LED lighting apparatus.

FIGS. 22-25 show an example of LED lighting apparatus according to a variation of the present invention. The LED lighting apparatus 101C of this embodiment is designed for use as a ceiling light, and includes a main body 10C to be fixed to a ceiling and a remote controller 20C for operating the main body 10C. FIG. 23 schematically shows the electric structure of the main body 10C. FIG. 24 is an enlarged plan view of the remote controller 20C. FIG. 25 shows an example of control performed in the LED lighting apparatus 101C.

As shown in FIG. 22, the main body 10C includes a white cover 11C, a light source unit 12C, and a power source unit 13C. The white cover 11C is made of a milky white translucent resin and covers the light source unit 12C. The white cover 11C is in the form of a ring as viewed in plan and exposes part of the power source unit 13C at the center. The white cover 11C constitutes almost the entirety of the appearance of the LED lighting apparatus 101C.

The light source unit 12C includes a plurality of LED modules 121 and 122. Each LED module 121, 122 comprises an LED chip and sealing resin that seals the LED chip and designed to emit e.g. blue light. The sealing resin includes a fluorescent substance that emits yellow light when excited by light from the LED chip, so that the light emitted from each LED module 121, 122 looks white. The color temperature of the white light emitted from each LED module depends on the LED chip and the fluorescent substance in the sealing resin. The color temperature is an index indicating relative strength between a bluish purple ray and a red ray contained in light. A higher color temperature means that a larger amount of bluish purple rays are contained, whereas a lower color temperature means that a larger amount of red rays are contained. The LED modules 121 are configured to emit white light of the daylight white color having a color temperature of about 5000 K. The LED modules 122 are configured to emit white light of the incandescent color having a color temperature of about 3000 K. Though not illustrated, the light source unit 12C further includes an LED module that emits red light. This LED module is provided for use as a night light that is kept on when the LED modules 121 and 122 are put out.

The power source unit 13C converts e.g. AC 100V power supplied through a power supply portion provided in the ceiling to DC power suitable for lighting the LED chips and supplies the DC power to the LED modules 121, 122. As shown in FIG. 23, the power source unit 13C includes a control unit 14C, a receiver 15C and a reference time changer 16C.

The control unit 14C includes e.g. a capacitor, a resistor, a diode and an IC and controls electric power to be supplied to the LED modules 121, 122.

The receiver 15C includes e.g. an infrared sensor and receives a control signal from the remote controller 20C and sends the received signal to the control unit 14C.

As shown in FIG. 22, the reference time changer 16C is provided in the power source unit 13C at a portion exposed from the white cover 11C. In this embodiment, the reference time changer 16C includes five setting buttons 161. The five setting buttons 161 are used for changing the reference time used in the control performed in the control unit 14C. For instance, the five setting buttons 161 correspond to 0.75 sec., 1.25 sec., 1.75 sec., 2.25 sec. and 2.75 sec., respectively. For instance, when the setting button 161 corresponding to 0.75 sec. is pressed, the reference time to be used in the control performed in the control unit 14C is set to 0.75 sec.

The remote controller 20C corresponds to a remote controller in the variation of the present invention and includes a transmitting portion 21C, a power source button 22C, a night light button 23C, a plurality of operation buttons 24C, 25C, 26C, 27C, 28C. The transmitting portion 21C includes e.g. an LED chip that emits infrared and transmits a control signal to the receiver 15C when the power source button 22C, the night light button 23C and the operation buttons 24C, 25C, 26C, 27C, 28C are pressed. Described below is a control operation performed by the control unit 14C when the power source button 22C, the night light button 23C and the operation buttons 24C, 25C, 26C, 27C, 28C are pressed.

The power source button 22C is used to turn on or turn off the light. When the power source button 22C is pressed, the transmitting portion 21C transmits a control signal for instructing the turn-on or turn-off operation to the control unit 14C via the receiver 15C. In the case where the control signal is received when the light source unit 12C is off, the control unit 14C performs control to turn on the LED modules 121, 122 of the light source unit 12C. In the case where the control signal is received when the light source unit 12C is on, the control unit 14C performs control to turn off the LED modules 121, 122 of the light source unit 12C.

The night light button 23C is used to turn on or turn off the LED module of the night light. When the night light button 23C is pressed, the transmitting portion 21C transmits a control signal for instructing the turn-on or turn-off of the LED module of the night light to the control unit 14C via the receiver 15C. In the case where the control signal is received when the LED module of the night light is off, the control unit 14C performs control to turn on the LED module of the night light. In the case where the control signal is received when the LED module of the night light is on, the control unit 14C performs control to turn off the LED module of the night light.

The operation button 24C and the operation button 25C are brightness adjustment buttons used for adjusting the brightness of the light source unit 12C and operated when the light source unit 12C is on. For instance, the brightness of the light source unit 12C is adjusted at the control unit 14C by adjusting the electric power to be supplied to the LED modules 121, 122. The operation button 24C is used to increase the brightness of the light source unit 12C, whereas the operation button 25C is used to reduce the brightness of the light source unit 12C.

The control performed by the control unit 14 when the operation button 24C is pressed is described below with reference to FIG. 25.

When the operation button 24C is pressed, the transmitting portion 21C transmits a control signal, indicating that the operation button 24C is pressed, to the control unit 14C via the receiver 15C. Specifically, during when the light source unit 12C is on, the control unit 14C checks whether or not the control signal is received, in order to determine whether or not the operation button 24C is pressed (Step S01). When the control signal indicating that the operation button 24C is pressed is not received, the control unit 14C does not perform the control for increasing the brightness of the light source unit 12C.

Upon receiving the control signal indicating that the operation button 24C is pressed, the control unit 14C measures the time elapsed since the operation button 24C was pressed (Step S02), and compares the measured time with the reference time (Step S03). Specifically, the control unit 14C measures the time elapsed since it started to receive the control signal, to find out the pressing time of the operation button 24C. The control unit 14C performs different types of control, depending on whether or not the pressing time of the operation button 24C is longer than the reference time. As the reference time, the time selected by using the reference time changer 16C is used. In a default state, i.e., when the user has not operated the reference time changer 16C, the reference time is set to 1.25 sec.

In the case where the pressing time, i.e., the time period from when the operation button 24C was pressed till when the operation button 24C was released is shorter than the reference time, the control unit 14C determines that the operation button 24C was short-pressed (i.e., pressed only for a short period of time) (Step S04). Every time the operation button 24C is short-pressed, the control unit 14C performs control to increase the brightness of the light source unit 12C by one step. Specifically, the control unit 14C increases power supply to the LED modules 121, 122 by an amount corresponding to predetermined one step (Step S05). If the light source unit 12C is already in its brightest state, the control unit 14C performs control to maintain the brightest state.

In the case where the operation button 24C is kept pressed longer than the reference time, the control unit 14C determines that the operation button 24C is long-pressed (i.e., pressed for a long period of time) (Step S06). When the operation button 24C is long-pressed in this way, the control unit 14C performs control to continuously increase the brightness of the light source unit 12C. Specifically, the control unit 14C continues to increase the power to be supplied to the LED modules 121, 122 (Step S07) and stops the increasing of the power when the operation button 24C is released (S09). According to such control, change in the brightness of the light source unit 12C stops when the user stops pressing the operation button 24C. This ensures that the user can easily adjust the light source unit 12C to a desired brightness.

However, when the user is long-pressing the operation button 24C, the user's finger may unintentionally separate from the button 24C. In such a case, the brightness of the light source unit 12C may become different from the brightness which the user desired. Also, when the control signal is interrupted due to noise, the brightness of the light source unit 12C may become different from the brightness which the user desired. To prevent this, the control described below is performed in the present embodiment.

The determination that the long-pressing of the operation button 24C is finished is made by the control unit 14C only when the control signal indicating the pressing of the operation button 24C is interrupted for a time period longer than a predetermined determination period. For instance, the determination period is 0.1 sec. That is, once the operation button 24C is determined to be long-pressed, the determination by the control unit 14C that the long-pressing is finished is not performed immediately after the control signal indicating the pressing of the operation button 24C is interrupted. Specifically, after the control signal indicating the pressing of the operation button 24C is interrupted, the control unit 14C checks whether or not the control signal is received again within 0.1 sec. from the interruption (Step S08). In the case where the control signal is received within the determination period (e.g. 0.1 sec.), the control unit 14C determines that the operation button 24C is still long-pressed, and hence continues to increase the power to the LED modules 121, 122. On the other hand, in the case where the control signal is not received within the determination period (e.g. 0.1 sec.) from the interruption, the control unit 14C determines that the long-pressing is finished and hence stops the increasing of the power to the LED modules 121, 122 (Step S09).

When the operation button 25C is pressed, the transmitting portion 21C transmits a control signal, indicating that the operation button 25C is pressed, to the control unit 14C via the receiver 15C. Specifically, during when the light source unit 12C is on, the control unit 14C checks whether or not the control signal is received, in order to determine whether or not the operation button 25C is pressed. When the control signal indicating that the operation button 25C is pressed is not received, the control unit 14C does not perform the control for decreasing the brightness of the light source unit 12C.

Upon receiving the control signal indicating that the operation button 25C is pressed, the control unit 14C measures the time elapsed since the operation button 25C was pressed, and compares the measured time with the reference time. Specifically, the control unit 14C measures the time elapsed since it started to receive the control signal, to find out the pressing time of the operation button 25C. The control unit 14C performs different types of control, depending on whether or not the pressing time of the operation button 25C is longer than the reference time. Similarly to the control performed when the operation button 24C is pressed, the time selected by using the reference time changer 16C is used as the reference time. In a default state, i.e., when the user has not operated the reference time changer 16C, the reference time is set to 1.25 sec.

In the case where the pressing time, i.e., the time period from when the operation button 25C was pressed till when the operation button 25C was released is shorter than the reference time, the control unit 14C determines that the operation button 25C was short-pressed (i.e., pressed only for a short period of time). Every time the operation button 25C is short-pressed, the control unit 14C performs control to decrease the brightness of the light source unit 12C by one step. Specifically, the control unit 14C decreases power to be supplied to the LED modules 121, 122 by an amount corresponding to predetermined one step. If the light source unit 12C is in its darkest state, the control unit 14C performs control to maintain the darkest state.

In the case where the operation button 25C is kept pressed longer than the reference time, the control unit 14C determines that the operation button 25C is long-pressed (i.e., pressed for a long period of time). When the operation button 25C is long-pressed in this way, the control unit 14C performs control to continuously decrease the brightness of the light source unit 12C. Specifically, the control unit 14C continues to decrease the power to be supplied to the LED modules 121, 122 and stops the decreasing of the power supply when the operation button 25C is released. According to such control, change in the brightness of the light source unit 12C stops when the user stops pressing the operation button 25C. This ensures that the user can easily adjust the light source unit 12C to a desired brightness.

However, when the user is long-pressing the operation button 25C, the user's finger may unintentionally separate from the button 25C. In such a case, the brightness of the light source unit 12C may become different from the brightness which the user desired. Also, when the control signal is interrupted due to noise, the brightness of the light source unit 12C may become different from the brightness which the user desired. To prevent this, similarly to the control performed when the operation button 24C is pressed, the control described below is performed in the present embodiment.

The determination that the long-pressing of the operation button 25C is finished is made by the control unit 14C only when the control signal indicating the pressing of the operation button 25C is interrupted for a time period longer than a predetermined determination period. For instance, the determination period is 0.1 sec. That is, once the operation button 25C is determined to be long-pressed, the determination by the control unit 14C that the long-pressing is finished is not performed immediately alter the control signal indicating the pressing of the operation button 25C is interrupted. Specifically, after the control signal indicating the pressing of the operation button 25C is interrupted, the control unit 14C checks whether or not the control signal is received again within 0.1 sec. from the interruption. In the case where the control signal is received within the determination period (e.g. 0.1 sec.), the control unit 14C determines that the operation button 25C is still long-pressed, and hence continues to decrease the power to be supplied to the LED modules 121, 122. On the other hand, in the case where the control signal is not received within the determination period (e.g. 0.1 sec.) from the interruption, the control unit 14C determines that the long-pressing is finished and hence stops the decreasing of the power supply to the LED modules 121, 122.

The operation button 26C and the operation button 27C are color adjustment buttons used for adjusting the color of the light source unit 12C and operated when the light source unit 12C is on. The operation button 26C is used to enhance the daylight white color, whereas the operation button 27C is used to enhance the incandescent color. Such adjustment of the color of the light source unit 12C is performed at the control unit 14C by adjusting the ratio between the power supplied to the LED modules 121 and the power supplied to the LED modules 122.

When the operation button 26C is pressed, the transmitting portion 21C transmits a control signal, indicating that the operation button 26C is pressed, to the control unit 14C via the receiver 15C. Specifically, during when the light source unit 12C is on, the control unit 14C checks whether or not the control signal is received, in order to determine whether or not the operation button 26C is pressed. When the control signal indicating that the operation button 26C is pressed is not received, the control unit 14C does not perform the control for adjusting the color of the light source unit 12C.

Upon receiving the control signal indicating that the operation button 26C is pressed, the control unit 14C measures the time elapsed since the operation button 26C was pressed, and compares the measured time with the reference time. Specifically, the control unit 14C measures the time elapsed since it started to receive the control signal, to find out the pressing time of the operation button 26C. The control unit 14C performs different types of control, depending on whether or not the pressing time of the operation button 26C is longer than the reference time. Similarly to the control performed when the operation button 24C or 25C is pressed, the time selected by using the reference time changer 16C is used as the reference time. In a default state, i.e., when the user has not operated the reference time changer 16C, the reference time is set to 1.25 sec.

In the case where the pressing time, i.e., the time period from when the operation button 26C was pressed till when the operation button 26C was released is shorter than the reference time, the control unit 14C determines that the operation button 26C was short-pressed (i.e., pressed only for a short period of time). Every time the operation button 26C is short-pressed, the control unit 14C performs control to enhance the daylight white color of the light source unit 12C by one step. Specifically, the control unit 14C increases power to be supplied to the LED modules 121 by an amount corresponding to predetermined one step, while decreasing power to be supplied to the LED modules 122 by an amount corresponding to predetermined one step. By this control, the LED modules 121 of the daylight white color become brighter, whereas the LED modules 122 of the incandescent color become darker. As a result, the light source unit 12C shows an enhanced daylight color as compared with that before the control is performed.

In the case where the operation button 26C is kept pressed longer than the reference time, the control unit 14C determines that the operation button 26C is long-pressed (i.e., pressed for a long period of time). When the operation button 26C is long-pressed in this way, the control unit 14C performs control to continuously enhance the daylight white color of the light source unit 12C. Specifically, the control unit 14C continues to increase power to be supplied to the LED modules 121, while decreasing power to be supplied to the LED modules 122. By this control, the LED modules 121 of the daylight white color become gradually brighter, whereas the LED modules 122 of the incandescent color become gradually darker. As a result, the light source unit 12C shows a more enhanced daylight color than before the control is performed. This ensures that the user can easily adjust the light source unit 12C to a desired color.

However, when the user is long-pressing the operation button 26C, the user's finger may unintentionally separate from the button 26C. In such a case, the color of the light source unit 12C may become different from the color which the user desired. Also, when the control signal is interrupted due to noise, the color of the light source unit 12C may become different from the color which the user desired. To prevent this, similarly to the control performed when the operation button 24C or 25C is pressed, the determination that the long-pressing of the operation button 26C is finished is made by the control unit 14C only when the control signal indicating the pressing of the operation button 26C is interrupted for a time period longer than a predetermined determination period (e.g. 0.1 sec.).

When the operation button 27C is pressed, the transmitting portion 21C transmits a control signal, indicating that the operation button 27C is pressed, to the control unit 14C via the receiver 15C. Specifically, during when the light source unit 12C is on, the control unit 14C checks whether or not the control signal is received, in order to determine whether or not the operation button 27C is pressed. When the control signal indicating that the operation button 27C is pressed is not received, the control unit 14C does not perform the control for adjusting the color of the light source unit 12C.

Upon receiving the control signal indicating that the operation button 27C is pressed, the control unit 14C measures the time elapsed since the operation button 27C was pressed, and compares the measured time with the reference time. Specifically, the control unit 14C measures the time elapsed since it started to receive the control signal, to find out the pressing time of the operation button 270. The control unit 14C performs different types of control, depending on whether or not the pressing time of the operation button 27C is longer than the reference time. Similarly to the control performed when the operation button 240, 250 or 260 is pressed, the time selected by using the reference time changer 160 is used as the reference time. In a default state, i.e., when the user has not operated the reference time changer 160, the reference time is set to 1.25 sec.

In the case where the pressing time, i.e., the time period from when the operation button 270 was pressed till when the operation button 270 was released is shorter than the reference time, the control unit 14C determines that the operation button 27C was short-pressed (i.e., pressed only for a short period of time). Every time the operation button 27C is short-pressed, the control unit 140 performs control to enhance the incandescent color of the light source unit 12C by one step. Specifically, the control unit 14C increases power to be supplied to the LED modules 122 by an amount corresponding to predetermined one step, while decreasing power supply to the LED modules 121 by an amount corresponding to predetermined one step. By this control, the LED modules 122 of the incandescent color become brighter, whereas the LED modules 121 of the daylight white color become darker. As a result, the light source unit 120 shows an enhanced incandescent color as compared with that before the control is performed.

In the case where the operation button 27C is kept pressed longer than the reference time, the control unit 140 determines that the operation button 270 is long-pressed (i.e., pressed for a long period of time). When the operation button 27C is long-pressed in this way, the control unit 14C performs control to continuously enhance the incandescent color of the light source unit 12C. Specifically, the control unit 14C continues to increase power to be supplied to the LED modules 122, while decreasing power supply to the LED modules 121. By this control, the LED modules 122 of the incandescent color become gradually brighter, whereas the LED modules 121 of the daylight white color become gradually darker. As a result, the light source unit 12C shows an enhanced incandescent color as compared with that before the control is performed. This ensures that the user can easily adjust the light source unit 12C to a desired color.

However, when the user is long-pressing the operation button 27C, the user's finger may unintentionally separate from the button 27C. In such a case, the color of the light source unit 12C may become different from the color which the user desired. Also, when the control signal is interrupted due to noise, the color of the light source unit 12C may become different from the color which the user desired. To prevent this, similarly to the control performed when the operation button 24C or 25C is pressed, the determination that the long-pressing of the operation button 27C is finished is made by the control unit 14C only when the control signal indicating the pressing of the operation button 27C is interrupted for a time period longer than a predetermined determination period (e.g. 0.1 sec.).

The operation button 28C is a memory button used to store the control state for the light source unit 12C and to reproduce the stored control state. When the operation button 28C is pressed, the transmitting portion 21C transmits a control signal, indicating that the operation button 28C is pressed, to the control unit 14C via the receiver 15C. Specifically, the control unit 14C checks whether or not the control signal indicating that the operation button 28C is pressed is received, in order to determine whether or not the operation button 28C is pressed.

Upon receiving the control signal indicating that the operation button 28C is pressed, the control unit 14C measures the time elapsed since the operation button 28C was pressed, and compares the measured time with the reference time. Specifically, the control unit 14C measures the time elapsed since it started to receive the control signal, to find out the pressing time of the operation button 28C. The control unit 14C performs different types of control, depending on whether or not the pressing time of the operation button 28C is longer than the reference time. Similarly to the control performed when the operation button 24C, 25C, 26C or 27C is pressed, the time selected by using the reference time changer 16C is used as the reference time. In a default state, i.e., when the user has not operated the reference time changer 16C, the reference time is set to 1.25 sec.

In the case where the operation button 28C is kept pressed longer than the reference time, the control unit 14C determines that the operation button 28C is long-pressed (i.e., pressed for a long period of time). In this case, the control unit 14C stores the state of control with respect to the light source unit 12C. Specifically, the control unit 14C stores the ratio between the power supplied to the LED modules 121 and the power supplied to the LED modules 122, and the respective intensities.

In the case where the pressing time, i.e., the time period from when the operation button 28C was pressed till when the operation button 28C was released is shorter than the reference time, the control unit 14C determines that the operation button 28C was short-pressed (i.e., pressed only for a short period of time). In this case, the control unit 14C reproduces the control state stored when the operation button 28C is long-pressed. Specifically, power is supplied to the LED modules 121 at the ratio and intensity stored when the operation button 28O is long-pressed.

The remote controller 20 may have a timer function. Specifically, the remote controller 20 may be provided with a liquid crystal display for showing the time, and an operation button for carrying out the timer function. For instance, by operating this operation button, the user can set the time when the light source unit 12C turns off. For instance, the time shown on the display changes by minutes when this operation button is long-pressed in a manner similar to the long-pressing of the operation buttons 240-280, and changes by hours when this operation button is short-pressed in a manner similar to the short-pressing of the operation buttons 24C-28C. By using the timer function, the user can set such that the light source unit 12C automatically turns off at the desired time.

The operation and advantages of the LED lighting apparatus 101C are described below.

In the LED lighting apparatus 101C, the control performed by the control unit 14C differs between when the operation button 24C-28C is long-pressed and when the operation button 24C-28C is short-pressed. The control unit 14C determines whether operation button 24C-28C is long-pressed or short-pressed by using the reference time. However, since the sense of time is different from person to person, it is possible that the actual pressing time of the operation button is shorter than the reference time set as a default although the user thinks that they have long-pressed the operation button. It is also possible that the actual pressing time of the operation button is longer than the reference time set as a default although the user thinks that they have short-pressed the operation button. To avoid such problems, the lighting apparatus in the present embodiment is configured such that the reference time can be selected from five choices by using the reference time changer 16C.

For instance, if a user often ends up short-pressing the operation button though having intended to long-press the operation button, the reference time set as a default is too long for the user. In such a case, inconveniences can be avoided by changing the reference time of 1.25 sec. set as a default to a shorter reference time of 0.75 sec.

For instance, if a user often ends up long-pressing the operation button though having intended to short-press the operation button, the reference time set as a default is too short for the user. In such a case, inconveniences can be avoided by changing the reference time of 1.25 sec. set as a default to a longer reference time of 1.75 sec., 2.25 sec. or 2.75 sec. Such a selectable reference time allows the user to operate the LED lighting apparatus 101C as desired.

The LED lighting apparatus according to the variation of the invention is not limited to the foregoing embodiment. The specific structure of each part of the LED lighting apparatus according to the variation of the invention may be varied in design in many ways. For instance, although the reference time changer 16C is provided in the main body 10C in the above-described embodiment, the reference time changer 16C may be provided in the remote controller 20. Although the reference time changer 16C in the foregoing embodiment is made up of five buttons, the reference time changer may be designed such that the reference time changes by turning a knob.

In the foregoing embodiment, control unit 14C determines that the operation button 24C-28C has continuously been pressed when a control signal indicating that the operation button 24C-28C is pressed is received within a predetermined determination period of 0.1 sec. from the interruption of the control signal. However, such a determination period is not limited to 0.1 sec. and may be other values.

Although the LED module 121, 122 in the foregoing embodiment comprises a blue LED chip and a sealing resin containing a fluorescent substance that emits yellow light, an LED chip of other colors may be used. As the fluorescent substance, mixture of a fluorescent substance that emits red light and a fluorescent substance that emits green light may be used instead of a fluorescent substance that emits yellow light.

In the foregoing embodiment, the light source unit 12C includes two kinds of LED modules 121 and 122 which emit white light of different color temperatures, and the color of the light source unit 12C is adjusted by adjusting the intensity of the light emitted from each kind of the LED modules. However, the method of color adjustment is not limited to this. For instance, light source unit 12C may include three kinds of LED modules that emits red light, blue light and green light, respectively and color adjustment may be performed by adjusting the intensity of the light emitted from each of the three kinds of LED modules.

The feature of the present variation of the invention is described below as Appendixes.

Appendix 1

An LED lighting apparatus comprising:

a light source unit including at least one LED chip;

a remote controller including one or a plurality of operation button; and a control unit that performs different kinds of control between when the operation button is pressed longer than a predetermined reference time and when the operation button is pressed shorter than the reference time, wherein the LED lighting apparatus further comprises a reference time changer for changing the reference time.

Appendix 2

The LED lighting apparatus as set forth in Appendix 1, wherein:

the remote controller includes a transmitting portion for transmitting a control signal;

the lighting apparatus further comprises a main body in which the light source unit is provided and which is to be fixed to a ceiling;

the main body includes a power source unit for supplying power to the light source unit; and the power source unit includes the control unit and a receiver for receiving a signal from the remote controller.

Appendix 3

The LED lighting apparatus as set forth in Appendix 2, wherein the reference time changer is provided in the power source unit.

Appendix 4

The LED lighting apparatus as set forth in Appendix 2 or 3, wherein:

when the operation button is pressed, the transmitting portion transmits to the receiver a control signal indicating that the operation button is pressed; and the control unit measures the time elapsed since the operation button was pressed and compares the measured time with the reference time.

Appendix 5

The LED lighting apparatus as set forth in Appendix 4, wherein the control unit determines that the operation button is short-pressed in the case where the time period from when the operation button was pressed till when the operation button was released is shorter than the reference time, and determines that the operation button is long-pressed in the case where the operation button is kept pressed longer than the reference time.

Appendix 6

The LED lighting apparatus as set forth in Appendix wherein:

the plurality of operation buttons include a brightness adjustment button for adjusting brightness of the light source unit; and the control unit adjusts the brightness of the light source unit by one step when the brightness adjustment button is short-pressed and continuously adjusts the brightness of the light source unit when the brightness adjustment button is long-pressed.

Appendix 7

The LED lighting apparatus as set forth in Appendix 6, wherein the control unit increases power to be supplied to the light source unit by one step when the brightness adjustment button is short-pressed and continuously increases power to be supplied to the light source unit when the brightness adjustment button is long-pressed.

Appendix 8

The LED lighting apparatus as set forth in Appendix 7, wherein determination that long-pressing of the brightness adjustment button is finished is made by the control unit when the control signal indicating that the brightness adjustment button is pressed is interrupted for a period longer than a predetermined determination period.

Appendix 9

The LED lighting apparatus as set forth in Appendix 7 or 8, wherein:

the plurality of operation buttons include an additional brightness adjustment button for adjusting the brightness of the light source unit; and the control unit decreases power to be supplied to the light source unit by one step when the additional brightness adjustment button is short-pressed and continuously decreases power to be supplied to the light source unit when the additional brightness adjustment button is long-pressed.

Appendix 10

The LED lighting apparatus as set forth in Appendix 9, wherein determination that long-pressing of the additional brightness adjustment button is finished is made by the control unit when the control signal indicating that the additional brightness adjustment button is pressed is interrupted for a period longer than a predetermined determination period.

Appendix 11

The LED lighting apparatus as set forth in any one of Appendixes 5-10, wherein:

the plurality of operation buttons include a color adjustment button for adjusting color of the light source unit; and the control unit adjusts the color of the light source unit by one step when the color adjustment button is short-pressed and continuously adjusts the color of the light source unit when the color adjustment button is long-pressed.

Appendix 12

The LED lighting apparatus as set forth in Appendix 11, wherein:

the light source unit includes a first LED module and a second LED module, the first LED module including a first LED chip that is one of the plurality of LED chips and configured to emit light of a first color temperature, the second LED module including a second LED chip that is one of the plurality of LED chips and configured to emit light of a second color temperature;

when the color adjustment button is short-pressed, the control unit increases power to be supplied to the first LED module by one step and decreases power to be supplied to the second LED module by one step; and when the color adjustment button is long-pressed, the control unit continuously increases power to be supplied to the first LED module and continuously decreases power to be supplied to the second LED module.

Appendix 13

The LED lighting apparatus as set forth in Appendix 12, wherein determination that long-pressing of the color adjustment button is finished is made by the control unit when the control signal indicating that the color adjustment button is pressed is interrupted for a period longer than a predetermined determination period.

Appendix 14

The LED lighting apparatus as set forth in Appendix 12 or 13, wherein:

the plurality of operation buttons include an additional color adjustment button for adjusting the color of the light source unit; and when the additional color adjustment button is short-pressed, the control unit increases power to be supplied to the second LED module by one step and decreases power to be supplied to the first LED module by one step; and when the additional color adjustment button is long-pressed, the control unit continuously increases power to be supplied to the second LED module and continuously decreases power to be supplied to the first LED module.

Appendix 15

The LED lighting apparatus as set forth in Appendix 14, wherein determination that long-pressing of the additional color adjustment button is finished is made by the control unit when the control signal indicating that the additional color adjustment button is pressed is interrupted for a period longer than a predetermined determination period.

Appendix 16

The LED lighting apparatus as set forth in any one of Appendixes 5-15, wherein:

the plurality of operation buttons include a memory button used for storing and reproducing state of control; and the control unit stores state of control when the memory button is long-pressed and reproduces the stored state of control when the memory button is short-pressed.

Appendix 17

The LED lighting apparatus as set forth in any one of Appendixes 1-16, wherein the reference time changer includes a plurality of setting buttons corresponding to a plurality of different reference times.

1D Embodiment

Figure 27:
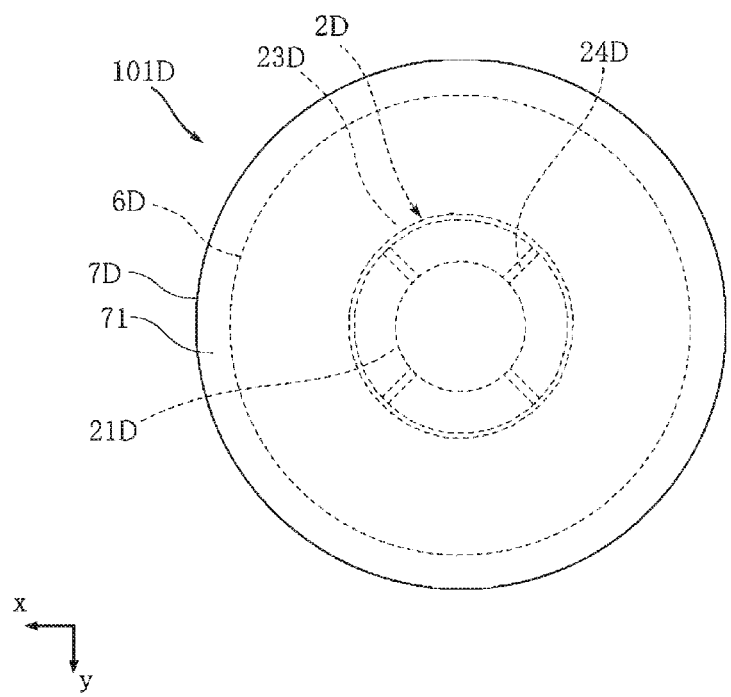
FIG. 27 is a plan view showing an LED lighting apparatus of 1D embodiment according to a variation of the present invention.
Figure 28:
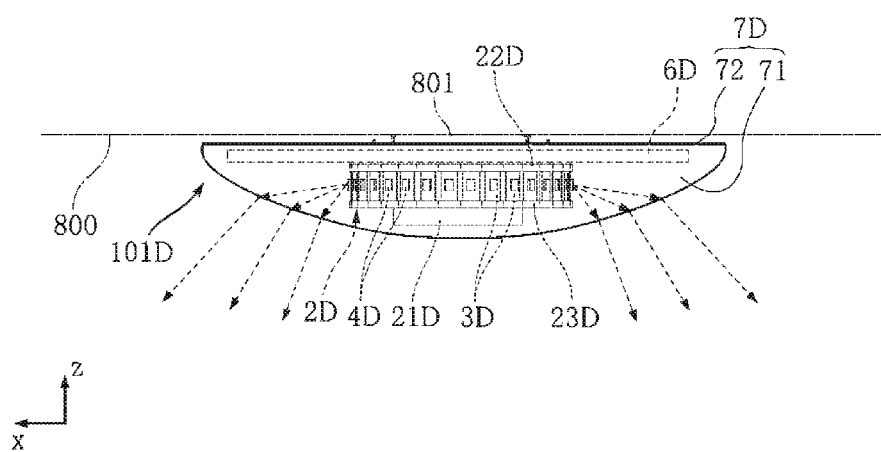
FIG. 28 is a side view of the LED lighting apparatus shown in FIG. 27.
Figure 29:
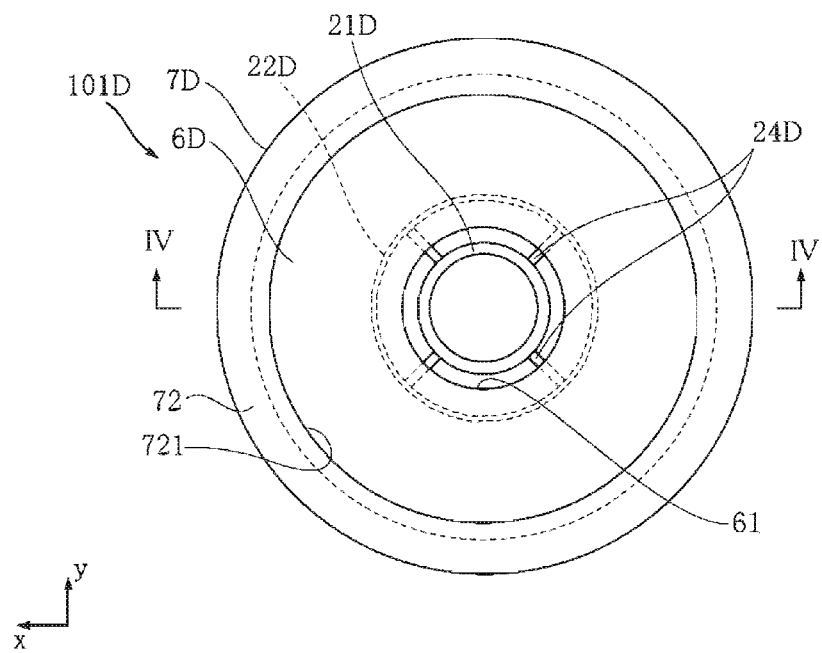
FIG. 29 is a bottom view of the LED lighting apparatus shown in FIG. 27.
Figure 30:
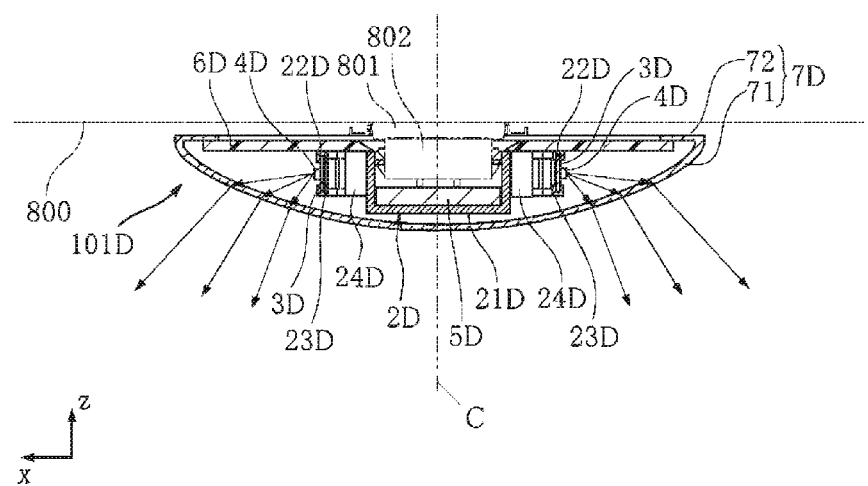
FIG. 30 is a sectional view taken along lines IV-IV in FIG. 29.

FIGS. 27-36 show an example of LED lighting apparatus according to a variation of the present invention. The LED lighting apparatus 101D of the present embodiment includes a support unit 2D, a plurality of substrates 3D, a plurality of LED modules 4D, a power source unit 5D, a diffusion reflection plate 6D, a light-transmitting cover 7D. The LED lighting apparatus 101D is configured to be attached to e.g. a power supply portion 801 in a ceiling 800 via an attachment 802 for use as a ceiling light. The direction z shown in FIG. 28 is the direction from the floor toward the ceiling and corresponds to the axial direction in this variation of the present invention. The lower side in the direction z in FIG. 28 is the illumination side, whereas the upper side in the direction z in the figure is the installation side. As shown in FIG. 27, the direction x and the direction y are perpendicular to each other and also perpendicular to the direction z. As shown in FIG. 27, the LED lighting apparatus 101 is circular as viewed in the direction z. The direction perpendicular to the direction z and along the diameter of the LED lighting apparatus 101D is defined as the radial direction. In the cross section shown in FIG. 30, the radial direction is along the direction x. In FIG. 30, on the left side, in the direction x, of the center line C indicated as a double-dashed line, "leftward" in the figure corresponds to "outward" in the radial direction. On the right side of the center line C in the direction x, "rightward" in the figure corresponds to "outward" in the radial direction.

The support unit 2D is made of e.g. metal and in the form of a ring having a central axis extending in the direction z, and constitutes the support structure of the LED lighting apparatus 101D. As shown in FIGS. 29 and 30, the support unit 2D includes a cylindrical center portion 21D, an installation-side support member 22D and an illumination-side support member 23D each of which is in the form of a frame surrounding the center portion 21D, and connection portions 24D extending radially outward from the center portion 21D. As shown in FIG. 30, the center portion 21D is configured to receive the attachment 802 when the LED lighting apparatus 101D is fixed to the ceiling 80. The power source unit 5D is accommodated in the lower portion of the center portion 1D in the direction z in FIG. 30. The connection portions 24D connect the center portion 21D to the installation-side support member 22D and the illumination-side support member 23D.

Figure 31:
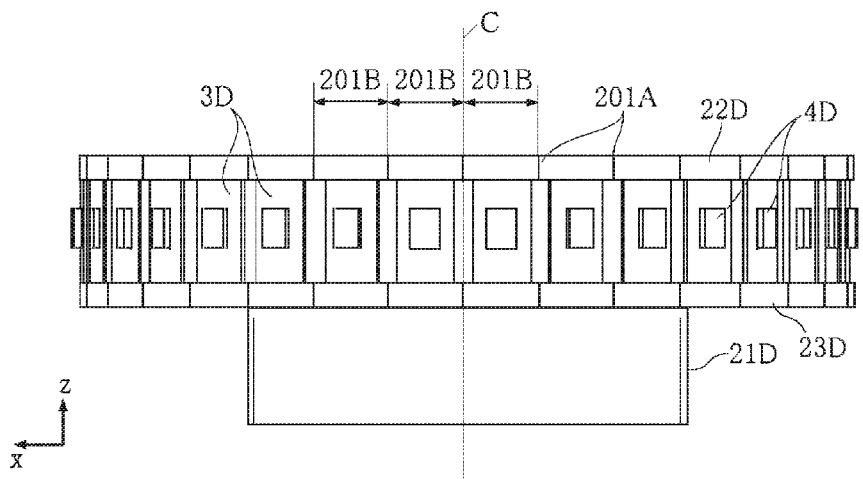
FIG. 31 is an enlarged side view of the support unit shown in FIG. 30.
Figure 32:
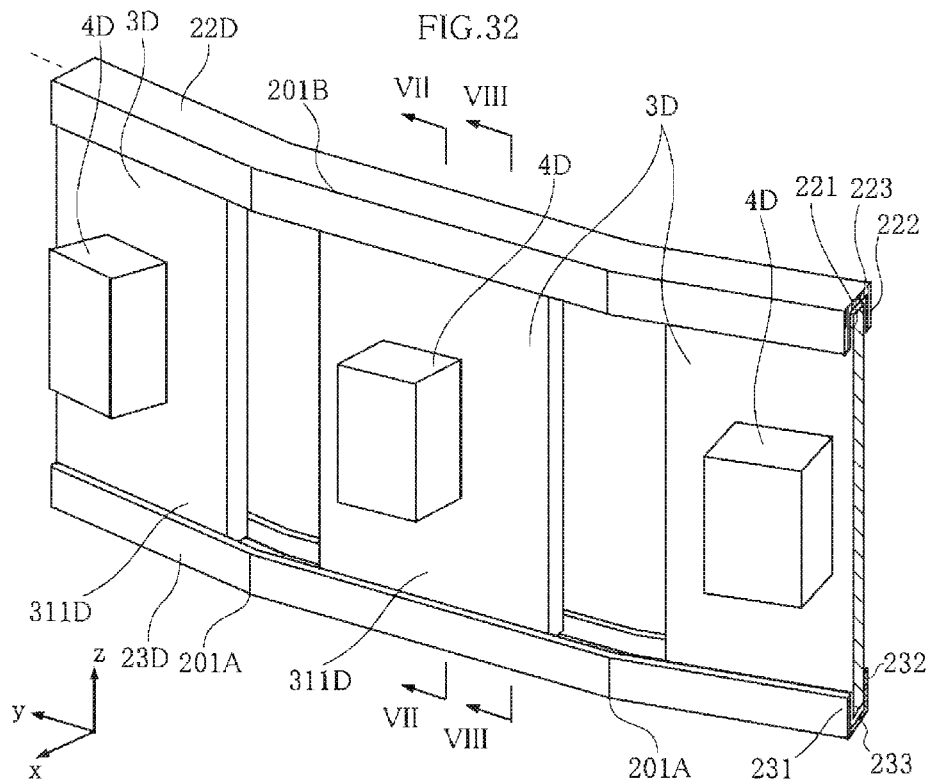
FIG. 32 is an enlarged perspective view showing a principal portion of the support unit shown in FIG. 31.

The outer contours of the installation-side support member 22D and the illumination-side support member 23D in the radial direction define the outer contour of the support unit 2D in the radial direction, which is in the form of a polygon with 32 sides as viewed in the direction z. FIG. 31 shows the support unit 2D as enlarged. The support unit 2D includes 32 bends 201A corresponding to the 32 angles of the polygon forming the outer contour, and 32 straight portions 201B corresponding to the 32 sides of the polygon. The installation-side support member 22D and the illumination-side support member 23D are 32 times symmetrical around the central axis C. FIG. 32 shows one of the straight portions 201B sandwiched between a pair of bends 201A in the direction y as enlarged. In FIGS. 31 and 32, detailed illustration of the LED module 4D is omitted. As shown in FIG. 32, the straight portion 201A adjoins other straight portions 201B via the paired bends 201A. The straight portion 201B shown in FIG. 32 is described below. Since other straight portions 201B have rotational symmetry with respect to the straight portion 201B illustrated in FIG. 32, description as to other straight portions is omitted.

Figure 33:
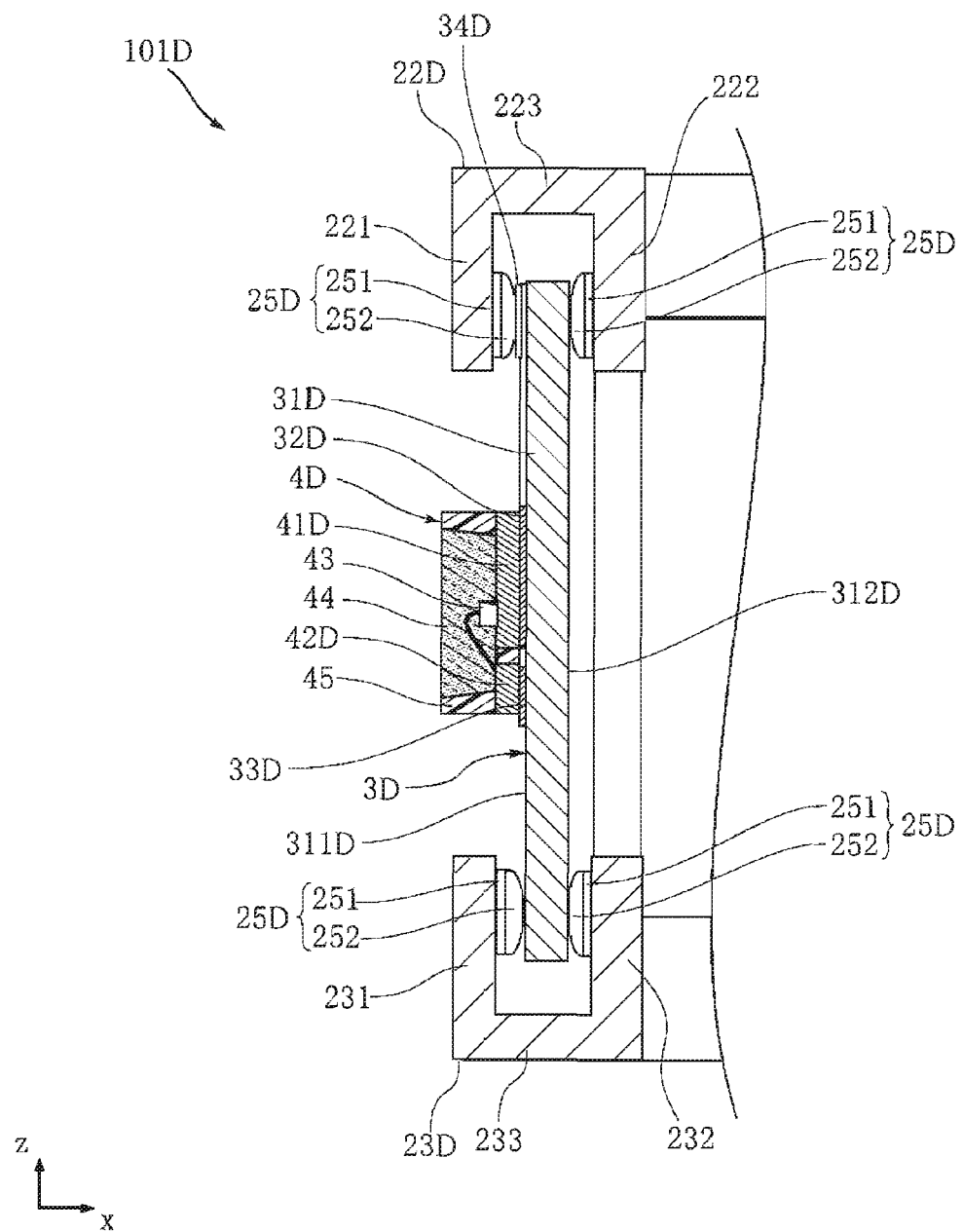
FIG. 33 is a sectional view taken along lines VII-VII in FIG. 32.

As shown in FIG. 32, the installation-side support member 22D is on the upper side with respect to the illumination-side support member 23D in the direction z. As shown in FIG. 33, the installation-side support member 22D includes a pair of installation-side side plates 221, 222 spaced from each other in the direction x with the substrate 3D intervening therebetween, and an installation-side bottom plate 223. The installation-side button plate 223 connects respective upper ends in the direction z of the paired installation-side side plates 221, 222 to each other. As shown in FIG. 33, the illumination-side support member 23D includes a pair of illumination-side side plates 231, 232 spaced from each other in the direction x with the substrate 3D intervening therebetween, and an illumination-side bottom plate 233. The illumination-side button plate 233 connects respective lower ends in the direction z of the paired illumination-side side plates 231, 232 to each other.

Figure 34:
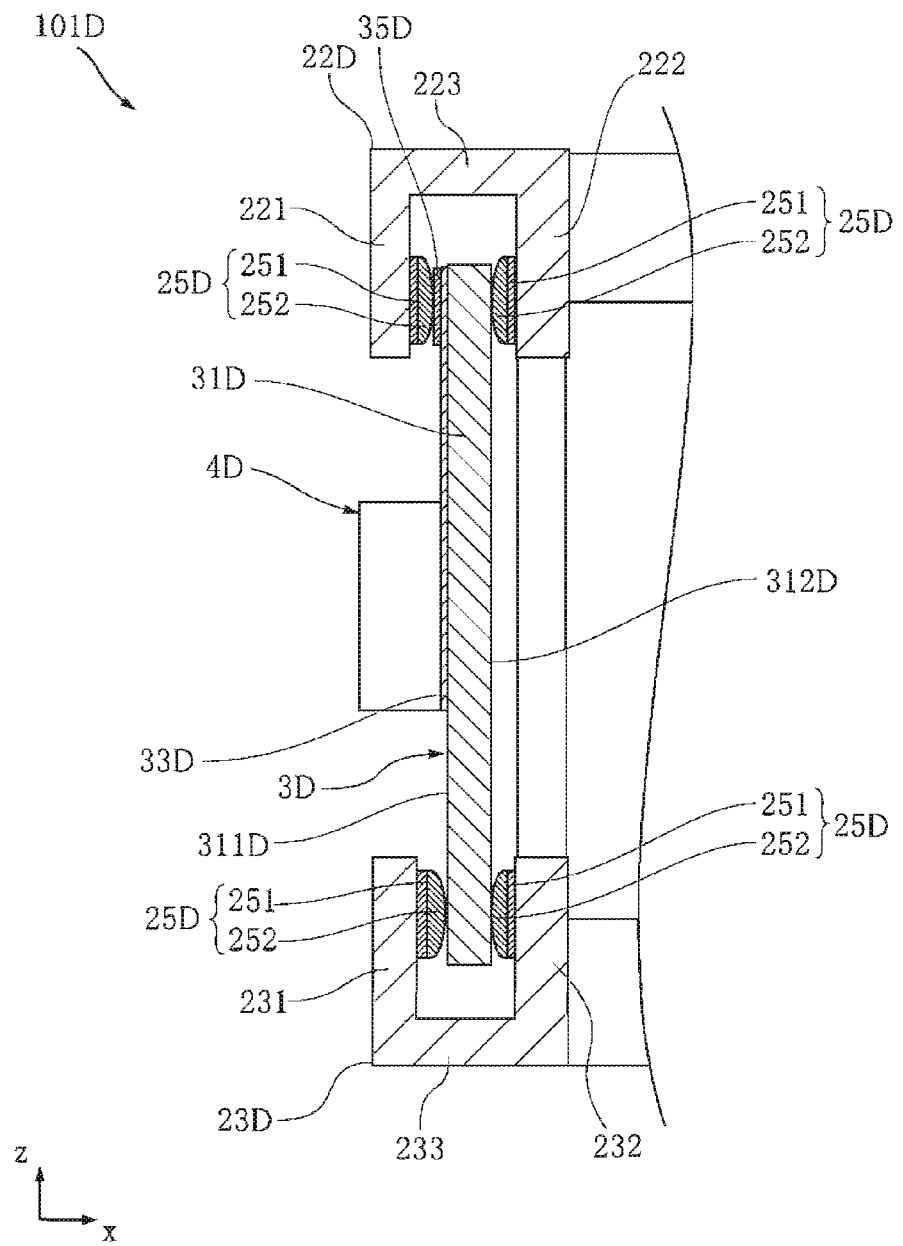
FIG. 34 is a sectional view taken along lines VIII-VIII in FIG. 32.
Figure 35:
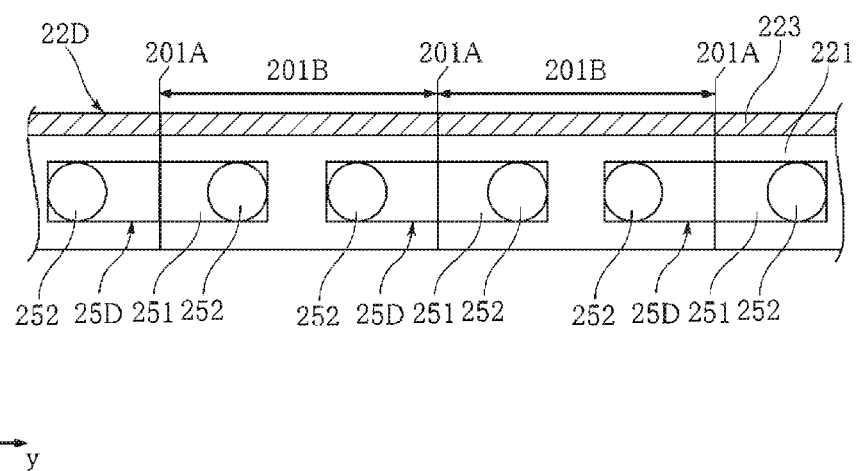
FIG. 35 is a view for describing the conduction portion shown in 33.

As shown in FIG. 34, the support unit 2D further includes a plurality of conduction portions 25D. The conduction portions 25D are provided at mutually facing surfaces of the paired installation-side side plate 221, 222 and at mutually facing surfaces of the paired illumination-side side plates 231, 232. FIG. 35 shows three conduction portion 25D provided on the installation-side side plate 221. As shown in FIGS. 34 and 35, each conduction portion 25D comprises a plate portion 251 and a pair of bulging portions 252. The plate portion 251 is made of e.g. copper and formed to cross over the bend 201A. The paired bulging portions 252 are made of e.g. silver and spaced from each other across the bend 201A. As shown in FIG. 35, the conduction portions 25D are provided at respective bends 201A and spaced from each other.

Figure 36:
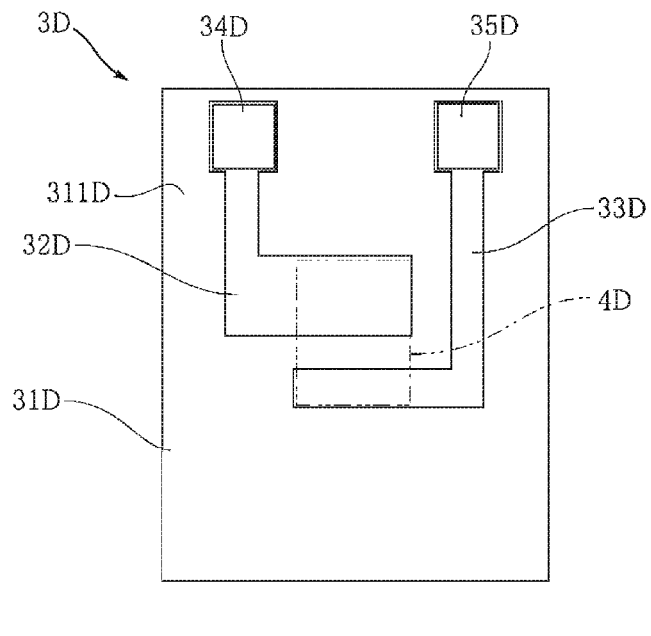
FIG. 36 is a view for describing the substrate shown in FIG. 32.

As shown in FIG. 31, each of the substrates 3D is supported on a respective one of the straight portions 201B. Thus, the plurality of substrates 3D form a ring-like shape having a central axis extending in the direction z. As shown in FIGS. 33 and 34, each of the substrates 3D is sandwiched between the installation side bottom plate 223 and the illumination-side bottom plate 233 in the direction z. The upper end in the direction z in FIG. 33 of each substrate 3D is sandwiched and fixed between the conduction portion 25D on the installation-side side plate 221 and the conduction portion 25D on the installation-side side plate 222. The lower and in the direction z in FIG. 33 of each substrate 3D is sandwiched and fixed between the conduction portion 25D on the illumination-side side plate 231 and the conduction portion 25D on the illumination-side side plate 232. The plurality of substrates 3D, which are mounted at different positions, have the same structure. FIG. 36 shows the substrate 3D supported on the straight portion 201B positioned at the center in FIG. 32. This substrate 3D is described below.

As shown in FIG. 36, the substrate 3D is rectangular as viewed in the direction x and includes a substrate body 31D, metal wirings 32D, 33D formed on the substrate body 31D, and pads 34D and 35D spaced from each other. The substrate body 31D is in the form of a plate made of an insulating material. Suitable materials for the substrate body 31D include glass-fiber-reinforced epoxy resin and ceramic material. The substrate body 31D includes a support surface 311D and a bottom surface 312D facing away from each other in the radial direction. The metal wirings 32D, 33D are made of e.g. copper and spaced from each other. The pads 34D, 35D are arranged adjacent to the upper end in FIG. 36 as spaced from each other in the direction y. The pads 34D, 35D are made of e.g. metal and in the form of a film. The pad 34D is formed on the metal wiring 32D, whereas the pad 35D is formed on the metal wiring 33D.

In the present embodiment, the dimension of the straight portion 201B in the circumferential direction is shorter than twice the dimension of the substrate 3D in the circumferential direction. That is, for each straight portion 201B, the size that allows support of a single substrate 3D is sufficient.

In the present embodiment, each substrate 3D is arranged such that its support surface 311D faces outward in the radial direction. For instance, of the three substrates 3D shown in FIG. 32, the substrate 3D in the middle is arranged such that the support surface 311D is perpendicular to the direction x. Of the three substrates 3D shown in FIG. 32, the substrate 3D on the left in the figure is arranged such that the support surface 311D is perpendicular to the direction inclined 11.25° with respect to the direction x.

Each substrate 3D is attached to the support unit 2D by e.g. pushing one of the ends spaced in the longitudinal direction of the substrate 3D into the space between the paired installation-side side plates 221 and 222 and then pushing the other end of the substrate 3D into the space between the illumination-side side plates 231 and 232.

The substrate 3D is arranged in each straight portion 201B such that the pad 34D is electrically connected to one of the paired bulging portions 252. The pad 35D of each substrate 3D is connected to one of the paired bulging portions 252 of the conduction portion 25D different from the conduction portion 25D to which the pad 34D is electrically connected. In other words, the pad 34D of one of two adjacent substrates 3D and the pad 35D of the other one of the two adjacent substrate 3D are electrically connected to the same conduction portion 25D. The pads 34D, 35D on the 32 substrates 3D form a single electric circuit via the conduction portion 25D provided on each bend 201A.

As shown in FIG. 31, an LED module 4D is provided on each substrate 3D. The LED modules 4D, which differ from each other in orientation, have the same structure. The LED module 4D shown in FIG. 33 is described below.

As shown in FIG. 32, the LED module 4D is supported on the support surface 311D. The LED module 4D is in the form of an elongated rectangle as viewed in the direction x. As shown in FIG. 33, the LED module 4D includes a pair of leads 41D, 42D, an LED chip 43, a sealing resin 44, and a case 45. The paired leads 41D, 42D are made of e.g. Cu alloy and spaced from each other. The LED chip 43 is mounted on the lead 41D. Of the lead 41D, the surface that is opposite from the surface on which the LED chip 43 is mounted is electrically connected to the metal wiring 32D. The lead 42D is connected to the LED chip 43 with a wire. The surface of the lead 42D that is opposite from the surface connected to the wire is electrically connected to the metal wiring 33D. The LED chip 43 is the light source of the LED module 4D and designed to emit e.g. blue light. The sealing resin 44 is provided to protect LED chip 4. The sealing resin 44 is made of a light-transmitting resin material containing a fluorescent substance that emits yellow light when excited by light from the LED chip 43. According to this structure, the LED module 4D can be configured to emit light of a desired color temperature. Instead of the fluorescent substance that emits yellow light, mixture of a fluorescent substance that emits red light and a fluorescent substance that emits green light may be used. The case 45 is made of e.g. white resin and reflects the light traveling upward and downward in FIG. 33 toward the left in the figure. An LED of a type that uses two wires for connection to the paired leads 41D, 42D may be employed as the LED chip 43.

The power source unit 5D converts e.g. AC 100 V power supplied through the power supply portion 801 in the ceiling 800 to DC power suitable for lighting the LED chips 43 and supplies the DC power to the LED modules 4D. The power source unit 5D includes e.g. a transformer, a capacitor, a resistor, a diode and an IC.

The diffusion reflection plate 6D is made of e.g. a white resin material that reflects light from the LED modules 4D and arranged on the installation side of the support unit 2D in the direction z. As shown in FIG. 27, the outer contour of the diffusion reflection plate 6D is circular as viewed in the direction z. The diameter of this circle is smaller than the diameter of the circle defining the outer contour of the LED lighting apparatus 101D. As shown in FIG. 29, the diffusion reflection plate 6D has a circular opening 61 at the center. The opening 61 exposes the attachment 802 to the installation side.

The light-transmitting cover 7D constitutes most of the appearance of the LED lighting apparatus 101D and is made of e.g. milky-white translucent resin. The light-transmitting cover 7D includes an illumination-side covering portion 71, and an installation-side covering portion 72 which is on the installation side (upper side in FIG. 28) with respect to the illumination-side covering portion 71 in the direction z. As shown in FIG. 27, the illumination-side covering portion 71 is circular as viewed in the direction z. As shown in FIG. 30, the installation-side covering portion 72 extends from the outer edge of the illumination-side covering portion 71 inward in the radial direction. As shown in FIG. 29, the installation-side covering portion 72 is formed with a circular opening 721 at the center and in the form of a ring as viewed in the direction z. The installation-side covering portion 72 is positioned on the installation side (upper side in FIG. 30) with respect to the diffusion reflection plate 6D in the direction z.

As shown in FIG. 30, the illumination-side covering portion 71 is inclined to be closer to the ceiling 800 in the direction z as proceeding away from the center in the radial direction. The lower edge of the illumination-side covering portion 71 in the direction z is arranged on the illumination side (lower side in the figure) of the support unit 2D in the direction z. The illumination-side covering portion 71 is dome-shaped, and at least part of the illumination-side covering portion 71 overlaps the LED modules 4D as viewed in the radial direction. The diameter of the opening 721 is smaller than the diameter of the diffusion reflection plate 6D, and the diffusion reflection plate 6D is exposed through the opening 721.

The advantages of the LED lighting apparatus 101D are described below.

In the present embodiment, a plurality of substrates 3D are supported as sandwiched between the installation-side support member 22D and the illumination-side support member 23D which are spaced from each other in the direction z. The contour of the installation-side support member 22D and the contour of the illumination-side support member 23D are in the form of a polygon with 32 sides as viewed in the direction z, and the substrates 3D are arranged along the respective sides of the polygon. This arrangement allows the substrates 3D, which are rectangular, to be arranged evenly along the circumferential direction. Thus, the LED lighting apparatus 101D provides uniform light emission in the circumferential direction while using rectangular substrates 3D.

In the present embodiment, one substrate 3D is arranged on each of the straight portions 201B. This arrangement is desirable for making each straight portion 201B smaller. By making each straight portion 201B smaller, the number of the sides of the polygon forming the outer contour of the support unit 2D can be increased. By increasing the number of the sides of the polygon, the contour becomes closer to a circle, which allows more uniform light emission. Although the support unit 2D is in the form of a polygon with 32 sides in the present embodiment, this is merely an example. By making each substrate 3D smaller, the support unit 2D may be made in the form of a polygon with 64 sides, for example.

In the present embodiment, each substrate 3D is in the form of a relatively small rectangle. This is advantageous for cutting out substrates from a substrate material. When a single substrate 3D is small, a failure in a substrate, if exists, does not lead to disposal of a large amount of material, which is advantageous in terms of cost reduction.

In the present embodiment, a plurality of LED modules 4D are arranged such that each of the LED modules 40 emits light outward in the radial direction. As shown in FIG. 30, a milky-white light-transmitting cover 7D is arranged on the outer side of the LED modules 4D in the radial direction, so that the light from the LED modules 4D is scattered by the light-transmitting cover 7D before being emitted to the outside of the light-transmitting cover 7D. This light illuminates the area distant from the LED lighting apparatus 101D in the radial direction. Moreover, part of the light from the LED modules 4D is reflected by the diffusion reflection plate 6D to be directed toward the illumination side in the direction z and then emitted to the outside of the light-transmitting cover 7D. This light illuminates the area directly under the LED lighting apparatus 101D. Thus, the LED lighting apparatus 101D is suitable for uniformly illuminating the interior of a room.

Generally, in an LED lighting apparatus, LED modules as the point light sources tend to be conspicuous and look like a plurality of bright points. To solve such a problem, the LED lighting apparatus 101D according to the present embodiment is designed such that light from the LED modules 4D arranged around the support unit 2D is scattered by the milky-white light-transmitting cover 7D. Thus, when the LED lighting apparatus 101D is looked up from the floor-side, the LED lighting apparatus 101D looks as if the ring-shaped region of the light-transmitting cover 7D surrounding the support unit 2D is emitting light. In this way, in the LED lighting apparatus 101D, the individual LED modules 4D as the point light sources do not become too conspicuous.

Figure 37:
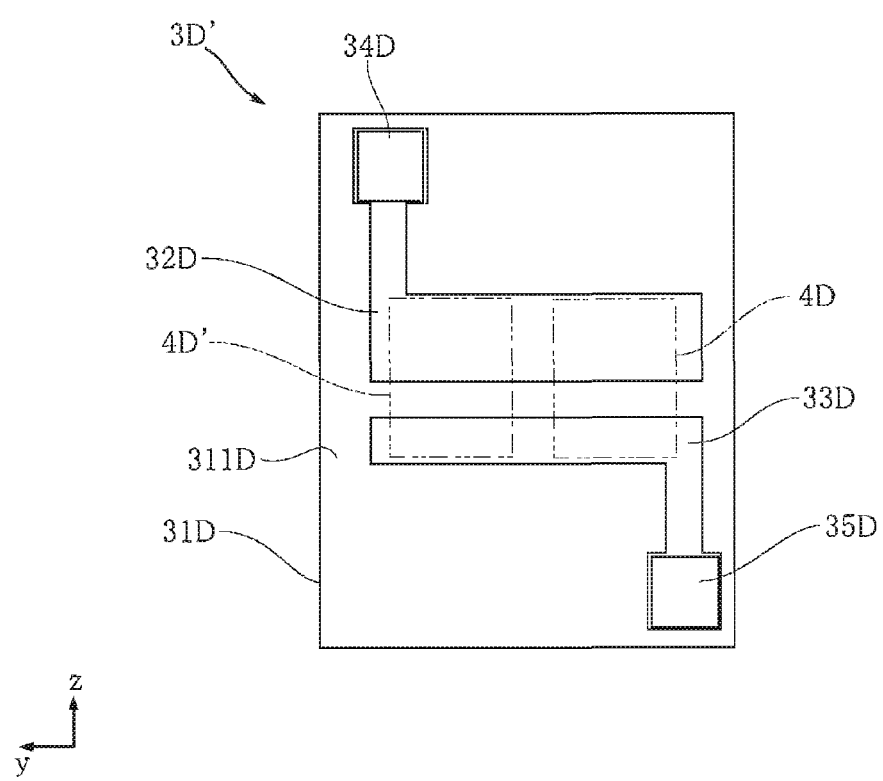
FIG. 37 is a view for describing a substrate different from that shown in FIG. 36.

Another preferred example of the substrate 3D is described below with reference to FIG. 37. In FIG. 37, the elements which are identical or similar to those of the substrate 3D shown in FIG. 36 are designated by the same reference signs as those used for the substrate 3D and the description is appropriately omitted.

In the substrate 3D' shown in FIG. 37, the pad 35D is arranged on the opposite side of the pad 34D in the direction z. When the substrate 3D' of this type is used, the pad 35D is electrically connected to the bulging portion 252 of the conduction portion 25D on the illumination-side side plate 231.

On the substrate 3D' are mounted an LED module 4D and an LED module 4D'. The LED module 4D' has basically the same structure as the LED module 4D. However, the sealing resin 44 of the LED module 4D' has a different composition from that of the sealing resin 44 of the LED module 4D. With this arrangement, the LED module 4D and the LED module 4D' emit light of different color temperatures. For instance, the LED module 4D may be designed to emit light of an incandescent color, whereas the LED module 4D' may be designed to emit light of a daylight white color.

When this substrate 3D' is used, to light the LED modules 4D, the substrates 3D' on adjacent two straight portions 201B need to be arranged in opposite orientations. For instance, when one of the substrates 3D' is arranged such that the pad 34D is on the installation side in the direction z, the other substrate 3D' needs to be arranged such that the pad 34D is on the illumination side in the direction z. By arranging the substrates 3D' alternately in opposite orientations, an electric circuit for lighting all the LED modules 4D is established.

Figure 38:
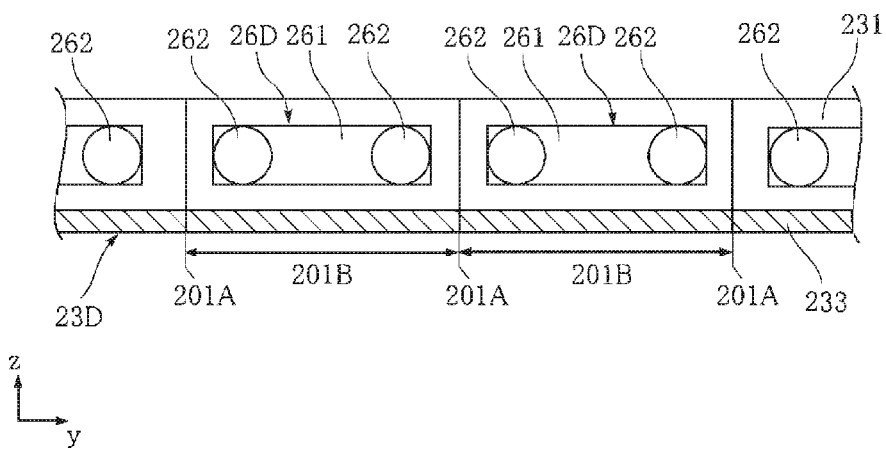
FIG. 38 is a view for describing a spacer that can be provided instead of the conduction portion shown in FIG. 33.
Figure 39:
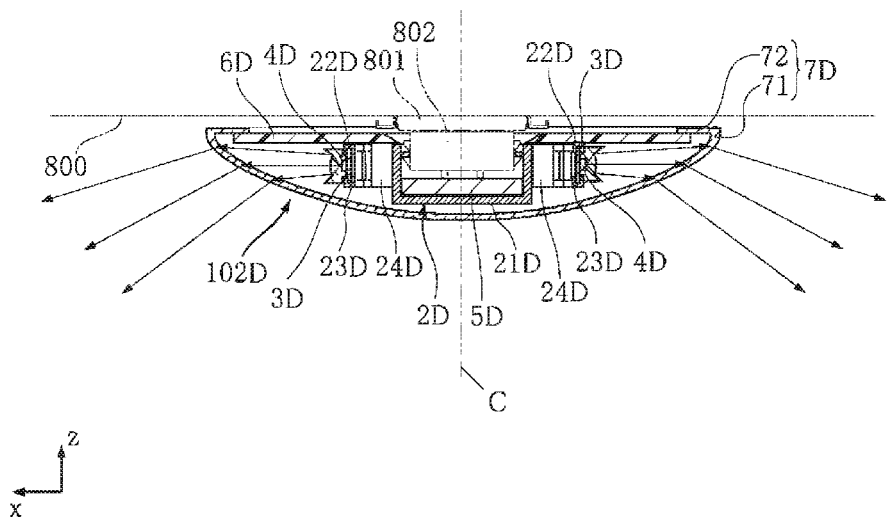
FIG. 39 is a sectional view showing an LED lighting apparatus of 2D embodiment according to a variation of the present invention.

In the present embodiment, conduction portions 25D are provided on both the installation-side side plate 221 and the illumination-side side plate 231 in order to allow the use of both types of substrates 3D and substrates 3D' shown in FIGS. 36 and 37. However, when only the substrates 3D are to be used, the conduction portion 25D extending over the bend 201A does not need to be provided on the illumination-side side plate 231. For instance, instead of the conduction portions, spacers 26D may be provided, as shown in FIG. 38. Each spacer 26D includes a plate portion 261 and a pair of bulging portions 262 provided on the plate portion 261. As shown in FIG. 38, the plate portion 261 is arranged at the center of the straight portion 201B. As compared with the plate portion 251 formed to extend over the bend 201A, the plate portion 261 is made easily. The bulging portion 262 may be formed by soldering, which is relatively inexpensive.

Conversely, conduction portions 25D may be provided on the illumination-side side plate 231, whereas spacers 26D may be provided on the installation-side side plate 221. In this case, the substrates 3D are arranged such that the pads 34D, 35D are arranged on the illumination side in the direction z, in a manner reverse to the arrangement shown in FIG. 36.

Moreover, in the present embodiment, conduction portions 25D are provided also on the installation-side side plate 222 and the illumination-side side plate 232, to adapt to the substrate 3D having pads 34D, 35D also on the bottom surface 312D side. However, when the substrate 3D does not have pads 34D, 35D on the bottom surface 312D side, conduction portions 25D do not need to be provided on the installation-side side plate 222 nor on the illumination-side side plate 232. These conduction portions can be replaced with the spacers 26D as shown in FIG. 38.

FIGS. 39-46 show other embodiments of this variation of the present invention. In these figures, the elements that are identical or similar to those of the foregoing embodiments are designated by the same reference signs as those used for the foregoing embodiment.

2D Embodiment

FIGS. 39-42 show an LED lighting apparatus according to 2D embodiment of the variation of the present invention. The LED lighting apparatus 102D shown in FIGS. 39-42 includes a plurality of light-transmitting member 46. Other structures are the same as the LED lighting apparatus 101D.

Figure 40:
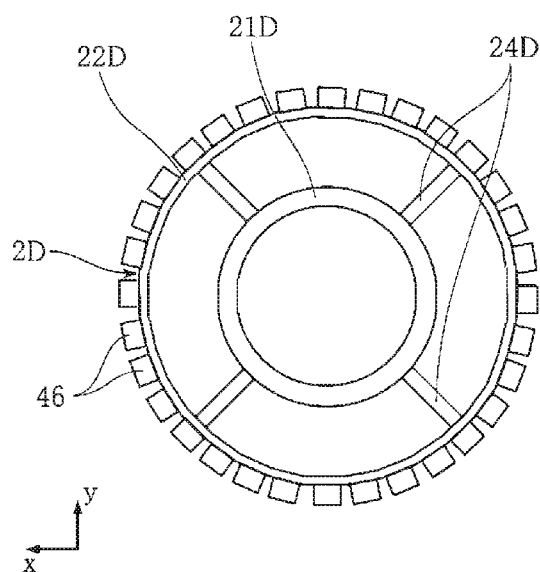
FIG. 40 is a schematic bottom view of the LED lighting apparatus shown in FIG. 39.
Figure 41:
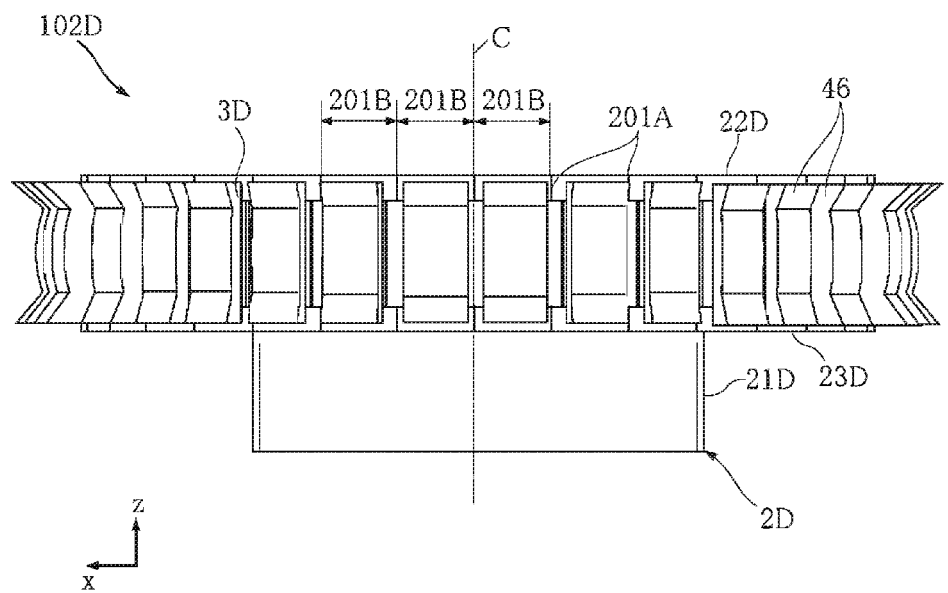
FIG. 41 is a schematic side view of the LED lighting apparatus shown in FIG. 39.

The light-transmitting members 46 are made of e.g. an acrylic resin and pass the light from the LED modules 4D. As shown in FIGS. 40 and 41, the light-transmitting members 46 are arranged in the form of a ring having a central axis extending in the direction z. The central axis of the ring shape of the light-transmitting members 46 corresponds to the central axis of the support unit 2D. Each of the light-transmitting members 46 is rectangular as viewed in the radial direction. The dimension of the light-transmitting member 46 in the circumferential direction is shorter than the dimension of the straight portion 201B in the circumferential direction. That is, each of the light-transmitting members 46 is provided for a respective one of the straight portions 201B to correspond to each substrate 3D.

Figure 42:
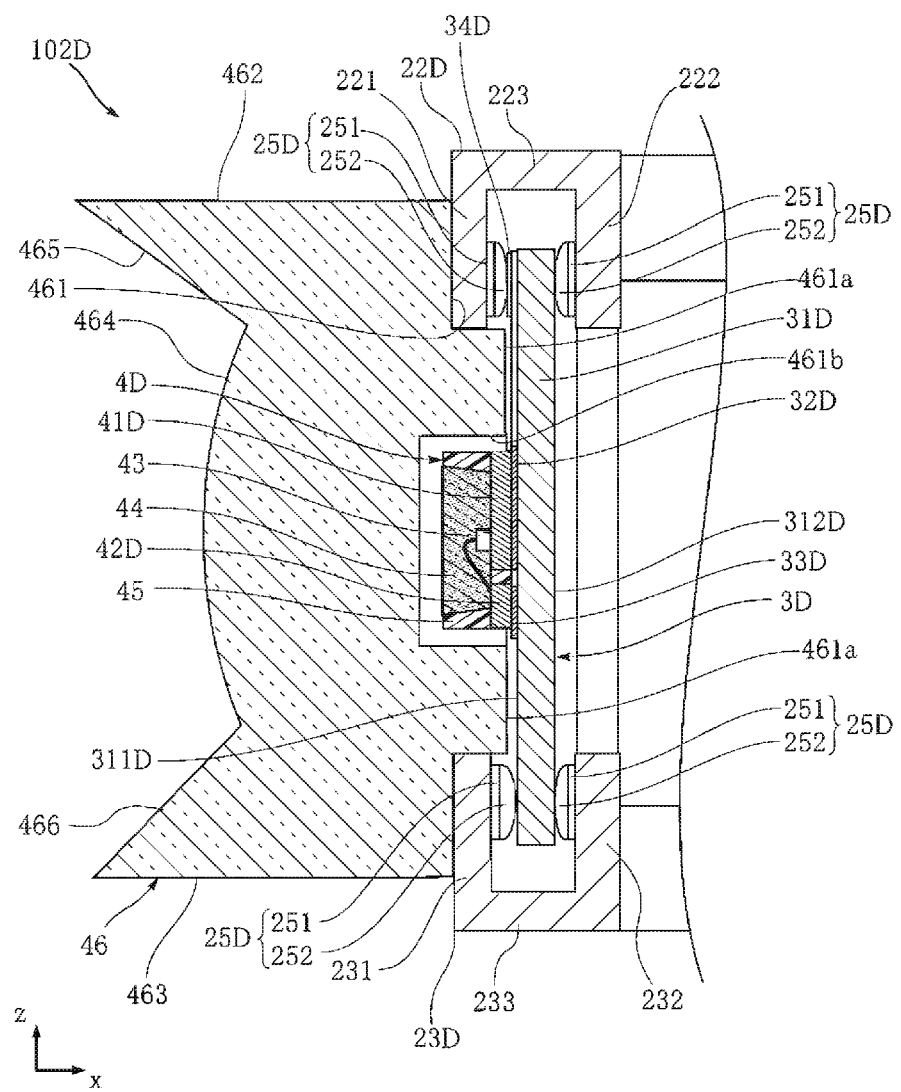
FIG. 42 shows a cross section perpendicular to a circumferential direction of the support unit shown in FIG. 39.

FIG. 42 is a schematic cross sectional view of the LED lighting apparatus 102D along a plane perpendicular to the circumferential direction. As shown in FIG. 42, the light-transmitting member 46 includes a bottom surface 461, a pair of side surfaces 462, 463 perpendicular to the bottom surface 461, a lens surface 464 opposite from the bottom surface 461, and a pair of tapered surfaces 465, 466. The bottom surface 461 is in contact with the outer side surfaces of the installation-side side plate 221 and the illumination-side side plate 231. The light-transmitting member 46 further includes a projection 461a projecting from the bottom surface 461. The projection 461a is sandwiched and supported between the installation-side side plate 221 and the illumination-side side plate 231 in the direction z. The projection 461a has a recess 461b extending in the direction x. As shown in FIG. 42, the light-transmitting member 46 is arranged to cover the LED module 4D, and the LED module 4D is accommodated in the recess 461b.

As shown in FIG. 42, the paired side surfaces 462, 463 are spaced from each other in the direction z. The lens surface 464 is generally in the form of an arc in cross section and overlaps the LED module 4D as viewed in the radial direction (the direction x in FIG. 42). The lens surface 464 refracts the light emitted from the LED module 4D so that the light travels along the direction x.

The paired tapered surfaces 465 and 466 are arranged to sandwich the lens surface 464 in the direction z. The tapered surface 465 is a surface connecting the left edge in FIG. 42 of the side surface 462 and the upper edge in FIG. 42 of the lens surface 464 to each other, and inclined to be away from the LED module 4D in the direction z as proceeding away from the substrate 3D in the direction x. The tapered surface 466 is a surface connecting the left edge in FIG. 42 of the side surface 463 and the lower edge in FIG. 42 of the lens surface 464 to each other, and inclined to be away from the LED module 4D in the direction z as progressing away from the substrate 3D in the direction x.

The light-transmitting member 46 is provided to protect the LED module 4D and direct the light from the LED module 4D in the radial direction. The lens surface 464 is provided for causing a larger amount of light from the LED module 4D to travel in the radial direction. Part of the light emitted from LED module 4D does not reach the lens surface 464 but reaches the side surface 462, 463. Part of the light reaching the side surface 462 is emitted toward the installation side in the direction z and reflected by the diffusion reflection plate 6D to travel toward the illumination side in the direction z. Remaining part of the light reaching the side surface 462 is reflected by the side surface 462 and emitted toward the illumination side in the direction z through the tapered surface 465. Since the tapered surface 465 is inclined, the light emitted through the tapered surface 465 is bent to travel along the radial direction. Part of the light reaching the side surface 463 is emitted toward the illumination side in the direction z. Remaining part of the light reaching the side surface 463 is reflected by the side surface 463, emitted toward the installation side in the direction z through the tapered surface 466, and reflected by the diffusion reflection plate 6D. Since the tapered surface 466 is inclined, the light emitted through the tapered surface 466 is bent to travel along the radial direction.

According to the present embodiment, the light-transmitting members 46 allow the light from the LED modules 4D to be emitted uniformly toward the light-transmitting cover 7D. Thus, the light-transmitting cover 7D looks bright uniformly along the circumferential direction.

According to the present embodiment, the light-transmitting member 46 is provided at each of the straight portions 201B. Thus, each light-transmitting member 46 is made relatively small. If the plurality of straight portions 201B are to be covered by a single light-transmitting member 46, the lens surface 464 needs to be formed at a position corresponding to each of the LED modules 4D, which requires highly accurate working. As compared with this, covering a single LED module 4D by a single light-transmitting member as in the present embodiment leads to reduction of a production failure of the light-transmitting member 46.

Figure 43:
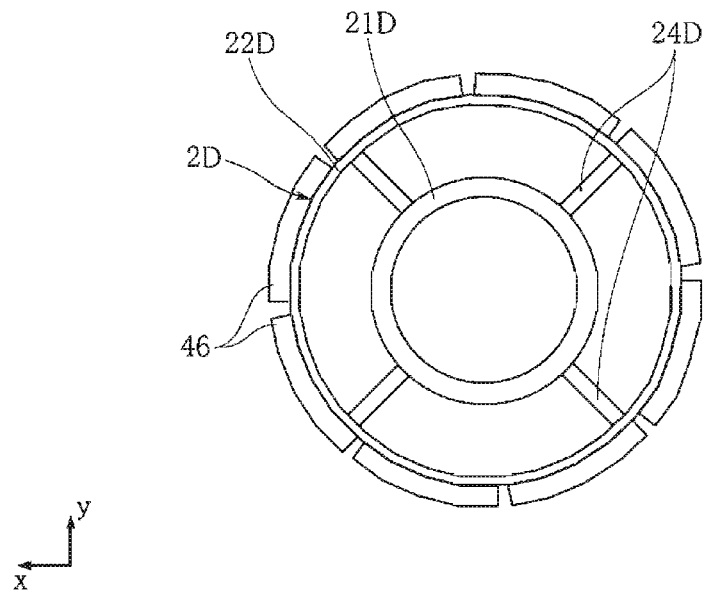
FIG. 43 is a schematic bottom view showing another example of the LED lighting apparatus shown in FIG. 39.
Figure 44:
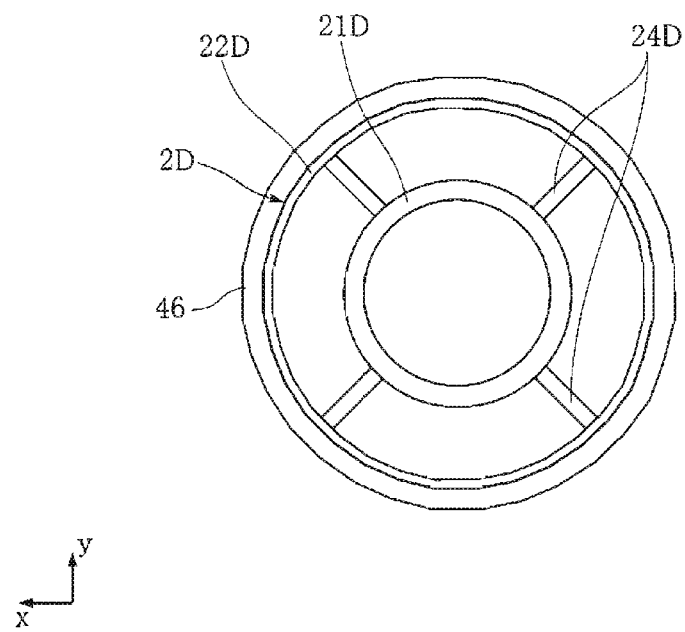
FIG. 44 is a schematic bottom view showing another example of the LED lighting apparatus shown in FIG. 39.
Figure 45:
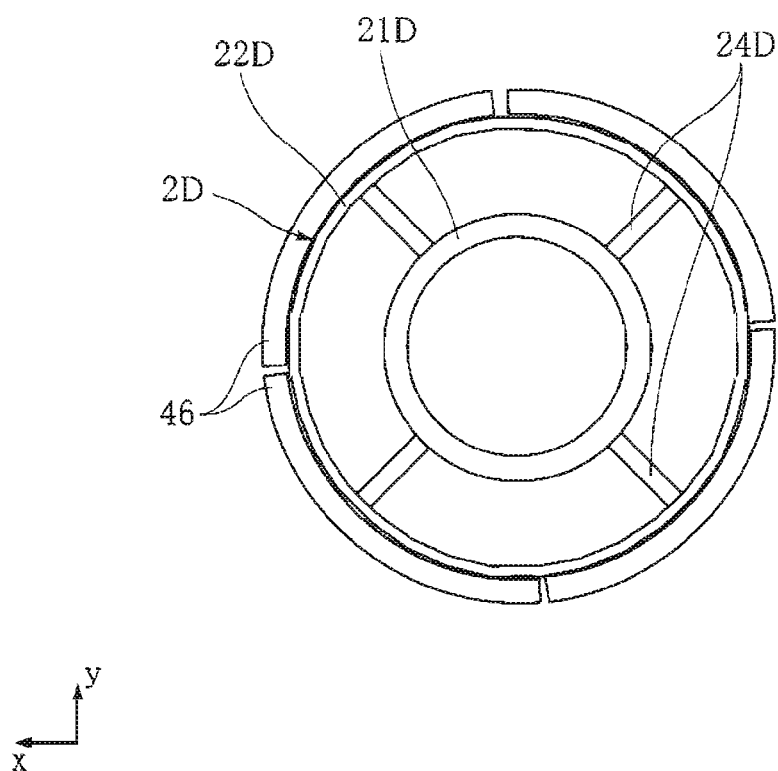
FIG. 45 is a schematic bottom view showing another example of the LED lighting apparatus shown in FIG. 39.

When the above-described problem is not to be taken into consideration, the light-transmitting member 46 can be designed to cover a plurality of straight portion 201B. FIGS. 43-45 show examples of such a light-transmitting member 46.

Shown in FIG. 43 are eight light-transmitting members 46 each of which is formed to extend over four straight portions 201B. The light-transmitting members 46 shown in FIG. 43 are bent to conform to the support unit 2D in the form of a polygon with 32 sides. Each light-transmitting member 46 is in contact with one of the plurality of bends 201A. As compared with the light-transmitting members 46 shown in FIG. 41, the light-transmitting member 46 of this structure can reduce the amount of light unfavorably leaking to the outside of the light-transmitting member 46.

The light-transmitting member 46 shown in FIG. 44 is shaped like a frame in the form of polygon with 32 sides as viewed in the axial direction (z direction) and surrounds the support unit 2D. The light-transmitting member 46 is in contact with all the bends 201A. This light-transmitting member 46 has an advantage that it does not easily allow the light emitted from the LED modules 4D arranged on the straight portions 201B to unfavorably leak to the outside.

Shown in FIG. 45 are four light-transmitting members 46 each of which is formed to extend over eight straight portions 201B. Each light-transmitting member 46 shown in FIG. 45 is in the form of an arc as viewed in the axial direction (direction z). This type of light-transmitting member 46 has an advantage that it is manufactured relatively easily, though having a risk that a gap may be defined between the inner circumference of light-transmitting member 46 and the straight portions 201B.

3D Embodiment

Figure 46:
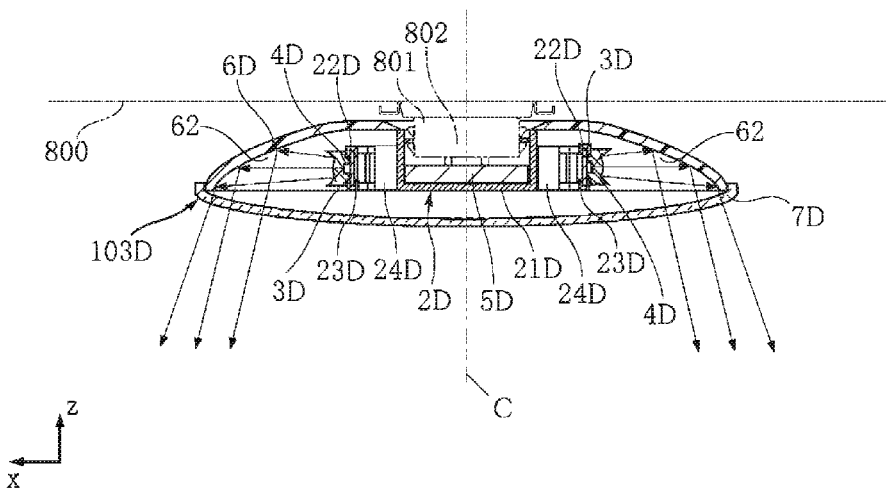
FIG. 46 is a sectional view showing an LED lighting apparatus of 3D embodiment according to a variation of the present invention.
Figure 47:
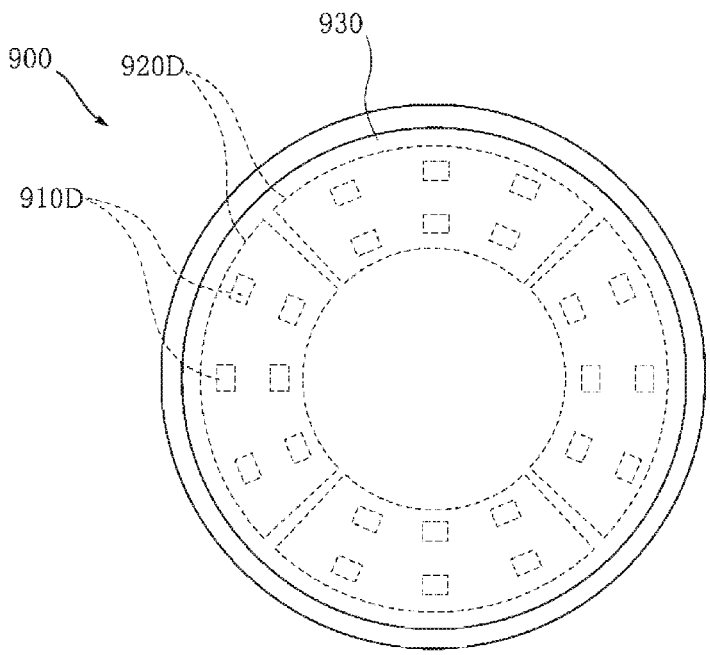
FIG. 47 is a sectional view showing an example of conventional LED lighting apparatus.

FIG. 46 shows an LED lighting apparatus according to 3D embodiment of the variation of the present invention. The LED lighting apparatus 103D shown in FIG. 46 differs from the LED lighting apparatus 102D in shape of the diffusion reflection plate 6D and the light-transmitting cover 7D. Other structures are the same as those of the LED lighting apparatus 102D. Further, in the LED lighting apparatus 103D, the connection portions 24D are deviated toward the illumination side of the center portion 21D in the direction z, as compared with the LED lighting apparatus 102D.

In the LED lighting apparatus 101D and the LED lighting apparatus 102D, the light-transmitting cover 7D, which is dome-shaped, is attached to a relatively flat diffusion reflection plate 6D. Unlike this, in the LED lighting apparatus 103, the diffusion reflection plate 6D is dome-shaped, and the light-transmitting cover 7D is flat as compared with that of the LED lighting apparatus 101D, 102D. The diffusion reflection plate 6D in the present embodiment includes an inclined surface 62 which is gradually displaced toward the illumination side in the direction z as proceeding radially outward from the center. The inclined surface 62 overlaps the LED modules 4D as viewed in the radial direction.

According to the present embodiment, light from each LED module 4D is reflected by the inclined surface 62 after passing through the light-transmitting member 46, and then diffused by the light-transmitting cover 7D. Since the diffusion reflection plate 6D is made of white resin, light from the LED module 4D is scattered when reflected by the inclined surface 62. This is favorable for preventing each LED module 4D from becoming conspicuous. In the LED lighting apparatus having this arrangement, the light-transmitting cover 7D looks bright uniformly along the circumferential direction.

The LED lighting apparatus according to the variation of the invention is not limited to the foregoing embodiment. The specific structure of each part of the LED lighting apparatus according to the variation of the invention may be varied in design in many ways.

For instance, although the installation-side support member 22D and the illumination-side support member 23D are arranged to overlap as viewed in the direction z in the present embodiment, the variation of the present invention is not limited to this embodiment. For instance, the installation-side support member 22D may be in the form of a frame larger than the illumination-side support member 23D. With this arrangement, each substrate 3D is supported in an inclined posture between the installation-side support member 22D and the illumination-side support member 23D.

According to the present embodiment, fitting the substrate 3D by oblique insertion between the installation-side side plates 221 and 222 is exemplarily described. However, the substrate 3D can be placed by other methods. For instance, each bend 201A may be provided with a slit between the installation-side side plate 221 and the illumination-side side plate 231 so that the substrate 3D can be inserted through the slit.

Although each LED module 4D includes a single LED chip 43 in the present embodiment, each LED module 4D may include tow or more LED chips 43. Further, three or more LED modules 4D may be mounted on the substrate 3D. When a plurality of LED modules 4D are mounted on the substrate 3D, LED modules 4D that emit light of different color temperatures may be used in various combinations.

Although a single substrate 3D is supported on each straight portion 201B in the present embodiment, this variation of the invention is not limited to such a structure. That is, even when a plurality of substrates 3D are supported on each straight portion 201B, uniform illumination in the circumferential direction can be achieved as long as the number of sides of a polygon defining the contour of the support unit 2D is sufficiently large.

The feature of the present variation of the invention is described below as Appendixes.

Appendix 1

An LED lighting apparatus comprising:
a plurality of LED chips;
a plurality of substrates supporting the LED chips;
a support unit in the form of a ring supporting the substrates; and
a light-transmitting cover at least part of which is on an illumination side of the support unit which is one side in a direction of an axis of the support unit, the light-transmitting cover being configured to transmit light from the LED chips,
wherein:
the plurality of substrates are arranged in the form of a ring having an axis corresponding to the axis of the support unit,
each of the substrates includes a support surface facing an outer side which is one side in a radial direction of the support unit,
each of the support surfaces supports a respective one of the LED chips, the support unit includes a plurality of conduction portions, an illumination-side support member, and an installation-side support member arranged on an installation side with respect to the illumination-side support member, which is the other side in said direction of the axis, the illumination-side support member includes a pair of illumination-side side plates spaced from each other in the radial direction with the substrates intervening therebetween, and the installation-side support member includes a pair of installation-side side plates spaced from each other in the radial direction with the substrates intervening therebetween.

Appendix 2

The LED lighting apparatus as set forth in Appendix 1, wherein:

the illumination-side support member further includes an illumination side bottom plate connecting respective ends of the paired illumination-side side plates on the illumination side in said direction of the axis to each other, the installation-side support member further includes an installation-side bottom plate connecting respective ends of the paired installation-side side plates on the installation side in said direction of the axis to each other, and the substrates are positioned between the illumination-side bottom plate and the installation-side bottom plate in said direction of the axis.

Appendix 3

The LED lighting apparatus as set forth in Appendix 1 or 2, wherein each of the substrates is rectangular as viewed in the radial direction.

Appendix 4

The LED lighting apparatus as set forth in Appendix 3, wherein:

each of the substrates is provided with a first pad and a second pad that are spaced from each other, and each of the conduction portions electrically connects the first pad of one of adjacent substrates and the second pad of the other one of the adjacent substrates to each other.

Appendix 5

The LED lighting apparatus as set forth in Appendix 4, wherein:

the support unit has a polygonal contour as viewed in said direction of the axis, the support unit includes a plurality of bends at positions corresponding to angles of the polygon of the contour and a plurality of straight portions at positions corresponding to sides of the polygon of the contour, the straight portions include a first straight portion and a second straight portion adjoining each other with a first bend that is one of the plurality of bends intervening therebetween, and the plurality of substrates include a first substrate supported on the first straight portion and a second substrate supported on the second straight portion.

Appendix 6

The LED lighting apparatus as set forth in Appendix wherein each of the straight portions has a dimension in a circumferential direction that is shorter than twice a dimension of each of the substrates in a circumferential direction.

Appendix 7

The LED lighting apparatus as set forth in Appendix 6, wherein each of the conduction portions is provided to cross over each of the bends.

Appendix 8

The LED lighting apparatus as set forth in Appendix 7, wherein the conduction portions are provided on the installation-side support member.

Appendix 9

The LED lighting apparatus as set forth in Appendix 7, wherein:

the conduction portions include a first conduction portion that electrically connects the first pad of the first substrate and the second pad of the second substrate to each other, and a second conduction portion electrically connected to the second pad of the first substrate, the first conduction portion is provided on the installation-side support member, and the second conduction portion is provided on the illumination-side support member.

Appendix 10

The LED lighting apparatus as set forth in Appendix 7, wherein each of the conduction portions is provided on the illumination-side support member.

Appendix 11

The LED lighting apparatus as set forth in any one of Appendixes 5-10, further comprising a plurality of light-transmitting members arranged in the form of a zing having an axis corresponding to said axis, wherein the light-transmitting members include a first light-transmitting member covering a first LED chip that is one of the LED chips.

Appendix 12

The LED lighting apparatus as set forth in Appendix 11, wherein the first light-transmitting member includes a lens surface that overlaps the first LED chip as viewed in the radial direction.

Appendix 13

The LED lighting apparatus as set forth in Appendix 12, wherein:

the first light-transmitting member includes a pair of tapered surfaces arranged to sandwich the lens surface in said direction of the axis, and each of the tapered surfaces is inclined to be away from the first LED chip in the radial direction as proceeding away from the lens surface in said direction of the axis.

Appendix 14

The LED lighting apparatus as set forth in any one of Appendixes 11-13, wherein each of the light-transmitting members has a dimension in a circumferential direction that is shorter than a dimension of each of the straight portions in a circumferential direction.

Appendix 15

The LED lighting apparatus as set forth in any one of Appendixes 11-13, wherein each of the light-transmitting members has a curved shape to conform to the support unit.

Appendix 16

The LED lighting apparatus as set forth in any one of Appendixes 11-13, wherein each of the light-transmitting members is in the form of an arc as viewed in said direction of the axis.

Appendix 17

The LED lighting apparatus as set forth in any one of Appendixes 5-10, further comprising a light-transmitting member in the form of a ring having an axis corresponding to said axis,
wherein the light-transmitting member surrounds the support unit.

Appendix 18

The LED lighting apparatus as set forth in Appendix 17, wherein the light-transmitting member includes a lens surface overlapping a first LED chip that is one of the LED chips, as viewed in the radial direction.

Appendix 19

The LED lighting apparatus as set forth in Appendix 18, wherein:
the light-transmitting member includes a pair of tapered surfaces arranged to sandwich the lens surface in said direction of the axis, and
each of the tapered surfaces is inclined to be away from the first LED chip in the radial direction as proceeding away from the lens surface in said direction of the axis.

Appendix 20

The LED lighting apparatus as set forth in Appendix 19, wherein the light-transmitting member has a polygonal shape extending along the support unit.

Appendix 21

The LED lighting apparatus as set forth in any one of Appendixes 1-20, wherein the light-transmitting cover is made of milky-white translucent resin.

Appendix 22

The LED lighting apparatus as set forth in any one of Appendixes 1-21, further comprising a diffusion reflection plate at least part of which is arranged on the installation side of the support unit in said direction of the axis.

Appendix 23

The LED lighting apparatus as set forth in Appendix 22, wherein the diffusion reflection plate is made of white resin.

Appendix 24

The LED lighting apparatus as set forth in Appendix 23, wherein:
the diffusion reflection plate includes an inclined surface that is gradually displaced toward the illumination side in said direction of the axis as proceeding away from a center in the radial direction, and
the inclined surface overlaps one of the LED chips as viewed in the radial direction.

Appendix 25

The LED lighting apparatus as set forth in any one of Appendixes 21-23, wherein at least part of the light-transmitting overlaps one of the LED modules as viewed in the radial direction.

1E Embodiment

Figure 48:
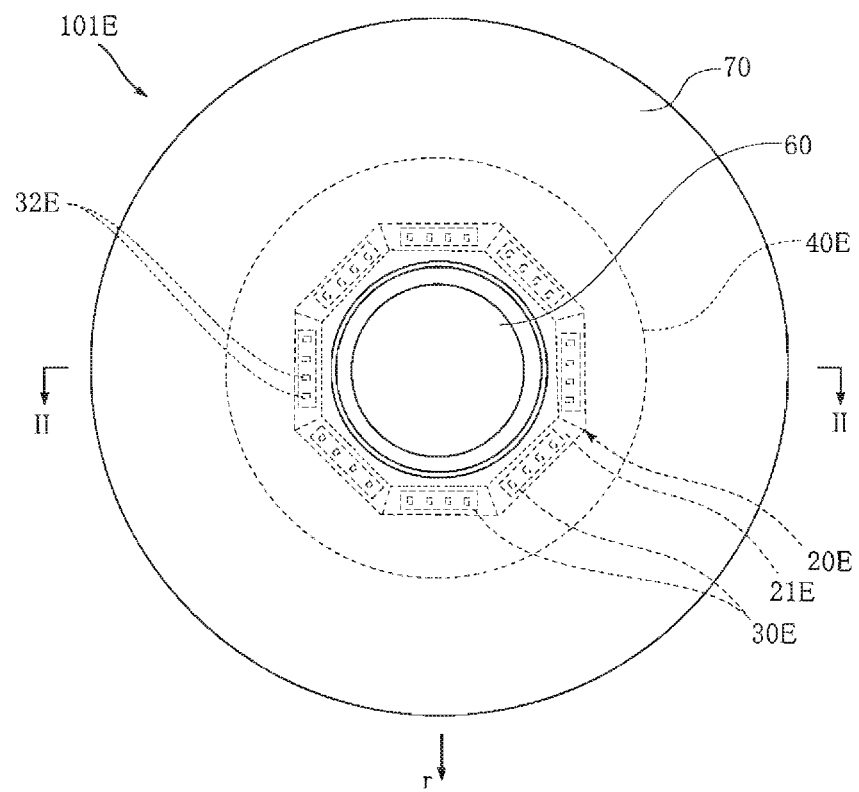
FIG. 48 is a front view showing an LED lighting apparatus of 1E embodiment according to a variation of the present invention.
Figure 49:
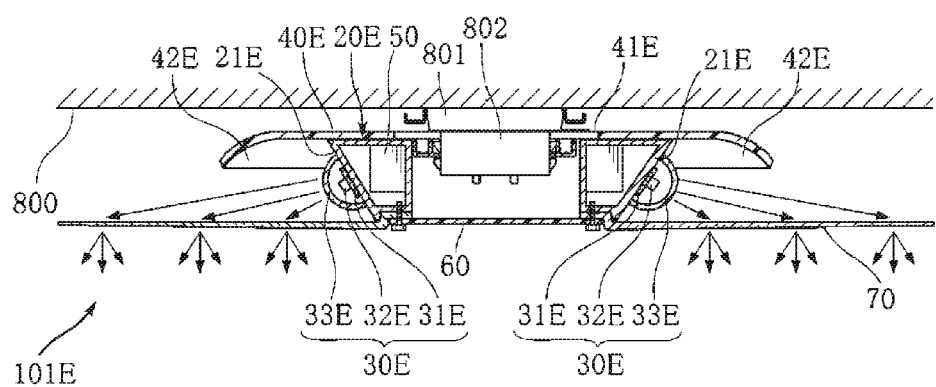
FIG. 49 is a sectional view taken along lines II-II in FIG. 48.

FIGS. 48 and 49 show an LED lighting apparatus according to 1E embodiment of the variation of the present invention. The LED lighting apparatus 101E of the present embodiment includes a support unit 20E, a plurality of light source units 30E, a diffusion reflection plate 40E, a power source unit 50, a cover 60, and a light-transmitting plate 70. The LED lighting apparatus 101E is designed for use as a ceiling light, and includes an attachment 802 for attaching the LED lighting apparatus to a power supply portion in a ceiling 800, for example. The direction z shown in FIG. 49 is the direction from the ceiling toward the floor and corresponds to the first direction in this variation of the present invention. The lower side in the direction z in FIG. 49 is the illumination side, whereas the upper side in the direction z in the figure is the installation side. The direction r shown in FIGS. 48 and 49 is the radial direction with respect to the axial direction z and corresponds to the second direction in this variation of the present invention. As shown in FIG. 48, the LED lighting apparatus 101 is circular as viewed in the direction z.

The support unit 20E is made of a metal such as aluminum and constitutes the support structure of the LED lighting apparatus 101E. The support unit 20E is in the form of an equilateral octagon as viewed in the direction z, but is not limited to this shape. The support unit 20E includes eight side plates 21E respectively extending along the eight sides of the octagon. The center of the support unit 20E corresponds to the center of the LED lighting apparatus 101E. The eight side plates 21E partition between the outer side, which is one side in the direction r, and the inner side, which is the other side in the direction r. Each side plate 21E is inclined to be gradually displaced outward in the direction r as proceeding from the illumination side toward the installation side in the direction z. A space for accommodating the power source unit 50 is provided on the inside of the side plates 21E in the direction r. The support unit 20E as a whole is in the form of a ring as viewed in the direction z and receives in it the attachment 802 when the LED lighting apparatus 101E is fixed to the ceiling 800.

The light source units 30E are placed on the outer surfaces of the side plates 21E of the support unit 20E in the direction r. Each light source unit 30E includes a substrate 31E, a plurality of LED modules 32E and a protective member 33E. The substrate 31 is an insulating substrate made of e.g. glass-fiber-reinforced epoxy resin. The protective member 33E is made of e.g. transparent acrylic resin and covers the LED modules 32E. For instance, the protective member 33E is generally in the form of a half tube having a semicircular cross section.

Figure 50:
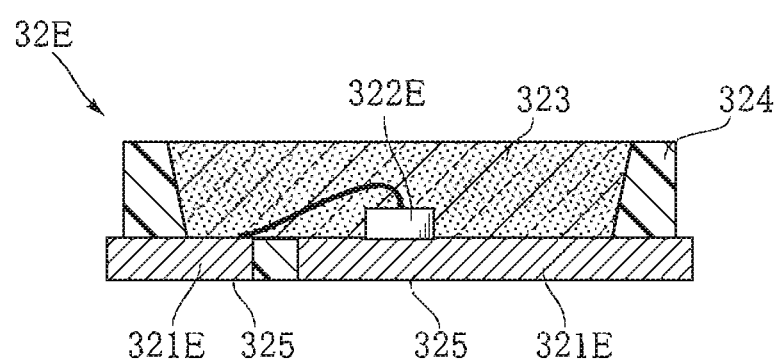
FIG. 50 is a sectional view showing an example of LED module used for the LED lighting apparatus of FIG. 48.

The LED modules 32E are mounted on the substrate 31E. As shown in FIG. 50, each LED module 32E includes a pair of leads 321E, an LED chip 322E, a sealing resin 323 and a case 324. The paired leads 321E are made of e.g. Cu alloy. The LED chip 322E is mounted on one of the leads 321E. The surfaces of the leads 321E opposite from the surface on which the LED chip 322E is mounted serve as mounting terminals 325 for surface-mounting the LED module 32E. The LED chip 322E is the light source of the LED module 32E and is configured to emit e.g. blue light. The sealing resin 323 protects the LED chip 322E. The sealing resin 323 is made of a light-transmitting resin material containing a fluorescent substance that emits yellow light when excited by light from the LED chip 322E. According to this structure, the LED module 32E can be configured to emit light of a desired color temperature. Instead of the fluorescent substance that emits yellow light, mixture of a fluorescent substance that emits red light and a fluorescent substance that emits green light may be used. The case 324 is made of e.g. white resin and reflects the light traveling toward the sides from the LED chip 322E in the upward direction. An LED of a type that uses two wires for connection to the paired leads 321E may be employed as the LED chip 322E.

The light-transmitting cover 70 constitutes most of the appearance of the LED lighting apparatus 101E as seen from the illumination side in the direction z and is made of e.g. milky-white translucent resin. The light transmitting plate 70 is in the form of a ring as viewed in the direction z and positioned on the illumination side in the direction z with respect to the light source units 30E. Light traveling from the light source units 30E to the light-transmitting plate 70 passes through the light-transmitting plate 70 while being diffused by the light transmitting plate 70. The light is then emitted through the illumination-side surface in the direction z of the light-transmitting plate 70. In the present embodiment, the thickness of the light-transmitting plate 70 reduces as proceeding outward in the direction r.

The cover 60 is arranged on the illumination side of the support unit 20E in the direction z. The cover 60 is made of e.g. aluminum or a resin and circular as viewed in the direction z. In the present embodiment, the light transmitting plate 70 is fixed, along with the cover 60, to the support unit 20E by using bolts. With this arrangement, the light-transmitting plate 70 is removably attached to the support unit 20E.

The diffusion reflection plate 40E is made of e.g. a white resin material that reflects light from the LED modules 32E and arranged on the installation side of the support unit 20E in the direction z. As shown in FIG. 48, the outer contour of the diffusion reflection plate 40E is circular as viewed in the direction z. The diameter of this circle is smaller than the diameter of the light-transmitting plate 70. As shown in FIG. 49, the diffusion reflection plate 40E has a circular opening 41E at the center. The opening 41E exposes the attachment 802 to the installation side. The diffusion reflection plate 40E further includes a peripheral portion 42E. The peripheral portion 42E is inclined to be gradually displaced toward the illumination side in the direction z as proceeding outward in the direction r.

The power source unit 50 converts e.g. commercial AC of 100 V to DC power suitable for lighting the LED chips 322E. The power source unit 50 includes e.g. a transformer, a capacitor and an LED driver.

Figure 51:
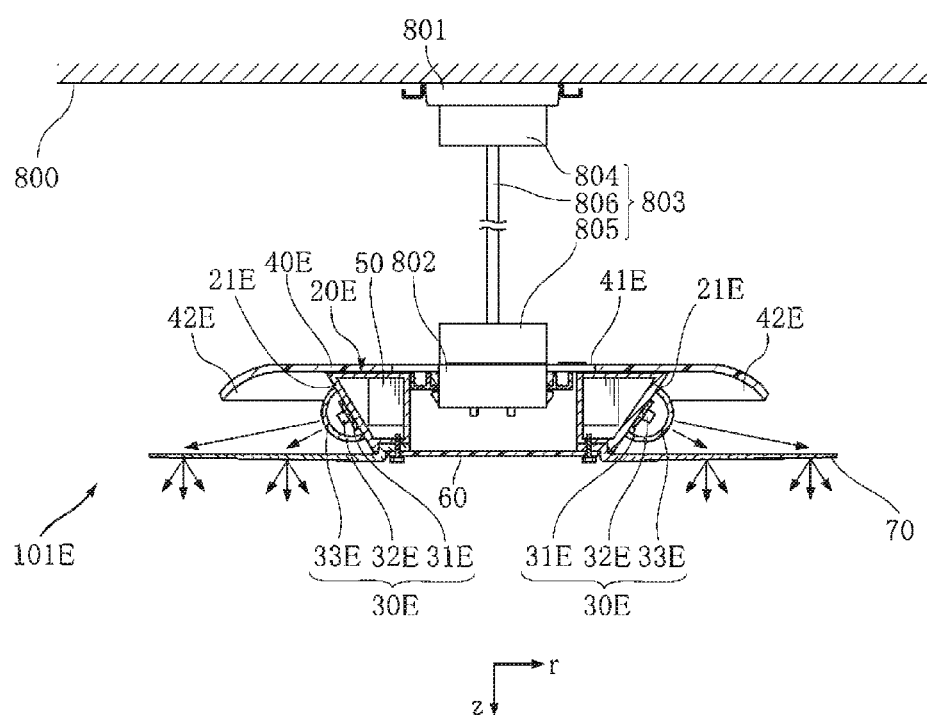
FIG. 51 is a sectional view showing another example of use of the LED lighting apparatus shown in FIG. 48.

FIG. 51 shows an example of use of the LED lighting apparatus 101E. In this example, the LED lighting apparatus 101E further includes an extension adapter 803 as a structural part. The extension adapter 803 includes a first intermediate fitting portion 804, a second intermediate fitting portion 805, and a cable 806. The first intermediate fitting portion 804 is configured to be attachable to the power supply portion 801 of the ceiling 800. The second intermediate fitting portion 805 is configured to be attachable to the attachment 802. The cable 806 connects the first intermediate fitting portion 804 and the second intermediate fitting portion 805 to each other. The power supply portion 801 and the attachment 802 are electrically connected to each other via the extension adapter 803. Moreover, in this example of use, a light-transmitting plate 70 having a smaller diameter than that shown in FIG. 48 is used. In this example, the LED lighting apparatus 101E is used as a so-called pendant light for illuminating e.g. a table from a position spaced downward in the direction z from the ceiling 800.

Figure 52:
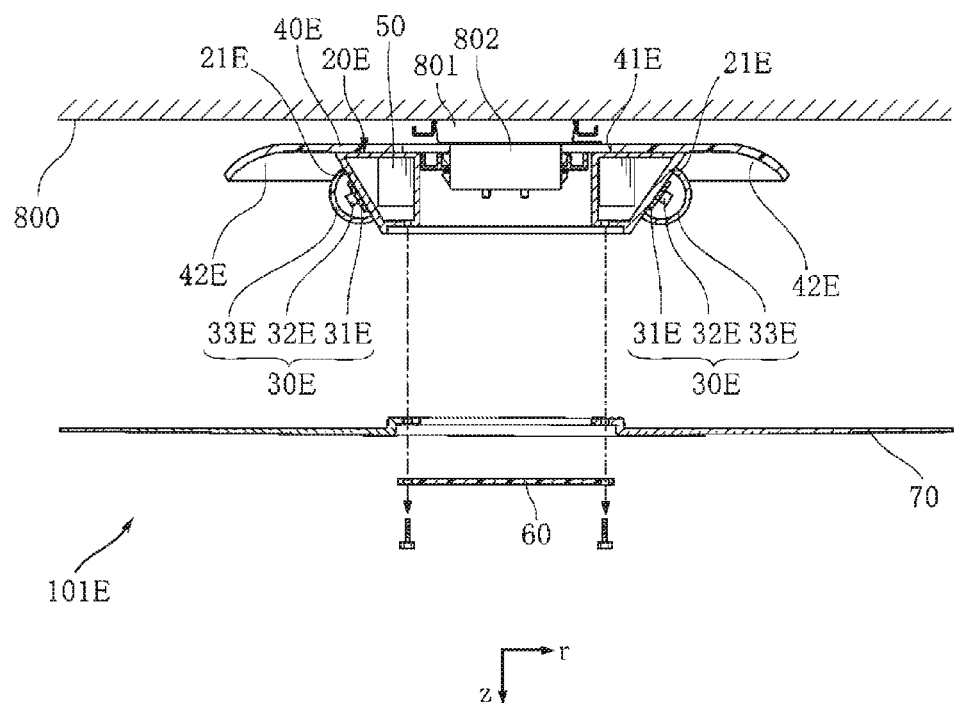
FIG. 52 is an exploded sectional view of the LED lighting apparatus shown in FIG. 48.
Figure 53:
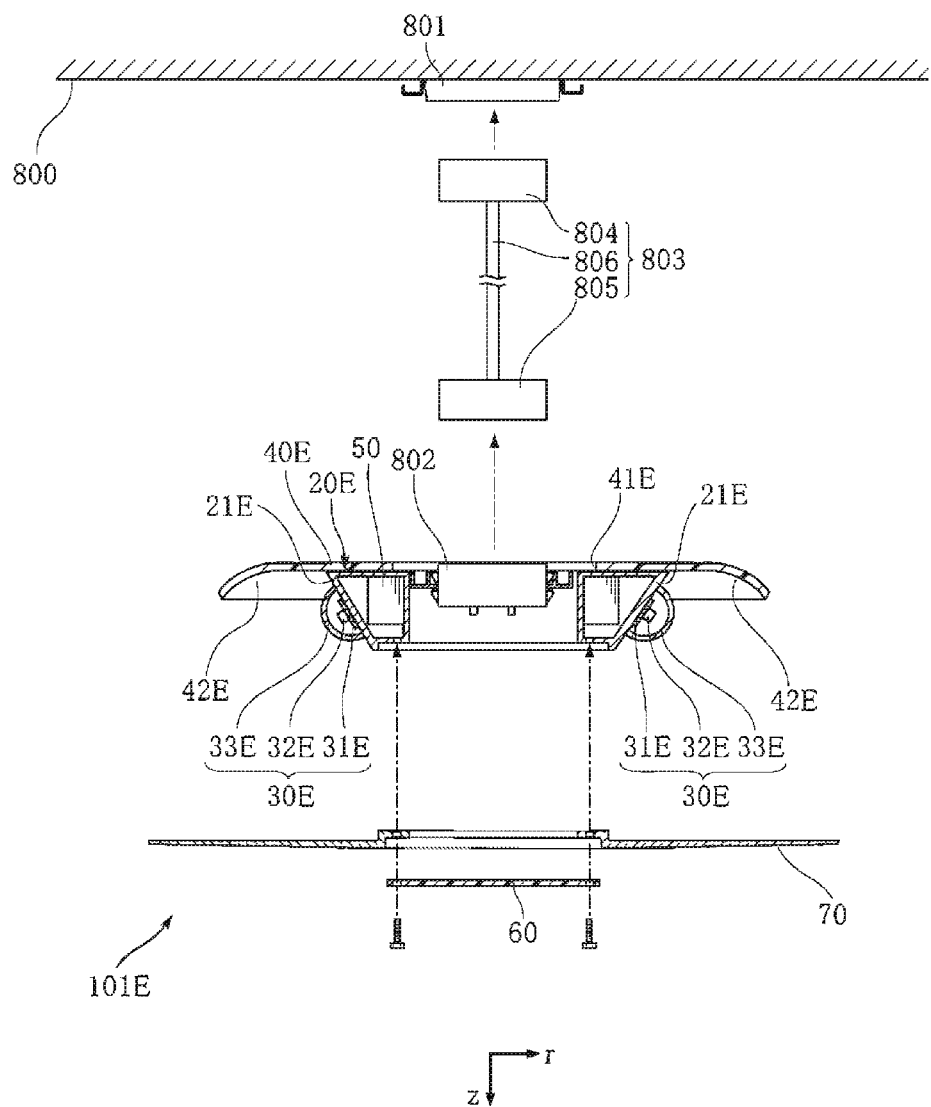
FIG. 53 is an exploded sectional view for describing the assembling of the LED lighting apparatus for use as shown in FIG. 51.

FIG. 52 shows the state where the light-transmitting plate 70 is detached from the LED lighting apparatus 101E in the example of use shown in FIG. 48. By removing the bolts as shown in the figure, the light-transmitting plate 70 can be detached along with the cover 60. FIG. 53 shows how to attach the LED lighting apparatus for achieving the use shown in FIG. 51. First, a light-transmitting plate 70 smaller than the light-transmitting plate 70 shown in FIG. 48 and an extension adapter 803 are prepared. Then, the extension adapter 803 is mounted to the power supply portion 301 and to the attachment 802. Then, by using the bolts shown in the figure, the light-transmitting plate 70 is attached to the support unit 20E, along with the cover 60. By this, the LED lighting apparatus 101E in the example of use shown in FIG. 51 is completed.

The advantages of the LED lighting apparatus 101E are described below.

According to the present embodiment, as shown in 49, the portion near the outer periphery of the LED lighting apparatus 101E in the direction r comprises only the thickness of the light-transmitting plate 7, whereby the appearance of the LED lighting apparatus 101E is enhanced. Since the light-transmitting plate 70 has a smaller thickness at an outer portion in the direction r, the LED lighting apparatus 101E has a smaller thickness at the outer periphery. The amount of light from the light source units 30E reaching the light-transmitting plate 70 is smaller at a portion farther from the light source units 30E. Since the light-transmitting plate 70 is thinner at an outer portion in the direction r, relatively bright light can be emitted through the outer portion even when the amount of light reaching there is small. Thus, the entirety of the light-transmitting plate 70 is uniformly illuminated.

As shown in FIGS. 49 and 51, by selectively using the extension adapter 803, the LED lighting apparatus 101E can be used either as a ceiling light or a pendant light as desired. Since the light-transmitting plate 70 is configured to be detachable from the support unit 20E, a light-transmitting plate 70 of a size suitable for a ceiling light or a pendant light can be employed as desired.

FIGS. 54-64 show other examples and embodiments of the present variation. In these figures, the elements that are identical or similar to those of the foregoing embodiment are designated by the same reference signs as those used for the foregoing embodiment.

Figure 54:
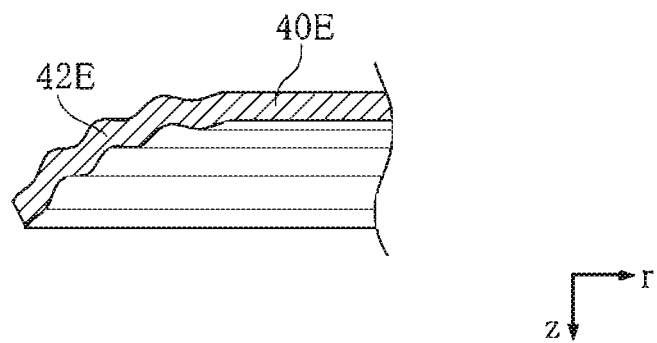
FIG. 54 is an enlarged sectional view showing a principal portion of a variation of a diffusion reflection plate of the LED lighting apparatus shown in FIG. 48.

FIG. 54 shows another example of the diffusion reflection plate 40E of the LED lighting apparatus 101E. In this example, the peripheral portion 42E of the diffusion reflection plate 40E comprises a corrugated plate. With this arrangement, the heat conducted from the light source units 30E to the support unit 20E and the diffusion reflection plate 40E is efficiently dissipated from the peripheral portion 42E.

Figure 55:
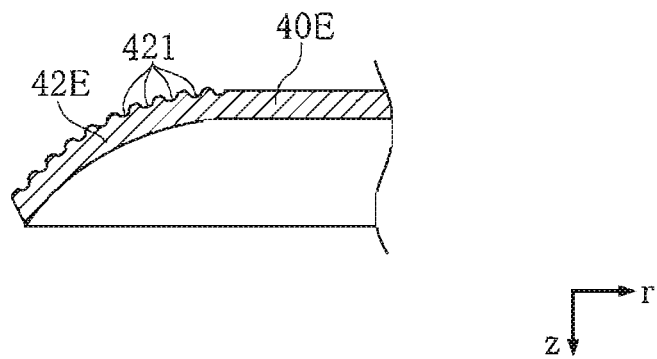
FIG. 55 is an enlarged sectional view showing a principal portion of another variation of a diffusion reflection plate of the LED lighting apparatus shown in FIG. 48.

FIG. 55 shows another example of the diffusion reflection plate 40E of the LED lighting apparatus 101E. In this example, the peripheral portion 42E of the diffusion reflection plate 40E is formed with a plurality of grooves 421. With this example again, the heat conducted from the light source units 30E to the support unit 20E and the diffusion reflection plate 40E is efficiently dissipated from the peripheral portion 42E.

Figure 56:
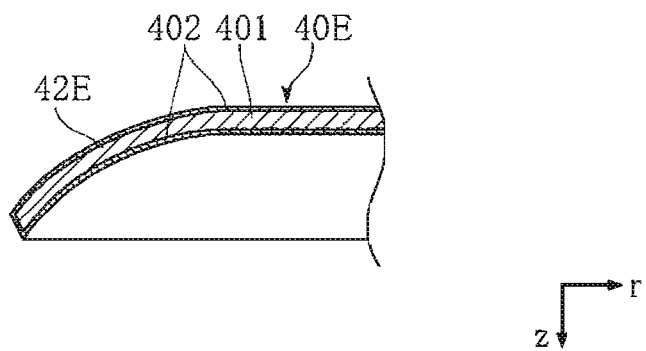
FIG. 56 is an enlarged sectional view showing a principal portion of another variation of a diffusion reflection plate of the LED lighting apparatus shown in FIG. 48.

FIG. 56 shows another example of the diffusion reflection plate 40E of the LED lighting apparatus 101E. In this example, the diffusion reflection plate 40E comprises a substrate 401 and an anodized aluminum layer 402. The substrate 401 is made of aluminum. The anodized aluminum layer 402 is formed by performing anodizing with respect to the substrate 401. With this example again, heat from the light source units 30E is efficiently dissipated.

Figure 57:
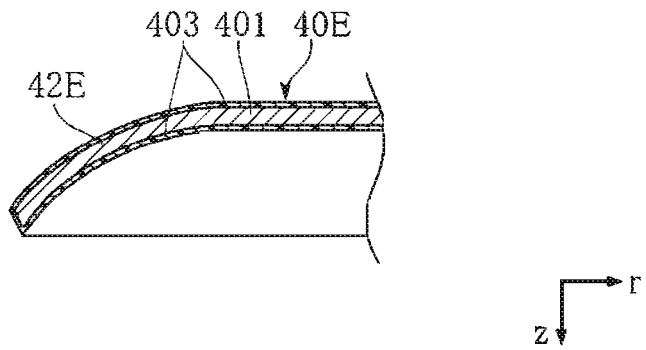
FIG. 57 is an enlarged sectional view showing a principal portion of another variation of a diffusion reflection plate of the LED lighting apparatus shown in FIG. 48.

FIG. 57 shows another example of the diffusion reflection plate 40E of the LED lighting apparatus 101E. In this example, the diffusion reflection plate 40E comprises a substrate 401 and a highly heat-dissipative coating 403. The substrate 401 is made of a metal such as aluminum. The highly heat-dissipative coating layer 403 is formed by applying a highly heat-dissipative paint to the substrate 401. Examples of such highly heat-dissipative paint include white paint containing a ceramic material such as alumina or metal particles. With this example again, heat from the light source units 30E is efficiently dissipated.

2E embodiment

Figure 58:
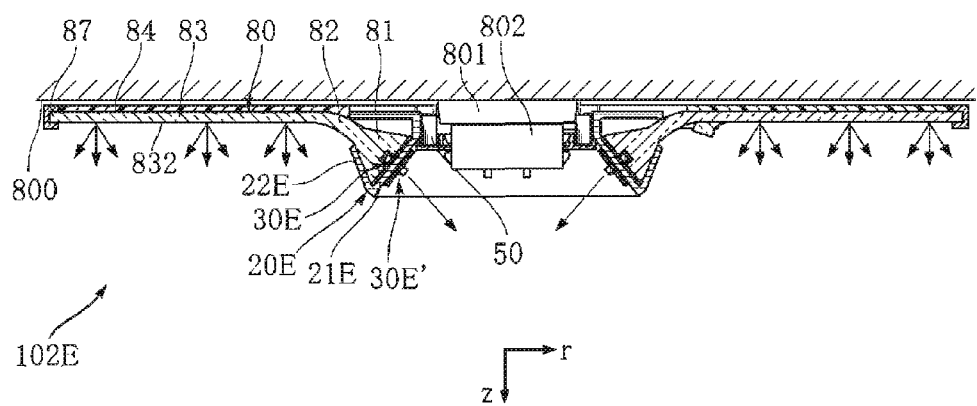
FIG. 58 is a sectional view showing an LED lighting apparatus of 2E embodiment according to a variation of the present invention.
Figure 59:
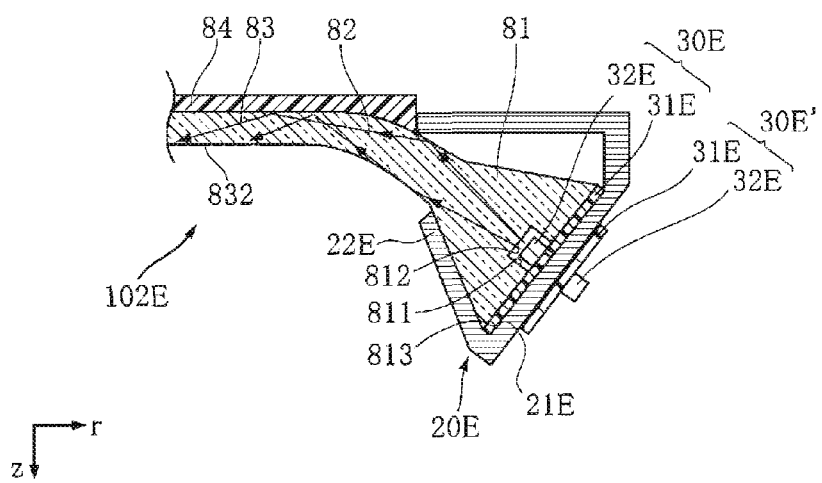
FIG. 59 is sectional view showing a principal portion of the LED lighting apparatus shown in FIG. 58.

FIGS. 58 and 59 show an LED lighting apparatus according to 2E embodiment of the variation of the present invention. The LED lighting apparatus 102E of the present embodiment includes a support unit 20E, a plurality of light source units 30E, a plurality of additional light source units 30E', a power source unit 50 and a light guide 80. Similarly to the LED lighting apparatus 101E shown in FIG. 48, the LED lighting apparatus 102E as a whole is circular as viewed in the direction z.

The support unit 20E is made of a metal such as aluminum and constitutes the support structure of the LED lighting apparatus 102E. The support unit 20E is in the form of an equilateral octagon as viewed in the direction z, but is not limited to this shape. The support unit 20E includes eight side plates 21E respectively extending along the eight sides of the octagon, and eight engagement portions 22E. The center of the support unit 20E corresponds to the center of the LED lighting apparatus 102E. The eight side plates 21E partition between the outer side, which is one side in the direction r, and the inner side, which is the other side in the direction r. Each side plate 21E is inclined to be gradually displaced inward in the direction r as proceeding from the illumination side toward the installation side in the direction z. The support unit 20E as a whole is in the form of a ring as viewed in the direction z and receives in it the attachment 802 when the LED lighting apparatus 102E is fixed to the ceiling 800. The engagement portions 22E extend from the lower ends of the side plates 21E in the direction z and hold the light guide 80.

The light source units 30E are placed on the outer surfaces of the side plates 21E of the support unit 20E in the direction r. Each light source unit 30E includes a substrate 31E and a plurality of LED modules 32E. The structures of the substrate 31E and the LED modules 32E are as described above.

The power source unit 50 converts e.g. commercial AC of 100 V to DC power suitable for lighting the LED chips 322E.

The power source unit 50 includes e.g. a transformer, a capacitor and an LED driver and is supported by the support unit 20E.

The light guide 80 is made of e.g. transparent acrylic resin and is in the form of a ring as viewed in the direction z. The light guide 80 includes a constricted portion 81, a bent portion 82, and a ring plate portion 83. The constricted portion 81 is an inner portion of the light guide 80 in the direction r, and includes a recess 811, an incident surface 812, and a bottom surface 813, as shown in FIG. 59. The bottom surface 813 faces the substrate 31E of the light source unit 30E and can be in contact with the substrate 31E. The constricted portion 81 has a cross section that reduces as proceeding from the bottom surface 813 in the direction in which the substrate 31E faces. The recess 811 is formed in the bottom surface 813 and accommodates the LED module 32E of the light source unit 30E. The incident surface 812 is part of the inner surface of the recess 811 and faces the LED module 32E.

The bent portion 82 is connected to the outer side in the direction r of the constricted portion 81 and bent as shown in FIG. 59. The ring plate portion 83 is connected to the outer side in the direction r of the bent portion 82 and comprises a plate in the form of a ring as viewed in the direction z. The ring plate portion 83 is connected to the constricted portion 81 via the bent portion 82 so that the ring plate portion 83 is positioned on the installation side in the direction z with respect to the light source units 30E. A reflective layer 84 is placed on the installation side in the direction z of the ring plate portion 83. The reflective layer 84 is made of white resin or aluminum. The surface of the ring plate portion 83 on the illumination side in the direction z constitutes an emission surface 832. As shown in FIG. 58, the outer edge of the ring plate portion 83 in the direction r is covered with a light-shielding member 87. The light-shielding member 87 is in the form of a ring that is U-shaped in cross section and made of opaque resin or metal.

As shown in FIG. 59, light emitted from the LED module 32E impinges on the incident surface 812 and then travels through the constricted portion 81 toward the bent portion 82. The light is totally reflected in the bent portion 82 and hence travels toward the ring plate portion 83. In the ring plate portion 83, light travels toward the outer portion in the direction r of the ring plate portion 83. During this process, part of the light reflected by the reflective layer 84 is emitted from the emission surface 832 toward the illumination side in the direction z, as shown in FIG. 58. The light reaching the outer edge of the ring plate portion 83 in the direction r is prevented, by the light-shielding member 87, from traveling further outward in the direction r.

The additional light source units 30E' are placed on the inner surfaces of the side plates 21E. Each additional light source unit 30E' includes a substrate 31E and a plurality of LED modules 32E, and has the same structure as that of the light source unit 30E.

The advantages of the LED lighting apparatus 102E are described below.

According to the present embodiment, the thickness of the LED lighting apparatus 102E is almost the same as the thickness of the ring plate portion 83 of the light guide 80, except at the center in the direction r, and hence, the lighting apparatus is snugly fitted to the ceiling 800. Thus, the LED lighting apparatus 102E does not project largely from the ceiling 800. This enhances the appearance of the room in which the lighting is attached.

Since the LED module 32E is accommodated in the recess 811, light from the LED module 32E is prevented from leaking from the light guide 80. Since the incident surface 812 faces the LED module 32E, a large amount of light from the LED module 32E impinges on the incident surface 812. The bottom surface 813 which faces the substrate 31E and which can be in contact with the substrate 31E is advantageous for preventing leakage of light from the light guide 80.

The constricted portion 81 has the effect of converging light from the LED module 32E toward the bent portion 82. The bent portion 82 serves to reflect the light, traveling from the constricted portion 81, toward ring plate portion 83. The provision of the bent portion 82 allows the ring plate portion 83 to be positioned on the installation side in the direction z with respect to the light source units 30E.

The reflective layer 84 prevents the light, traveling through the ring plate portion 83, from leaking toward the installation side in the direction z, and reflects the light toward the emission surface 832.

Figure 60:
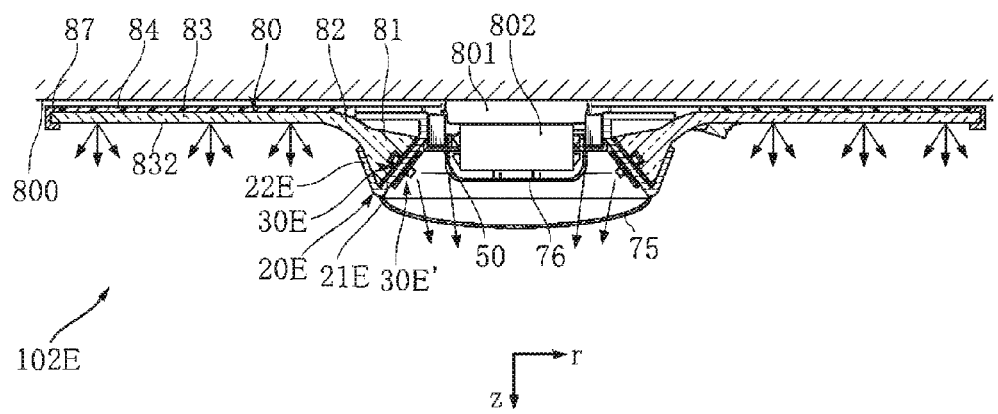
FIG. 60 is a sectional view showing another example of LED lighting apparatus of 2E embodiment according to a variation of the present invention.

FIG. 60 shows another example of the LED lighting apparatus 102E. The LED lighting apparatus 102E of this example includes a light-transmitting cover 75 and a reflective cover 76. The light-transmitting cover 75 is made of e.g. milky-white translucent resin and provided on the inner side of the support unit 20E to cover the additional light source units 30E'. The reflective cover 76 is made of e.g. white resin or aluminum. The reflective cover 76 is arranged on the inner side with respect to the additional light source units 30E' in the direction r and covers the attachment 802.

With this example again, the LED lighting apparatus 102E provides good appearance. Since the additional light source units 30E' are provided, almost entire surface of the LED lighting apparatus 102E looks bright when the LED lighting apparatus 102E is looked up from the illumination side in the figure. The provision of the reflective cover ensures that a larger amount of light from the additional light source units 30E' is emitted to the outside through the light-transmitting cover 75. The structure including the light-transmitting cover 75 is advantageous for achieving uniform light emission.

FIGS. 61-64 show other examples of the light guide 80 of the LED lighting apparatus 102E.

Figure 61:
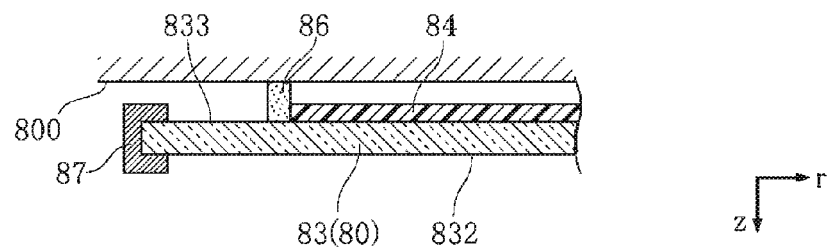
FIG. 61 is an enlarged sectional view showing a principal portion of another example of LED lighting apparatus of 2E embodiment according to a variation of the present invention.

In the example shown in FIG. 61, a wall portion 86 is provided on the installation side of the ring plate portion 83 in the direction z. The wall portion 86 is made of e.g. sponge or resin and held in contact with the ring plate portion 83 and the ceiling 80. In this example, the reflective layer 84 is not provided on the outer side of the wall portion 86 in the direction r. The surface of the ring plate portion 83 that is exposed toward the installation side in the direction z provides the emission surface 833. With this example, the wall portion 86 prevents dust or the like from being accumulated on the installation side of the ring plate portion 83 in the direction z. Moreover, the ceiling 800 is slightly illuminated with light emitted from the emission surface 833.

Figure 62:
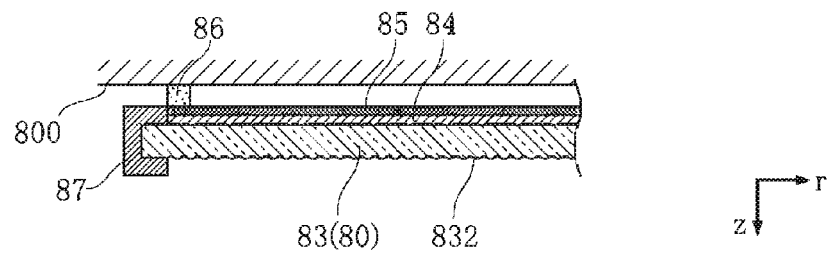
FIG. 62 is an enlarged sectional view showing a principal portion of another example of LED lighting apparatus of 2E embodiment according to a variation of the present invention.

In the example shown in FIG. 62, a reflective layer 84 and a black layer 85 are formed on the installation side of the ring plate portion 83 in the direction z. The reflective layer 84 is made of metal such as aluminum. The black layer 85 is formed by applying a black paint or comprises a black resin sheet. The reflective layer 84 and the black layer 85 extend to a position close to the outer edge of the ring plate portion 83 in the direction r. According to this example, owing to the provision of the black layer 85, the image of the LED lighting apparatus 102E is unlikely to appear on the ceiling 800. This is suitable for making the LED lighting apparatus 102E look compact.

Figure 63:
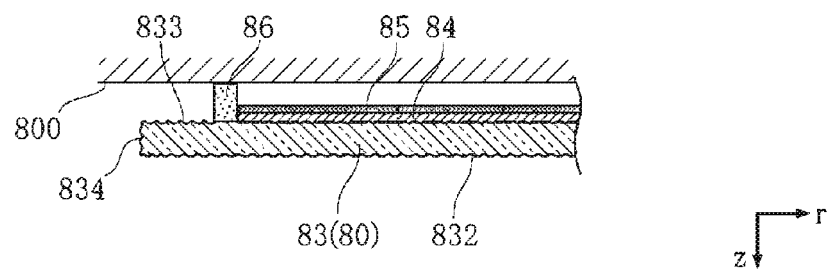
FIG. 63 is an enlarged sectional view showing a principal portion of another example of LED lighting apparatus of 2E embodiment according to a variation of the present invention.

In the example shown in FIG. 63, the reflective layer 84 and the black layer 85 are formed to reach the wall portion 86. The surface of the ring plate portion 83 that is exposed toward the installation side in the direction z provides the emission surface 833, whereas the outer end surface of the ring plate portion 83 in the direction r provides the emission surface 834. In this example, all the emission surfaces 832, 833 and 834 comprise rough surfaces. This arrangement is suitable for making the portion of the LED lighting apparatus 102E near the outer edge in the direction r brighter. The emission surfaces 832, 833, 834 comprising rough surface promote uniform light emission.

Figure 64:
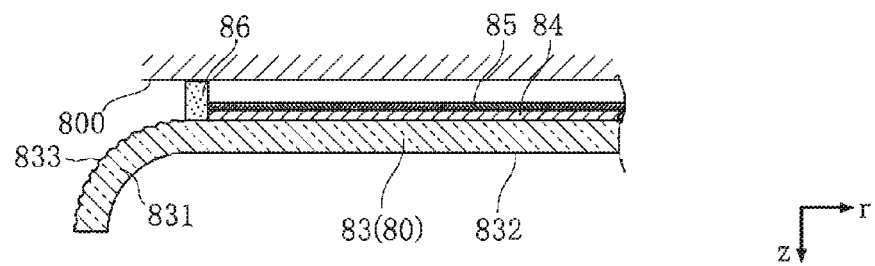
FIG. 64 is an enlarged sectional view showing a principal portion of another example of LED lighting apparatus of 2E embodiment according to a variation of the present invention.
Figure 65:
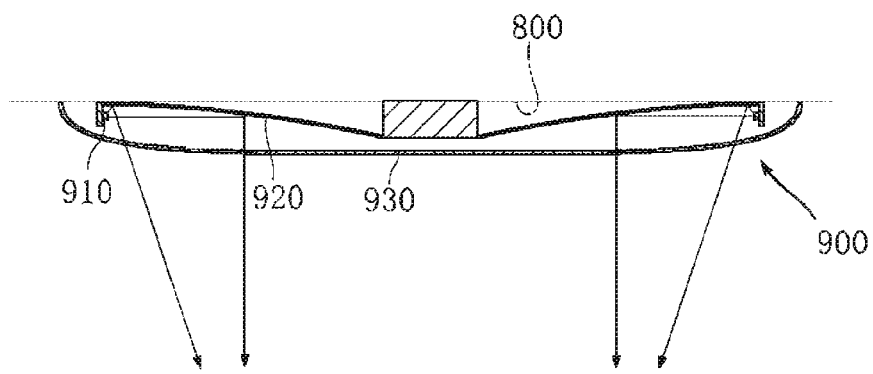
FIG. 65 is a sectional view showing an example of conventional LED lighting apparatus.

In the example shown in FIG. 64, the ring plate portion 83 includes a curved outer periphery 831. The curved outer periphery 831 is curved to be gradually displaced toward the illumination side in the direction z as proceeding radially outward in the direction r. In this example, the end surface of the curved outer periphery 831 faces the illumination side in the direction z. The outer surface of the curved outer periphery 831 in the direction r provides the emission surface 833 which comprises a rough surface. With this example again, the portion of the LED lighting apparatus 102E near the outer edge in the direction r can be made bright.

The LED lighting apparatus according to the variation of the invention is not limited to the foregoing embodiment. The specific structure of each part of the LED lighting apparatus according to the variation of the invention may be varied in design in many ways.

The feature of the present variation of the invention is described below as Appendixes.

Appendix 1

An LED lighting apparatus comprising:
a light source unit including at least one LED chip;
a support unit supporting the light source unit; and
a light-transmitting plate at least part of which is on an illumination side, which is one side in a first direction, of the support unit, the light-transmitting plate being configured to transmit light from the light source unit, wherein:
the support unit includes a plurality of side plates partitioning between an outer side, which is one side in a second direction corresponding to a radial direction with respect to an axial direction corresponding to the first direction, and an inner side, which is the other side in the second direction,
the inner side in the second direction is surrounded by the plurality of side plates,
each of the side plates is inclined to be gradually displaced outward in the second direction as proceeding from the illumination side toward an installation side opposite from the illumination side in the first direction,
the light source unit is arranged on an outer surface in the second direction of one of the side plates, and
the light-transmitting plate is in the form of a ring arranged on the illumination side in the first direction with respect to the light source unit.

Appendix 2

The LED lighting apparatus as set forth in Appendix 1, wherein the light-transmitting plate is removably attached to the support unit.

Appendix 3

The LED lighting apparatus as set forth in Appendix 2, wherein the light-transmitting plate becomes thinner as proceeding outward in the second direction.

Appendix 4

The LED lighting apparatus as set forth in Appendix 2 or 3, further comprising a cover for attaching the light-transmitting plate to the support unit.

Appendix 5

The LED lighting apparatus as set forth in any one of Appendixes 2-4, further comprising:
an attachment for mounting the LED lighting apparatus to a power supply portion provided externally of the LED lighting apparatus; and
an extension adapter including a first intermediate fitting portion to be attached to the power supply portion, a second intermediate fitting portion to be attached to the attachment, and a cable connecting the first intermediate fitting portion and the second intermediate fitting portion to each other.

Appendix 6

The LED lighting apparatus as set forth in any one of Appendixes 1-5, further comprising a diffusion reflection plate that is arranged on the installation side of the support unit in the first direction and reflects light from the light source unit.

Appendix 7

The LED lighting apparatus as set forth in Appendix 6, wherein the diffusion reflection plate includes a peripheral portion positioned in an outer region in the second direction and inclined to be gradually displaced toward the illumination side in the first direction as proceeding outward in the second direction.

Appendix 8

The LED lighting apparatus as set forth in Appendix 7, wherein the peripheral portion comprises a corrugated plate.

Appendix 9

The LED lighting apparatus as set forth in Appendix 7, wherein the peripheral portion includes a plurality of grooves.

Appendix 10

The LED lighting apparatus as set forth in any one of Appendixes 6-9, wherein the diffusion reflection plate is made of aluminum with an anodized surface.

Appendix 11

The LED lighting apparatus as set forth in any one of Appendixes 7-9, wherein the outer periphery has a highly heat-dissipative coating.

Appendix 12

An LED lighting apparatus comprising:
a light source unit including at least one LED chip; and
a support unit supporting the light source unit, wherein:
the support unit includes a plurality of side plates partitioning between an outer side, which is one side in a second direction corresponding to a radial direction with respect to an axial direction corresponding to a first direction, and an inner side, which is the other side in the second direction,
the inner side in the second direction is surrounded by the plurality of side plates,
each of the side plates is inclined to be gradually displaced inward in the second direction as proceeding from the illumination side toward an installation side opposite from the illumination side in the first direction,
the light source unit is arranged on an outer surface in the second direction of one of the side plates, and
the LED lighting apparatus further comprises a light guide including an incident surface on which light from the light source unit becomes incident and a ring plate portion positioned on the installation side in the first direction with respect to the incident surface, a surface of the ring plate portion that is on the illumination side in the first direction providing an emission surface.

Appendix 13

The LED lighting apparatus as set forth in Appendix 12, wherein: the light guide includes a recess accommodating the LED chip, and
the recess includes an inner surface part of which constitutes the incident surface.

Appendix 14

The LED lighting apparatus as set forth in Appendix 13, wherein: the light source unit includes a substrate on which the LED chip is mounted,
the light guide includes a bottom surface facing the substrate, and
the recess is formed in the bottom surface.

Appendix 15

The LED lighting apparatus as set forth in Appendix 14, wherein the light guide includes a constricted portion having a cross section that reduces as proceeding from the bottom surface in a direction in which the substrate faces.

Appendix 16

The LED lighting apparatus as set forth in Appendix 15, wherein the light guide includes a bent portion connecting the constricted portion and the ring plate portion to each other.

Appendix 17

The LED lighting apparatus as set forth in Appendix 15 or 16, wherein the support unit includes an engagement portion that engages the constricted portion of the light guide at a portion on the illumination side in the first direction.

Appendix 18

The LED lighting apparatus as set forth in any one of Appendixes 12-17, further comprising a light-shielding member covering an outer edge of the ring plate portion.

Appendix 19

The LED lighting apparatus as set forth in any one of Appendixes 12-18, further comprising a reflective layer covering the ring plate portion on the installation side in the first direction.

Appendix 20

The LED lighting apparatus as set forth in Appendix 19, further comprising a black layer covering the reflective layer on the installation side in the first direction.

Appendix 21

The LED lighting apparatus as set forth in any one of Appendixes 12-20, wherein the ring plate portion includes a curved outer periphery curved to be gradually displaced toward the illumination side in the first direction as proceeding outward in the second direction.

Appendix 22

The LED lighting apparatus as set forth in any one of Appendixes 12-21, further comprising a wall portion projecting from the ring plate portion toward the installation side in the first direction.

Appendix 23

The LED lighting apparatus as set forth in any one of Appendixes 12-22, further comprising an additional light source unit placed on an inner side of the side plate.

Appendix 24

The LED lighting apparatus as set forth in Appendix 23, further comprising an additional light-transmitting cover that covers the additional light source unit.

Appendix 25

The LED lighting apparatus as set forth in Appendix 24, further comprising a reflective cover arranged inward of the light-transmitting cover and reflects light from the additional light source unit.

1F Embodiment

FIGS. 66-71 show an example of LED lighting apparatus according to a variation of the present invention. The LED lighting apparatus 101F of the present embodiment includes a support unit 200F, a plurality of LED modules 300, a power source unit 400, a receiver 500 and a cover 600. The LED lighting apparatus 101F is configured to be attached to e.g. a power supply portion 801 in a ceiling 800 via an attachment 802 for use as a ceiling light. It is to be noted that illustration of almost entirety of the cover 600 is omitted in FIG. 70 for easier understanding.

Figure 68:
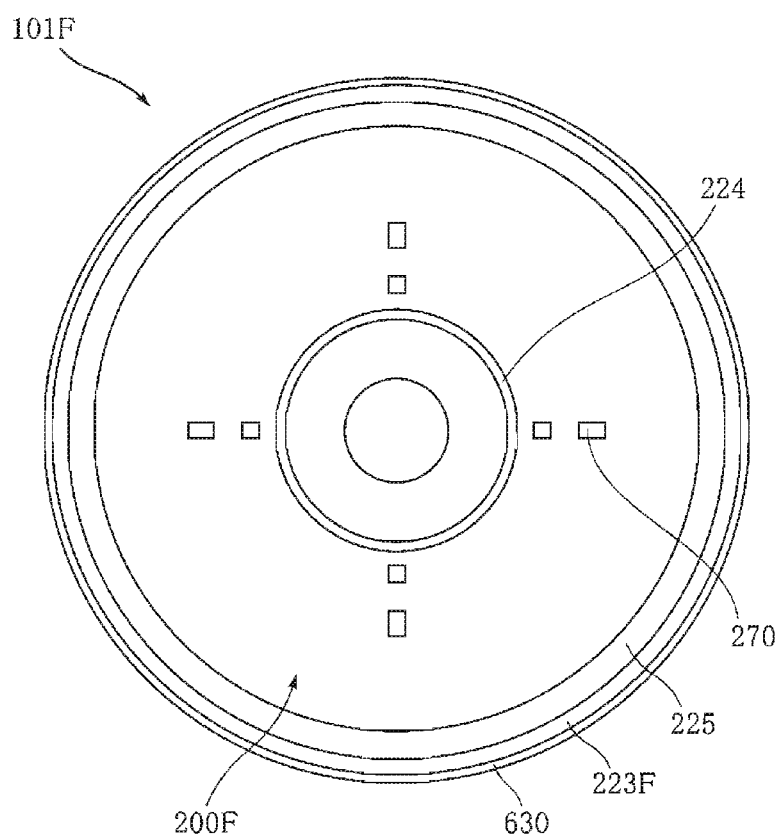
FIG. 68 is a bottom view of the LED lighting apparatus shown in FIG. 66.
Figure 69:
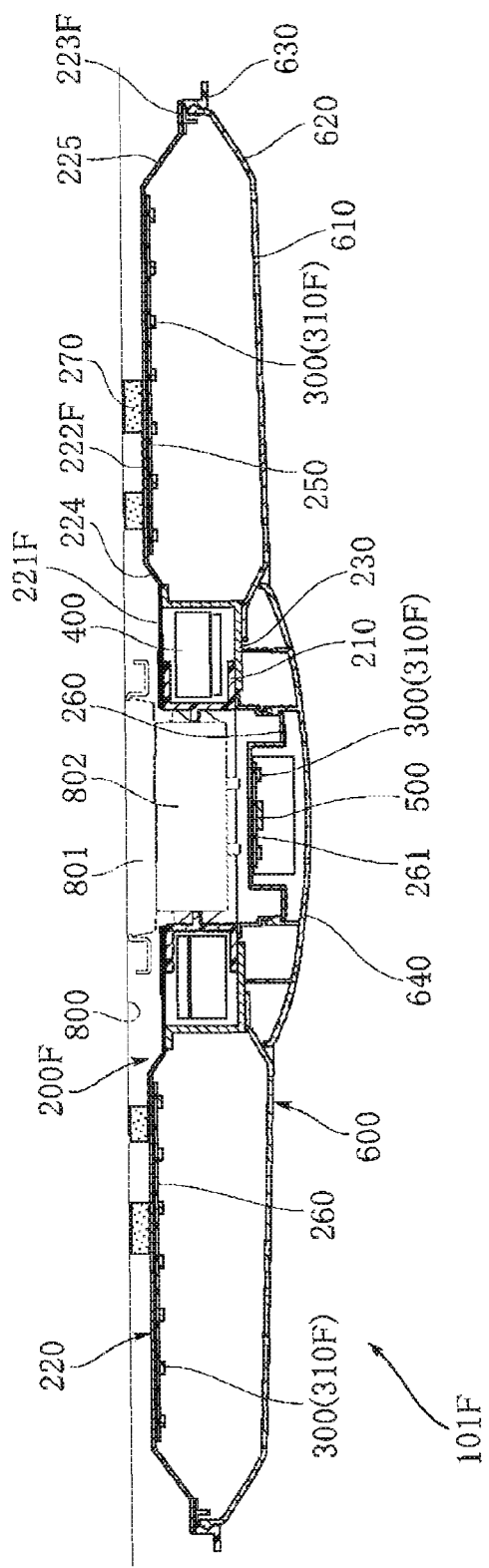
FIG. 69 is a sectional view taken along lines IV-IV in FIG. 66.
Figure 70:
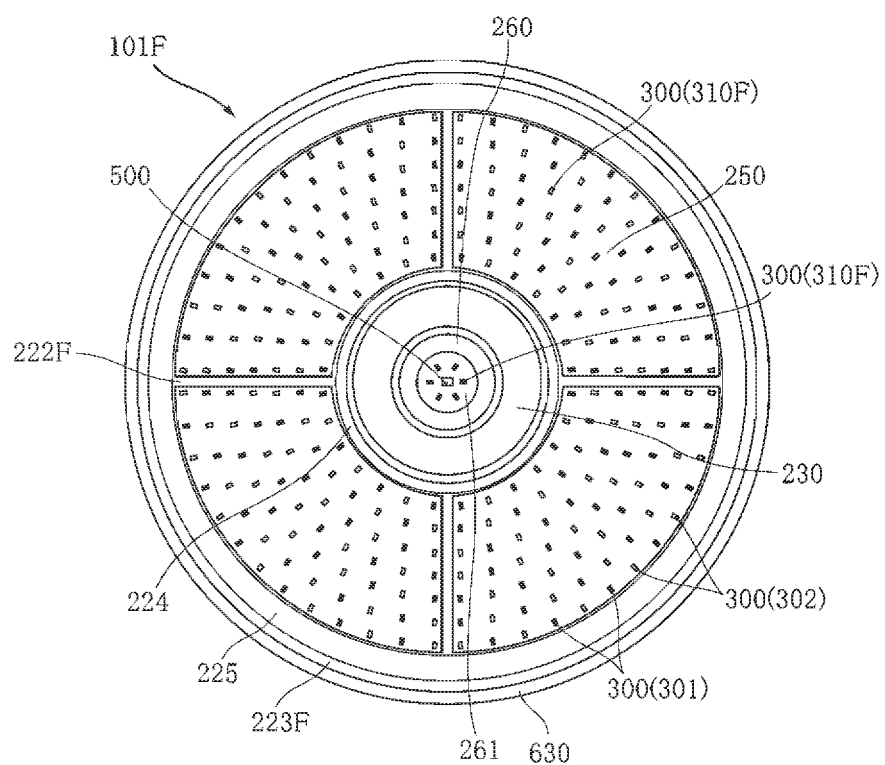
FIG. 70 is a plan view of the LED lighting apparatus shown in FIG. 66, with a cover removed.

The support unit 200F constitutes the support structure of the LED lighting apparatus 101F and includes a central member 210, a support plate 220 and a pressing member 230, as shown in FIGS. 68-70. The central member 210 is in the form of a ring having a generally U-shaped cross section and made as a one-piece member using a resin having a predetermined strength.

The support plate 220 is a member for supporting the LED modules 300 and made by press-working a metal plate, for example. The support plate 220 includes a connection portion 221F, an LED mount region 222F, and a peripheral portion 223F each of which is in the form of a ring. The connection portion 221F is a portion connected to the central member 210. As shown in FIG. 69, the connection portion 221F overlaps the upper side, i.e., the ceiling 800 side, (installation side in the first direction of the present variation) of the central member 210 and is fixed to the upper end of the central member 210 by using e.g. a screw. As shown in FIGS. 69 and 70, the LED mount region 222F surrounds the connection portion 221F as viewed in plan. The LED mount region 222F is a region where the LED modules 300 are mounted, and positioned on the upper side in FIG. 69 (installation side) with respect to the connection portion 221F. The LED mount region 222F is in the form of a ring having an outer diameter of about e.g. 250 mm. The LED mount region 222F has a lower surface facing downward in the figure (toward the illumination side in the first direction of the present variation) i.e., opposite side of the ceiling 800. The lower surface extends along a plane perpendicular to the vertical direction in the figure.

As shown in FIG. 69, a height differentiating portion 224 is provided between the LED mount region 222F and the connection portion 221F. The edge of the height differentiating portion 224 that is closer to the LED mount region 222F is positioned on an upper side in the figure (the installation side) with respect to the edge of the height differentiating portion 224 that is closer to the connection portion 221F. The height differentiating portion 224 is inclined to be displaced toward the upper side in the figure (installation side) as proceeding away from the connection portion 221F outward within a plane perpendicular to the vertical direction.

The peripheral portion 223F surrounds the LED mount region 222F and positioned on the lower side in the figure (illumination side) with respect to the LED mount region 222F. A height differentiating portion 225 is provided between the LED mount region 222F and the peripheral portion 223F. The height differentiating portion 225 is inclined to be displaced toward the lower side in the figure (illumination side) as proceeding away from LED mount region 222F outward within a plane perpendicular to the vertical direction. The height differentiating portion 225 corresponds to an additional height differentiating portion in the present variation of the invention.

In the support plate 220, the respective lower surfaces of the height differentiating portion 224, the LED mount region 222F, and the height differentiating portion 225 (lower surfaces in FIG. 69) are painted white and hence made highly reflective surfaces having high light reflectance. The respective upper surfaces of the LED mount region 222F, the height differentiating portion 225 and the peripheral portion 223F (the ceiling 800—side surface of the support plate 220, i.e., upper surfaces in FIG. 69) are made black or dark gray close to black by painting, for example. A plurality of cushioning members 270 are provided on the surface of the support plate 220 on the ceiling 800 side.

The pressing member 230 is in the form of a ring having an L-shaped cross section and formed by e.g. press-working a metal plate. The outer edge of the pressing member 230 overlaps the connection portion 221F and fixed to the connection portion 221F by using e.g. a screw. The inner edge of the pressing member 230 overlaps the central member 210 and fixed to the lower end of the central member 210 by using e.g. a screw.

As will be understood from the above, the central member 210, the connection portion 221F and the pressing member 230 form a hollow ring-shaped portion having a rectangular cross section. The central member 210, the connection portion 221E' and the pressing member 230 provide an attachment region in the present variation of the invention.

The LED modules 300 are mounted to the lower surface of the LED mount region 222F via a plurality of LED substrates 250. Each of the LED substrates 250 is an insulating substrate made of e.g. glass-fiber-reinforced epoxy resin and in the form of a ring segment. A plurality of LED modules 300 are mounted on each of the LED substrates 250. In the present embodiment, four LED substrates 250 are arranged adjacent to each other to form the shape of a ring as a whole.

Figure 71:
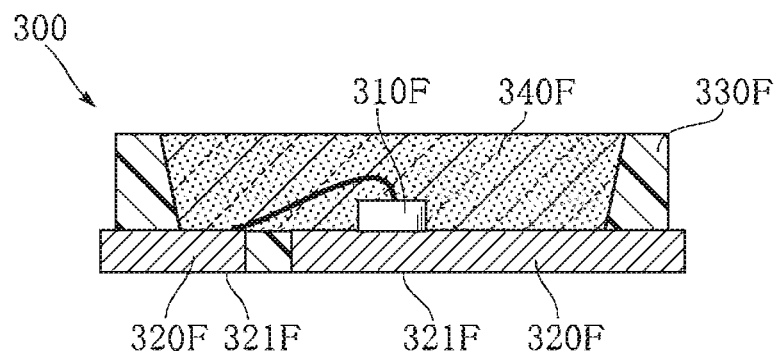
FIG. 71 is a sectional view showing an example of LED module used for the LED lighting apparatus of FIG. 66.

Each of the LED modules 300 is in the form of an elongated rectangle as viewed in plan. FIG. 71 is a sectional view of the LED module 300 in a plane perpendicular to the width direction. As shown in the figure, the LED module 300 includes a pair of leads 320F, an LED chip 310F, a sealing resin 340F and a case 330F. The paired leads 320F are made of e.g. Cu alloy. The LED chip 310F is mounted on one of the leads 320F. The surfaces of the leads 320F opposite from the surface on which the LED chip 310F is mounted serve as mounting terminals 321F for surface-mounting the LED module 300. The LED chip 310F is the light source of the LED module 300 and is configured to emit e.g. blue light. The sealing resin 340F protects the LED chip 310F. The sealing resin 340F is made of a light-transmitting resin material containing a fluorescent substance that emits yellow light when excited by light from the LED chip 310F. According to this structure, the LED module 300 can be configured to emit light of a desired color temperature. Instead of the fluorescent substance that emits yellow light, mixture of a fluorescent substance that emits red light and a fluorescent substance that emits green light may be used. The case 330E' is made of e.g. white resin and reflects the light traveling toward the sides from the LED chip 310F in the upward direction. An LED of a type that uses two wires for connection to the paired leads 320F may be employed as the LED chip 310F.

All the LED modules 300 may be the LED modules configured to emit light of an incandescent color or those configured to emit light of a daylight white color. Alternatively, the LED modules 300 may comprise a combination of these two types of LED modules. In this embodiment, LED modules of an incandescent color and LED modules of a daylight white color are employed. That is, the LED modules 300 consist of LED modules 301 for emitting an incandescent color and LED modules 302 for emitting a daylight white color 302. For easier understanding, the incandescent color LED modules 301 are illustrated in black in FIG. 70.

In the present embodiment, the LED modules 300 are arranged on the LED mount region 222F to form seven concentric circles as viewed in plan. In each of the circles of the LED modules 300, the incandescent color LED modules 301 and the daylight white color LED modules 302 are alternately arranged.

In this embodiment, as shown in FIG. 69, a support stay 260 is provided in the cover 600. The support stay 260 is arranged below the central member 210 in the figure. Below the support stay 260 is provided an annular LED substrate 261. A plurality of LED modules 300 are mounted on a circle on the LED substrate 261. All the LED modules 300 are incandescent color modules 301.

The power source unit 400 converts e.g. commercial AC of 100 V supplied through a power supply portion 801 in the ceiling 800 to DC power suitable for lighting the LED chips 310F and supplies the power to the LED modules 300. The power source unit 400 includes e.g. a transformer, a capacitor, a resistor, a diode and an IC. The power source unit 400 is configured to individually control the brightness of the incandescent color LED modules 301 and the brightness of the daylight white color LED modules 302. With this arrangement, the LED lighting apparatus 101F can emit light of a desired color from the incandescent color to the daylight white color. The power source unit 400 can turn on or off the LED modules 300 supported on the support stay 260 (LED substrate 261) separately from other LED modules 300. In the present embodiment, as shown in FIG. 69, the power source unit 400 is accommodated in the hollow ring-shaped portion made up of the central member 210, the connection portion 221F, and the pressing member 230.

The receiver 500 receives a signal transmitted from a transmitting portion, not shown, and is mounted on the LED substrate 261 in the present embodiment. The signal received by the receiver 500 is sent to the power source unit 400. In accordance with the signal instruction, the power source unit 400 controls the lighting state of the LED modules 300.

The cover 600 constitutes most of the appearance of the LED lighting apparatus 101F and includes a main illumination portion 610, an inclined portion 620, an outer frame 630 and a center portion 640. The main illumination portion 610 is made of e.g. milky-white translucent resin. Most part of the light from LED chips 310F (LED modules 300) passes through the main illumination portion 610 to be emitted to the outside. The main illumination portion 610 is in the form of a ring corresponding to the shape of the LED mount region 222F and covers the LED mount region 222F. As shown in FIG. 69, the main illumination portion 610 is slightly inclined to be displaced downward in the figure as proceeding toward the center.

Figure 66:
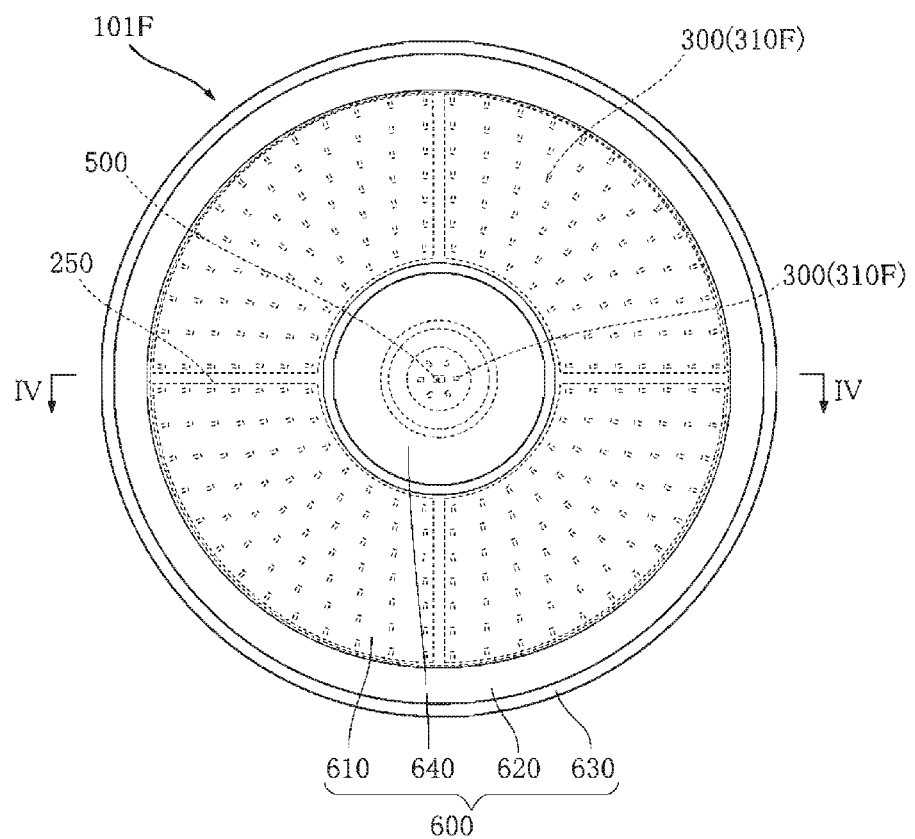
FIG. 66 is a plan view showing an LED lighting apparatus of 1F embodiment according to a variation of the present invention.
Figure 67:
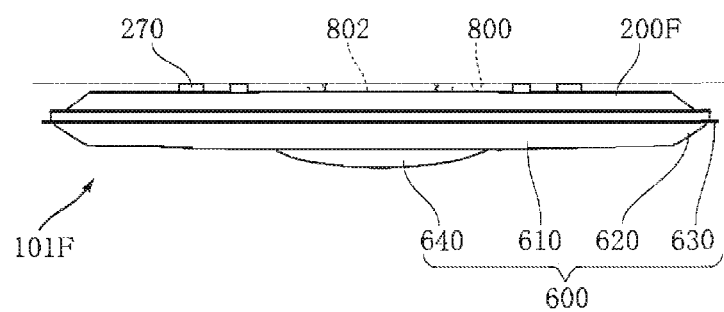
FIG. 67 is a side view of the LED lighting apparatus shown in FIG. 66.

The inclined portion 620 is connected to the outer periphery of the main illumination portion 610 to surround the main illumination portion 610 from outside. The inclined portion 620 is inclined to be displaced upward in the figure (installation side) as proceeding away from the center. As shown in FIGS. 66 and 69, the inclined portion 620 is positioned on the outer side with respect to the LED mount region 222F as viewed in plan (viewed in the first direction).

The outer frame 630 surrounds the inclined portion 620 from outside and is in the form of a ring. The outer frame 630 is made of e.g. a transparent resin or a milky white translucent resin. The outer frame 630 is arranged to overlap the peripheral portion 223F of the support plate 220 and fixed to the peripheral portion 223F. The center portion 640 is made of e.g. a milky white translucent resin and arranged on the inner side of the main illumination portion 610. The center portion 640 covers the support stay 260.

The advantages of the LED lighting apparatus 101F are described below.

According to the present embodiment, as described with reference to FIG. 69, a height differentiating portion 224 is provided between the LED mount region 222F and the connection portion 221F (attachment region). The edge of the height differentiating portion 224 that is closer to the LED mount region 222F is positioned on the upper side in the figure (the installation side) with respect to the edge of the height differentiating portion 224 that is closer to the connection portion 221F. Thus, the LED mount region 222F is retreated toward the ceiling 800 side (installation side), so that the light path from the LED chips 310F (LED modules 300) mounted on the LED mount region 222E' to the cover 600 (main illumination portion 610) is made relatively long. Although the light emitted from the LED chips 310F (LED modules 300) has a relatively high directivity, owing to the long light path to the cover 600, unevenness of brightness is suppressed with respect to the light emitted from the cover 600 to the outside. Thus, the LED lighting apparatus 101F can uniformly illuminate the room, while achieving enhanced appearance.

The height differentiating portions 224, 225 are inclined and the lower surface of these height differentiating portions 224, 225 are made highly reflective surfaces. Thus, light emitted from the LED chips 310F (LED modules 300) is efficiently directed toward the illumination side. The LED lighting apparatus 101F having this arrangement is suitable for uniform illumination with increased brightness.

The cover 600 includes the inclined portion 620 on the outer side of the main illumination portion 610, which is inclined to be displaced toward the ceiling 800 side as proceeding outward. With the provision of this inclined portion 620, the appearance of the LED lighting apparatus 101F is enhanced. The outer frame 630 surrounding the inclined portion 620 and the peripheral portion 223F of the support plate 220 overlapping the outer frame 630 provide a thin outer circumferential edge of the LED lighting apparatus 101F. Generally, before attaching the LED lighting apparatus to the ceiling 800 or in the process of attaching or detaching the LED lighting apparatus to the ceiling 800, the LED lighting apparatus 101F is held at the outer circumferential edge. Since the outer circumferential edge is thin, the LED lighting apparatus 101F is carried easily with hands. Such thin outer circumferential edge also enhances the appearance.

The surfaces of the LED mount region 222F, the height differentiating portion 225 and the peripheral portion 223F on the ceiling side (installation side) are made black or dark gray close to black (so-called contractive color). Thus, the LED lighting apparatus 101F has good appearance even when it is not attached to the ceiling 800.

The attachment region made up of the central member 210, the connection portion 221F and the pressing member 230 support the weight of most part of LED lighting apparatus 101F including the support plate 220 and the cover 600, so that a large load is exerted on the attachment region. In the present embodiment, the central member 210, the connection portion 221F and the pressing member 230 form a hollow ring-shaped portion having a rectangular cross section. The attachment region comprising such a hollow ring-shaped portion having a rectangular cross section has a relatively high mechanical strength, which is advantageous.

With the provision of the inclined height differentiating portion 224 in the support plate 220, the strength is enhanced due to work hardening.

By the provision of incandescent color LED modules 301 and daylight white color LED modules 302, light of a desired color temperature from the incandescent color to the daylight color can be emitted from the LED lighting apparatus 101F. The provision of the receiver 500 allows adjustment of the color temperature and turn-on and off of the LED lighting apparatus 101F to be performed properly from a distant position. The space in the hollow ring-shaped portion made up of the central member 210, the connection portion 221F and the pressing member 230 is efficiently used for accommodating the power source unit 400, so that the LED lighting apparatus 101F has no useless space.

FIGS. 72-76 show other embodiments of this variation of the present invention. In these figures, the elements that are identical or similar to those of the foregoing embodiments are designated by the same reference signs as those used for the foregoing embodiment.

2F Embodiment

Figure 72:
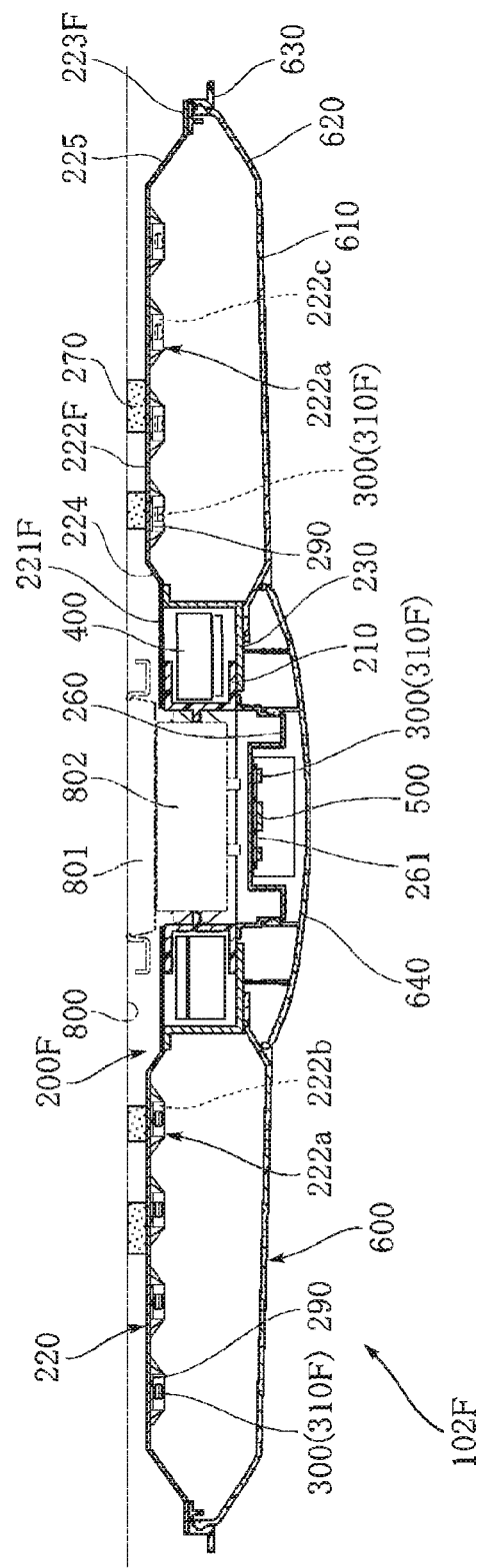
FIG. 72 is a sectional view corresponding to FIG. 69, showing an LED lighting apparatus of 2F embodiment according to a variation of the present invention.
Figure 73:
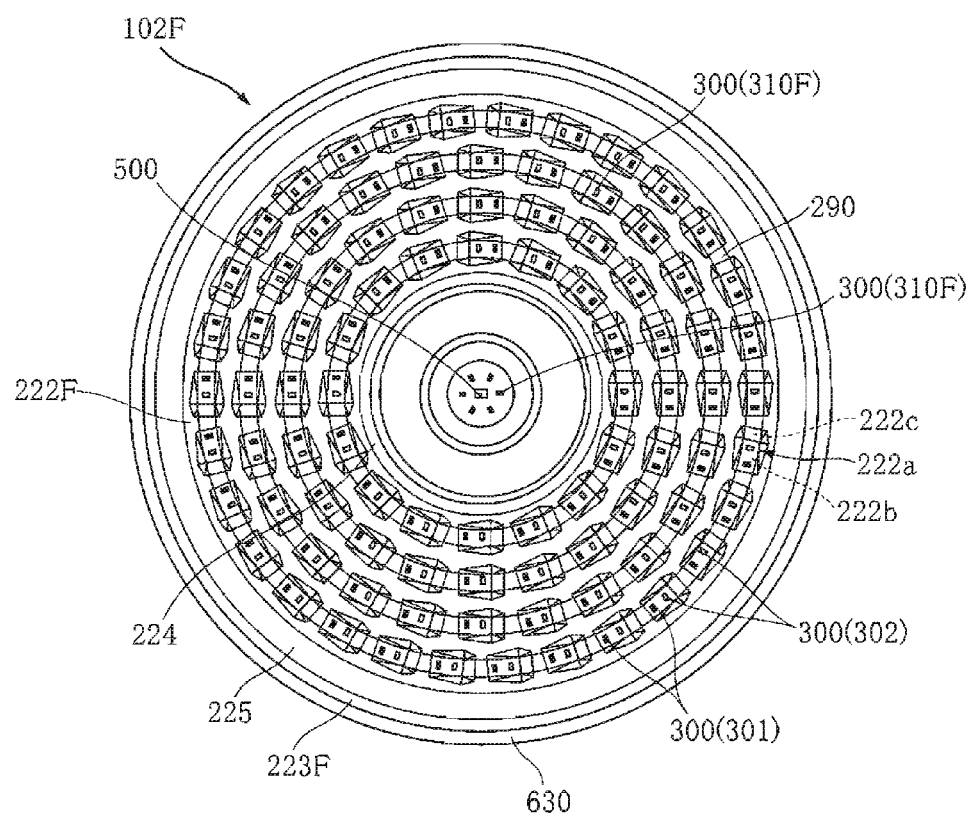
FIG. 73 is a plan view of the LED lighting apparatus shown in FIG. 72, with a cover removed.
Figure 74:
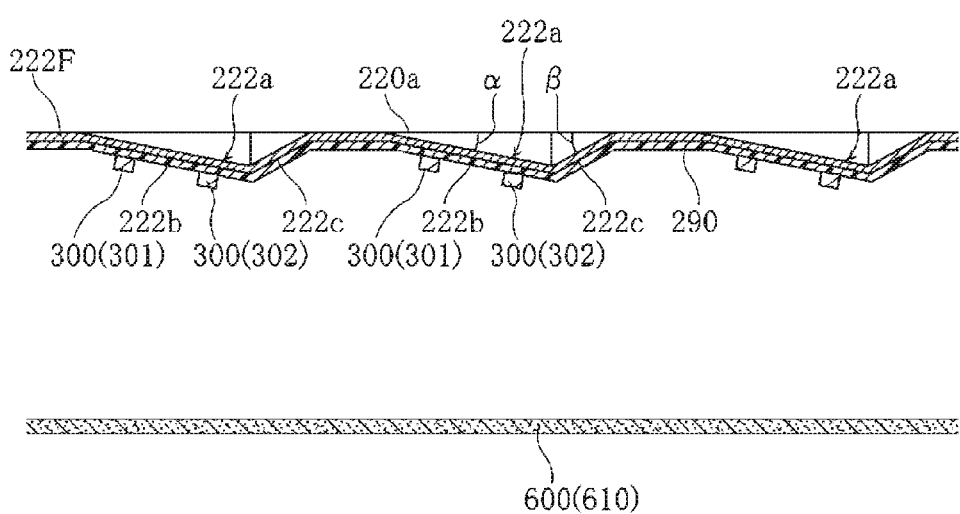
FIG. 74 is a vertical sectional view along a circumferential direction of an LED mount region of the LED lighting apparatus shown in FIG. 72.

FIGS. 72-74 show an LED lighting apparatus 102F according to 2F embodiment of the variation of the present invention. The LED lighting apparatus 102F of the present embodiment mainly differs from the foregoing embodiment in structure of the LED mount region 222F.

In the present embodiment, as shown in FIGS. 72 and 73, the LED mount region 222F has a plurality of mountain portions 222a on its lower side in the figure (illumination side). Each of the mountain portions 222a includes two surfaces 222b and 222c (second surface and third surface) which are inclined with respect to a surface 220a (first surface) perpendicular to the vertical direction. As shown in FIG. 73, the surface 222b and the surface 222c adjoin with each other in the circumferential direction of the LED mount region 222F. As shown in FIG. 74, the inclination angle α of the surface 222b with respect to the surface 220a is smaller than the inclination angle β of the surface 222c with respect to the surface 220a. Thus, the surface 222b has a relatively gentle inclination. The inclination angle α of the surface 222b is in the range of e.g. 5° to 20°.

In the present embodiment, as shown in FIG. 73, the mountain portions 222a are aligned in the circumferential direction of the LED mount region 222F to form four concentric circles as viewed in plan. The mountain portions 222a are made by e.g. press working.

In the present embodiment, the LED modules 300 are mounted on the LED mount region 222F via a flexible substrate 290. Specifically, the flexible substrate 290 comprises a resin layer and a metal layer providing a wiring pattern (not shown), and is in the form of a ring to cover the surfaces 222b, 222c of the mountain portions 222a aligned in the circumferential direction of the LED mount region 222F. The LED modules 300 are mounted on the flexible substrate 290. The LED modules 300 are mounted on the surfaces 222b. On each of the surfaces 222b, an incandescent color LED module 301 and a daylight white color LED module 302 are mounted as aligned in the circumferential direction of the LED mount region 222F. Thus, on the flexible substrate 290, the incandescent color LED modules 301 and the daylight white color LED modules 302 are alternately arranged in the circumferential direction of the LED mount region 222F. As the flexible substrate 290, a plate with white resist to provide a high reflectance may be suitably used.

In the LED lighting apparatus 102F according to the present embodiment, a height differentiating portion 224 is provided between the LED mount region 222F and the connection portion 221F (attachment region). Owing to the height differentiating portion 224, the LED mount region 222F is retreated toward the ceiling 800 side (installation side) opposite from the illumination side. Thus, the light path from the LED chips 310F (LED modules 300) mounted on the LED mount region 222F to the cover 600 (main illumination portion 610) is made relatively long. Owing to the long light path, unevenness of brightness is suppressed with respect to the light emitted from the cover 600 to the outside. Thus, the LED lighting apparatus 102F can uniformly illuminate the room, while achieving enhanced appearance.

The LED modules 300 are mounted on the surfaces 222b inclined with respect to the surface 220a perpendicular to the vertical direction (see FIG. 74). This arrangement makes the light path from the LED modules 300 to the cover 600 longer. This arrangement is suitable for achieving uniform illumination with reduced unevenness in brightness. The surface 222b on which the LED modules 300 are mounted are gently inclined, and a plurality of LED modules 300 (two in the present embodiment) are mounted on each of the surfaces 222b. This structure allows efficient placing of the LED modules 300 on the surfaces 222. Further, the surfaces 222b and 222c, which make each mountain portion 222a, adjoin each other in the circumferential direction of the LED mount region 222F, and the plurality of such mountain portions 222a are arranged in the circumferential direction. With this structure, the LED modules 300 are properly mounted on the surfaces 222b by using the ring-shaped flexible substrate 290. Since the flexible substrate 290 is made white, light from the LED chips 310F (LED modules 300) is reflected by the flexible substrate 290, whereby the brightness of the light from the LED lighting apparatus 102F is expected to increase.

On each of the surfaces 222b are mounted an incandescent color LED module 301 and a daylight white color LED module 302, and the incandescent color LED module 301 and the daylight white color LED module 302 forming one pair are arranged close to each other. For instance, when lighting of only the incandescent color is demanded, all the daylight white color LED modules 302 are turned off. Since the incandescent color LED module 301 and the daylight white color LED module 302 in each pair are close to each other, the density of the LED modules 300 as the light-emitting points does not differ largely between when only the incandescent color LED modules 301 are turned on and when all the LED modules 300 are turned on. Thus, according to this arrangement, brightness variations caused by color temperature adjustment is suppressed.

3F Embodiment

Figure 75:
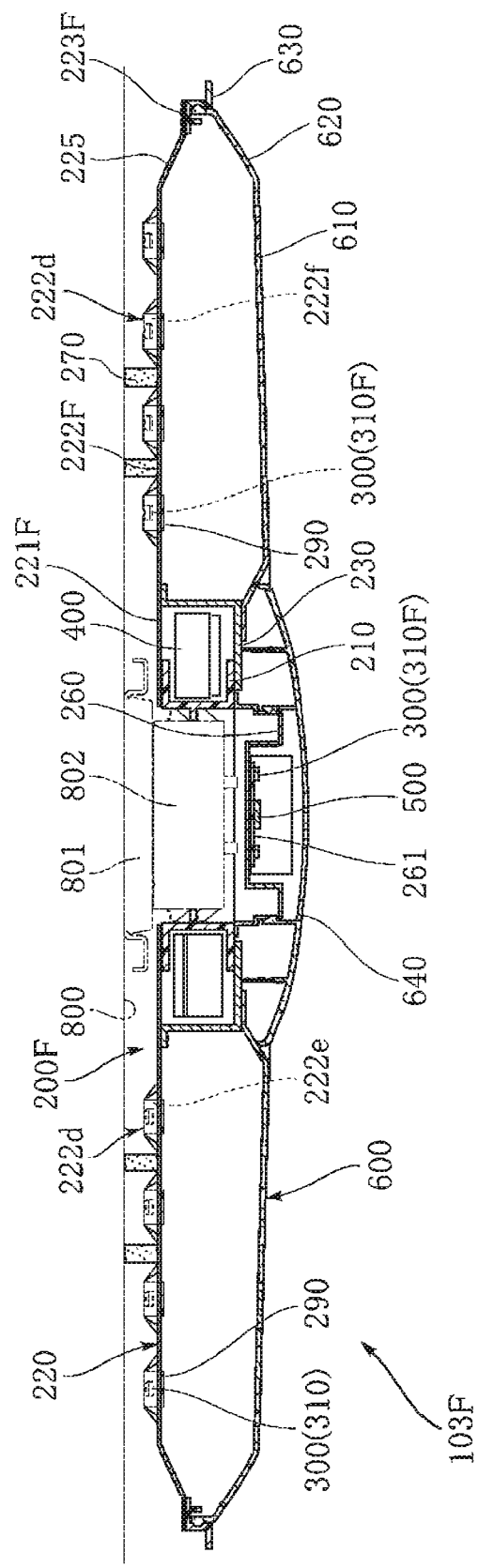
FIG. 75 is a sectional view corresponding to FIG. 69, showing an LED lighting apparatus of 3F embodiment according to a variation of the present invention.
Figure 76:
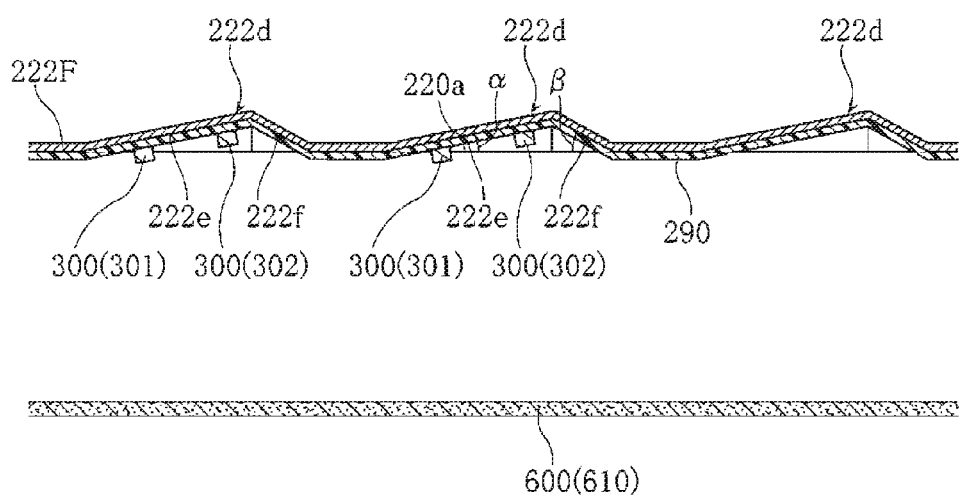
FIG. 76 is a vertical sectional view along a circumferential direction of an LED mount region of the LED lighting apparatus shown in FIG. 75.
Figure 77:
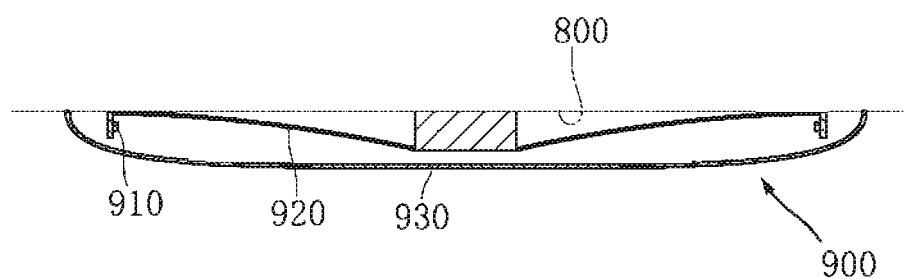
FIG. 77 is a sectional view showing an example of conventional LED lighting apparatus.
Figure 78:
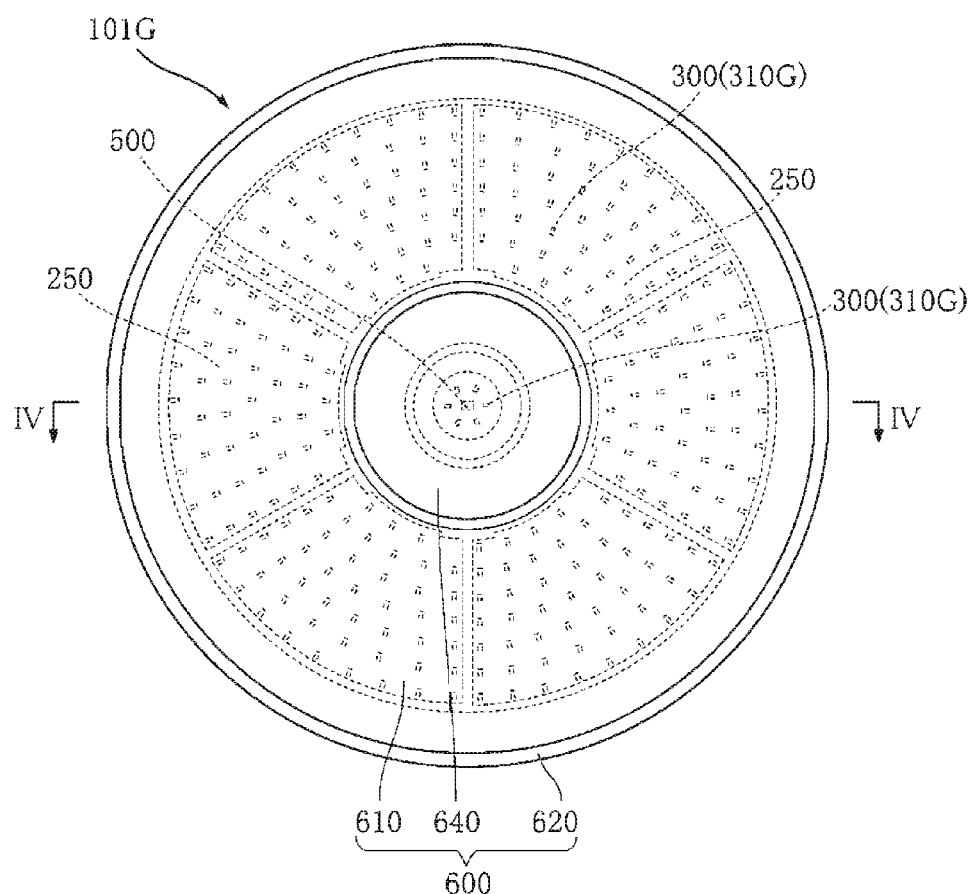
FIG. 78 is a plan view showing an LED lighting apparatus of 1G embodiment according to a variation of the present invention.
Figure 79:
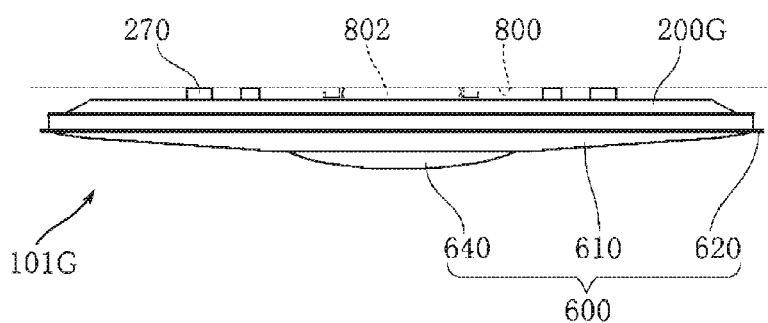
FIG. 79 is a side view of the LED lighting apparatus shown in FIG. 78.

FIGS. 75 and 76 show an LED lighting apparatus 103F according to 3F embodiment of the variation of the present invention. The LED lighting apparatus 103F of the present embodiment mainly differs from the foregoing embodiment in structure of the LED mount region 222F.

In the present embodiment, a height differentiating portion is not provided between the connection portion 221F and the LED mount region 222F, and the LED mount region 222F is connected to the outer periphery of the connection portion 221F in flush with the connecting portion.

In the present embodiment, the LED mount region 222F has a plurality of mountain portions 222d on its upper side in the figure (installation side). Each of the mountain portions 222d includes two surfaces 222e and 222f which are inclined with respect to a surface 220a perpendicular to the vertical direction. In this embodiment, the projecting direction of the mountain portions 222d is opposite from that of the mountain portions 222a of the above-described LED lighting apparatus 102F. The surface 222e and the surface 222f are inclined surfaces corresponding to the surface 222b and the surface 222c, respectively, of the LED lighting apparatus 102F. Though not illustrated, the surface 222e and the surface 222f adjoin with each other in the circumferential direction of LED mount region 222F. As shown in FIG. 76, the inclination angle α of the surface 222e with respect to the surface 220a is smaller than the inclination angle β of the surface 222f with respect to the surface 220a. Thus, the surface 222e has a relatively gentle inclination. The mountain portions 222d are aligned in the circumferential direction of the LED mount region 222E to form four concentric circles. The LED modules 300 are mounted on the surfaces 222e via a flexible substrate 290.

In the LED lighting apparatus 103F, the LED modules 300 are mounted on the surfaces 222e inclined with respect to the surface 220a perpendicular to the vertical direction (see FIG. 76). This arrangement makes the light path from the LED modules 300 to the cover 600 longer. This arrangement is suitable for achieving uniform illumination with reduced unevenness in brightness.

The surface 222f, which is adjacent to the surface 222e on which the LED modules 300 are mounted, has an inclination angle β that is larger than the inclination angle α of the surface 222e. Thus, the surface 222f (more specifically, the flexible substrate 290 on the surface 222f) serves as a reflective surface. The LED lighting apparatus 103F having this structure is suitable for achieving uniform illumination with increased brightness.

The LED lighting apparatus according to the variation of the invention is not limited to the foregoing embodiment. The specific structure of each part of the LED lighting apparatus according to the variation of the invention may be varied in design in many ways.

The feature of the present variation of the invention is described below as Appendixes.

Appendix 1

An LED lighting apparatus comprising:
a support unit including an LED mount region in the form of a ring facing an illumination side which is one side in a first direction, and an attachment region to be attached to a power supply portion, the attachment region being surrounded by the LED mount region in a second direction and a third direction which are perpendicular to the first direction and perpendicular to each other;
a plurality of LED chips mounted on the LED mount region; and
a cover that is arranged on the illumination side in the first direction with respect to the LED mount region and transmits light from the LED chips,
wherein a height differentiating portion is provided between the LED mount region and the attachment region, an edge of the height differentiating portion that is closer to the LED mount region is displaced toward an installation side, which is the other side in the first direction, from an edge of the height differentiating portion that is closer to the attachment region.

Appendix 2

The LED lighting apparatus as set forth in Appendix 1, wherein the height differentiating portion is inclined to be displaced toward the installation side in the first direction as proceeding away from the attachment region in the second and the third directions.

Appendix 3

The LED lighting apparatus as set forth in Appendix 1 or 2, wherein a surface of the height differentiating portion on the illumination side in the first direction comprises a light reflective surface having a high light reflectance.

Appendix 4

The LED lighting apparatus as set forth in any one of Appendixes 1-3, wherein the support unit further includes a peripheral portion in the form of a ring surrounding the LED mount region in the second and the third directions and positioned on the illumination side in the first direction with respect to the LED mount region, and an additional height differentiating portion positioned between the peripheral portion and the LED mount region.

Appendix 5

The LED lighting apparatus as set forth in Appendix 4, wherein the additional height differentiating portion is inclined to be displaced toward the illumination side in the first direction as proceeding away from a center in the second and the third directions.

Appendix 6

The LED lighting apparatus as set forth in Appendix 4 or 5, wherein surfaces of the LED mount region and the additional height differentiating portion on the installation side in the first direction are made black or dark gray close to black.

Appendix 7

The LED lighting apparatus as set forth in any one of Appendixes 4-6, wherein the cover includes an outer frame in the form of a ring overlapping the peripheral portion of the support unit as viewed in the first direction, and an inclined portion surrounded by the outer frame and inclined to be displaced toward the installation side in the first direction as proceeding away from a center in the second and the third directions.

Appendix 8

The LED lighting apparatus as set forth in Appendix 7, wherein the inclined portion is positioned on an outer side with respect to the LED mount region as viewed in the first direction.

Appendix 9

The LED lighting apparatus as set forth in any one of Appendixes 1-8, wherein the attachment region includes a hollow ring-shaped portion having a rectangular cross section.

Appendix 10

The LED lighting apparatus as set forth in any one of Appendixes 1-9, wherein: the LED mount region includes a second surface inclined with respect to a first surface extending along the first direction and the second direction, and the LED chips are mounted on the second surface.

Appendix 11

The LED lighting apparatus as set forth in Appendix 10, wherein the LED mount region is provided with a plurality of mountain portions each of which includes the second surface and a third surface adjoining the second surface and projects toward one of the illumination side and the installation side in the first direction.

Appendix 12

The LED lighting apparatus as set forth in Appendix 11, wherein all of the mountain portions project toward the illumination side in the first direction.

Appendix 13

The LED lighting apparatus as set forth in Appendix 11 or 12, wherein the third surface is inclined with respect to the first surface at an inclination angle larger than an inclination angle of the second surface with respect to the first surface.

Appendix 14

The LED lighting apparatus as set forth in any one of Appendixes 11-13, wherein the LED mount region is in the form of a ring as viewed in the first direction.

Appendix 15

The LED lighting apparatus as set forth in Appendix 14, wherein the second surface and the third surface adjoin with each other in a circumferential direction of the LED mount region.

Appendix 16

The LED lighting apparatus as set forth in Appendix 14 or 15, wherein at least two of the LED chips are mounted on each of the second surfaces.

Appendix 17

The LED lighting apparatus as set forth in any one of Appendixes 14-16, further comprising a plurality of LED modules each including the LED chip and a sealing resin covering the LED chip, the sealing resin containing a fluorescent substance for emitting light of a wavelength different from a wavelength of light from the LED chip.

Appendix 18

The LED lighting apparatus as set forth in Appendix 17, wherein the plurality of LED modules include a first LED module and a second LED module which differ from each other in color temperature of light to be emitted.

Appendix 19

The LED lighting apparatus as set forth in Appendix 18, wherein the first LED module emits light of an incandescent color, whereas the second LED module emits light of a daylight white color.

Appendix 20

The LED lighting apparatus as set forth in Appendix 18 or 19, wherein said at least two LED modules mounted on the second surface includes the first LED module and the second LED module, the first LED module and the second LED module being alternately arranged in a circumferential direction of the LED mount region.

Appendix 21

The LED lighting apparatus as set forth in any one of Appendixes 10-20, wherein the second surface is inclined with respect to the first surface at an inclination angle in a range of 5°-20°.

1G Embodiment

FIGS. 78-85 show an example of LED lighting apparatus according to a variation of the present invention. The LED lighting apparatus 101G of the present embodiment includes a support unit 200G, a plurality of LED modules 300, a power source unit 400, a receiver 500 and a cover 600. The LED lighting apparatus 101G is configured to be attached to e.g. a power supply portion 801 in a ceiling 800 via an attachment 802 for use as a ceiling light. It is to be noted that illustration of almost entirety of the cover 600 is omitted in FIG. 82 for easier understanding.

Figure 80:
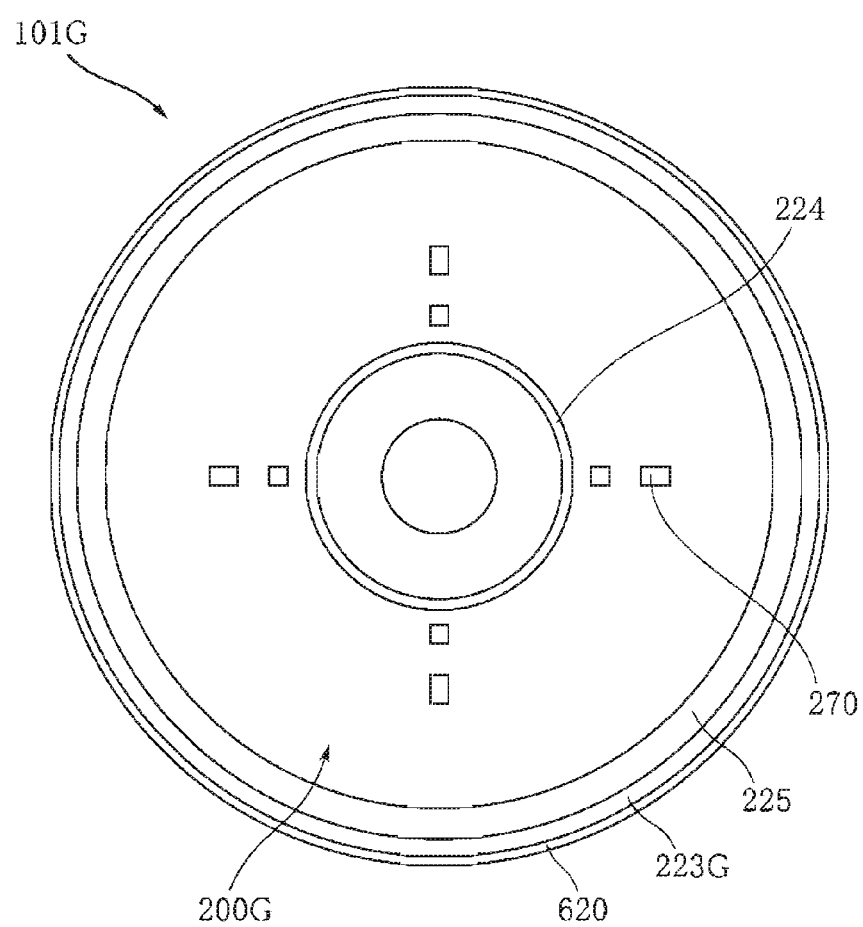
FIG. 80 is a bottom view of the LED lighting apparatus shown in FIG. 78.
Figure 81:
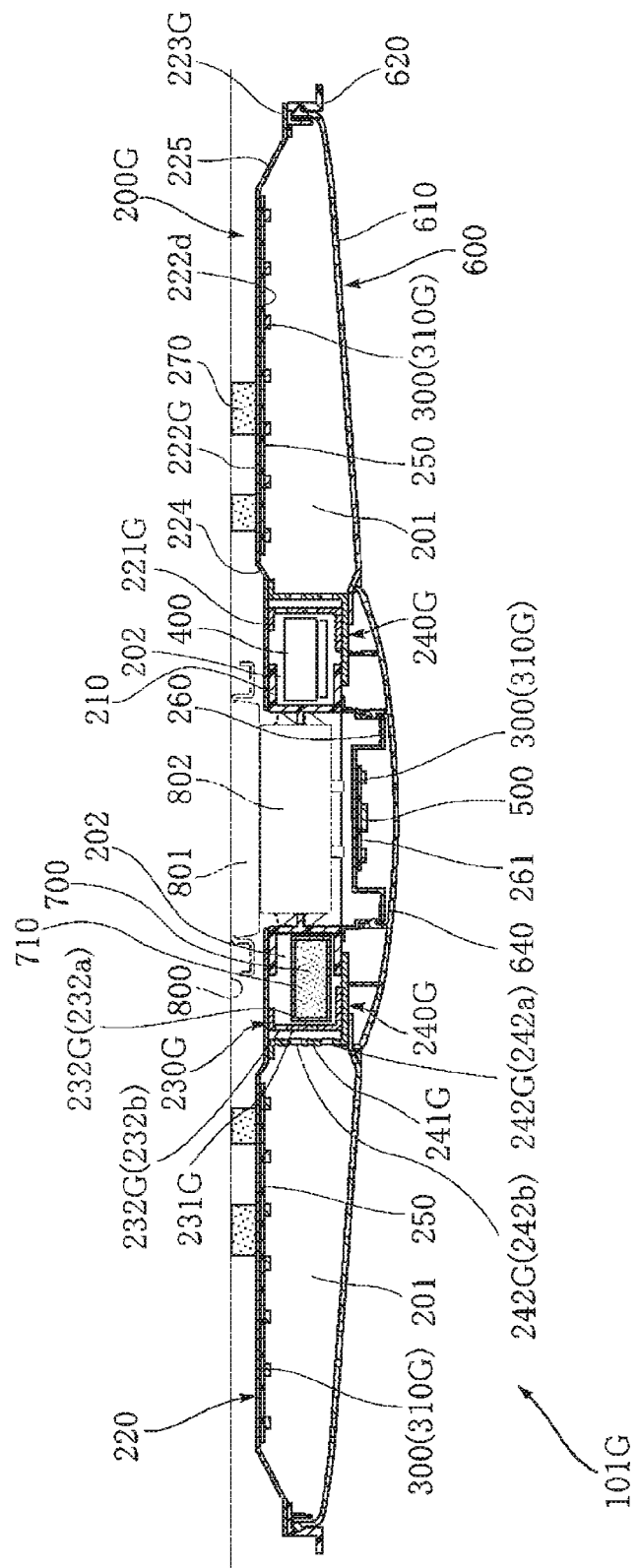
FIG. 81 is a sectional view taken along lines IV-IV in FIG. 78.
Figure 82:
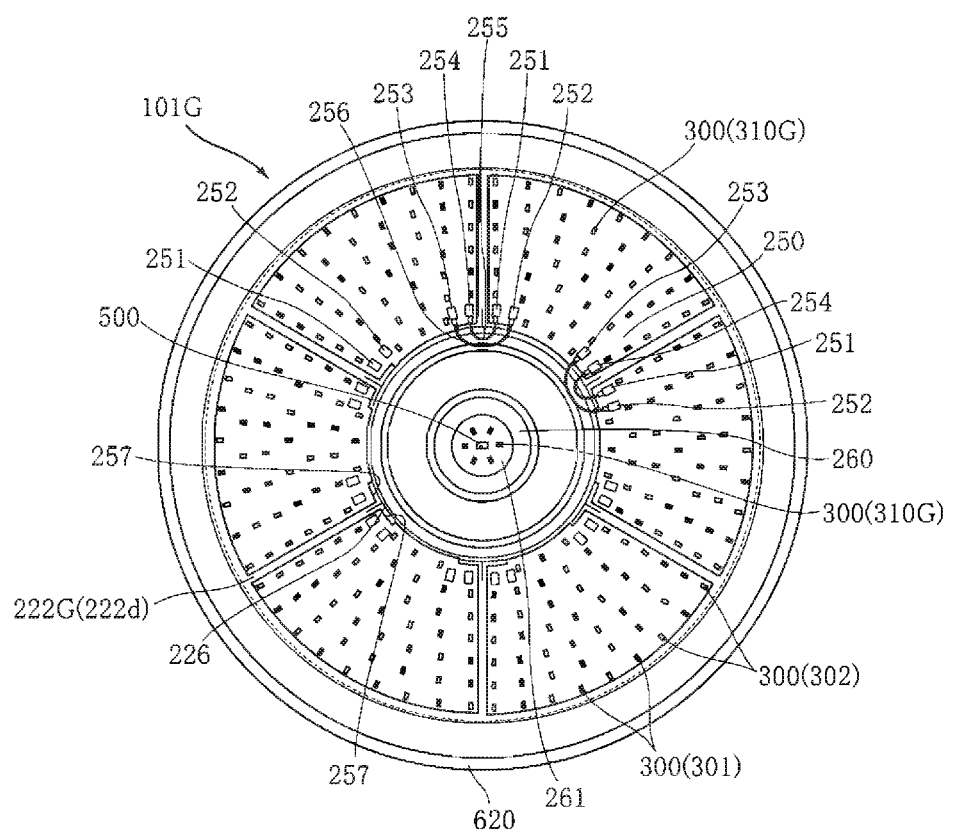
FIG. 82 is a plan view of the LED lighting apparatus shown in FIG. 78, with a cover removed.

The support unit 200G constitutes the support structure of the LED lighting apparatus 101 and includes a central member 210, a support plate 220 and an inner partition member 230G and an outer partition member 240G, as shown in FIGS. 80-82. The central member 210 is in the form of a ring having a generally U-shaped cross section and made as a one-piece member using a resin having a predetermined strength.

The support plate 220 is a member for supporting the LED modules 300 and made by press-working a metal plate, for example. The support plate 220 includes a connection portion 221G, an LED mount region 222G, and a peripheral portion 223G each of which is in the form of a ring. The connection portion 221G is a portion connected to the central member 210. As shown in FIG. 81, the connection portion 221G overlaps the upper side, i.e., the ceiling 800 side (installation side in the first direction of the present variation) of the central member 210 and is fixed to the upper end of the central member 210 by using e.g. a screw. As shown in FIGS. 81 and 82, the LED mount region 222G surrounds the connection portion 221G as viewed in plan. The LED mount region 222G is a region where the LED modules 300 are mounted, and positioned on the upper side in FIG. 81 (installation side) with respect to the connection portion 221G. The LED mount region 222G has a support surface 222d facing downward in the figure (toward the illumination side in the first direction of the present variation) i.e., opposite side of the ceiling 800. The support surface 222d extends along a plane perpendicular to the vertical direction in the figure. As shown in FIG. 81, a height differentiating portion 224 is provided between the LED mount region 222G and the connection portion 221G.

The peripheral portion 223G surrounds the LED mount region 222G and positioned on the lower side in the figure (illumination side) with respect to the LED mount region 222G. A height differentiating portion 225 is provided between the LED mount region 222G and the peripheral portion 223G.

In the support plate 220, the respective lower surfaces of the height differentiating portion 224, the LED mount region 222G, and the height differentiating portion 225 (lower surfaces in FIG. 81) are painted white and hence made highly reflective surfaces having high light reflectance. A plurality of cushioning members 270 are provided on the surface of the support plate 220 on the ceiling 800 side.

A plurality of LED substrates 250 are supported on the support surface 222d of the LED mount region 222G, and a plurality of LED modules 300 are mounted on each of the LED substrates 250. The LED substrate 250 is an insulating substrate made of e.g. glass-fiber-reinforced epoxy resin and in the form of a ring segment. As shown in FIG. 82, in the present embodiment, six LED substrates 250 are arranged adjacent to each other to form the shape of a ring as a whole.

Each LED substrate 250 has connector 251, 252, 253, 254 at an inner portion in the radial direction. The connectors 251-254 form a plurality of pairs at adjacent edges of adjacent LED substrates 250. Connectors 251, 252 are provided on one of two adjacent LED substrates 250, whereas connectors 253, 254 are provided on the other one of the two adjacent LED substrates 250. In this embodiment, the connectors 251 and 254 form a pair (first pair), and the connectors 252 and 253 form another pair (second pair). Each of the connectors 252 and 253 is positioned on the outer side of the pair of connectors 251, 254 in the circumferential direction of the LED substrate 250.

Figure 83:
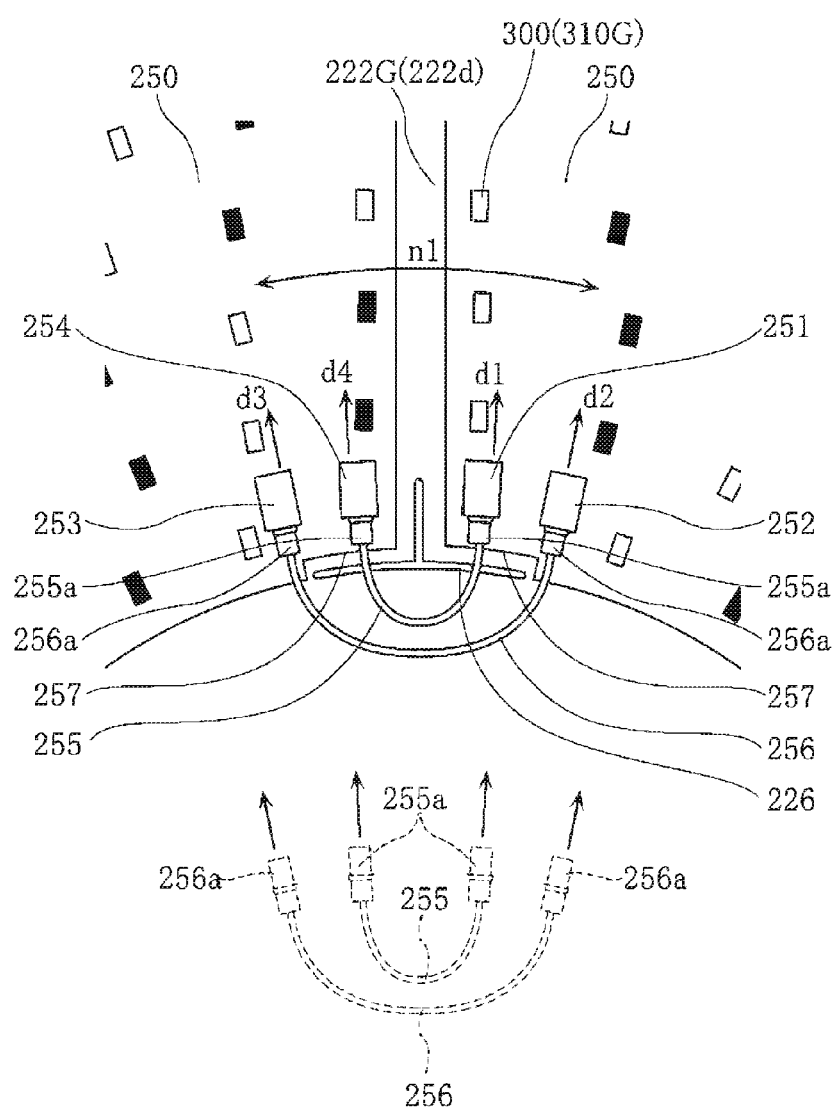
FIG. 83 is an enlarged view of a principal portion of FIG. 82.

As shown in FIGS. 82 and 83, connection ends 255a, 256a of wirings 255, 256 are connected to the connectors 251-254 along a plane of the LED substrate 250. In this embodiment, the connection ends 255a, 256a of the wirings 255, 256 are male terminals, which are inserted into cylindrical female terminals of the connectors 251-254. For instance, the connection ends 255a, 256a are in the form of a round rod and inserted into the connectors 251-254 while sandwiching the conduction portions of the wirings 255, 256. With this arrangement, in connecting the connection ends 255a, 256a to the connectors 251-254, the connection ends 255a, 256a (wirings 255, 256) are in a rotatable state relative to the connectors 251-254. By connecting opposite connection ends 255a of the wiring 255 to the paired connectors 251 and 254, adjacent LED substrates 250 are electrically connected to each other via the wiring 255. Similarly, by connecting opposite connection ends 256a of the wiring 256 to the paired connectors 252 and 253, adjacent LED substrates 250 are electrically connected to each other via the wiring 256. As noted before, the connectors 252 and 253 are arranged on the outer side of the connectors 251 and 254 in the circumferential direction n1 of the LED substrates 250. Correspondingly to the arrangement of the connectors 251-254, the wiring 256 for connection to the connectors 252, 253 is made longer than the wiring 255 for connection to the connectors 251, 254, and there is a considerable difference in length between the wires 255 and 256. In FIG. 82, the wirings 255, 256 are illustrated as connected to only some of a plurality of pairs of adjacent LED substrates 250, and illustration of the wirings is omitted with respect to remaining pairs of LED substrates 250.

As better shown in FIG. 83, the connection ends 255a, 256a are connected to the connectors 251-254 in directions d1-d4 crossing the circumferential direction n1 of the LED substrates 250. In this embodiment, the connection directions d1-d4 are along the radial direction of the LED substrates 250 and oriented from the inner side toward the outer side in the radial direction.

In this embodiment, the LED substrates 250 have cutouts 257 at the edges. Each cutout 257 is positioned at an inner end in the radial direction and at an edge in the circumferential direction of each LED substrate 250. The support surface 222d of the support plate 220 is formed with a positioning portion 226. The positioning portion 226 is formed by e.g. silkscreen printing and has a color slightly darker than the white painting of the support surface 222d. The positioning portion 226 is provided at a position that corresponds to the cutout 257 when the LED substrate 250 is placed on the support surface 222d. The cutout 257 and the positioning portion 226 provide the positioner in this variation of the invention.

As shown in FIG. 81, each of the inner and the outer partition members 230G, 240G is in the form of a ring having a generally L-shaped cross section and made by e.g. press-working a metal plate. The inner and the outer partition members 230G and 240G include partition walls 231G and 241G, respectively, extending in the vertical direction in the figure. The partition walls 231G and 241G are spaced from each other in the radial direction of the LED substrates 250.

Figure 84:
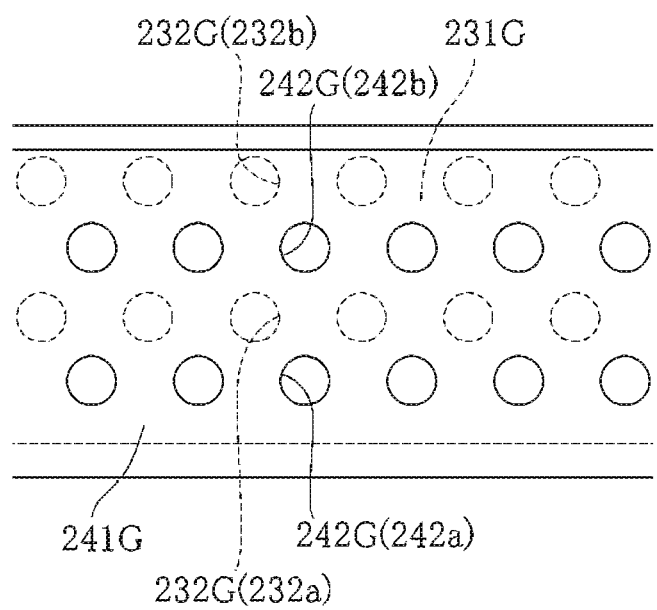
FIG. 84 shows part of a partition as developed as viewed in a radial direction of an LED substrate.

As shown in FIGS. 81 and 84, each of the partition walls 231G and 241G is formed with a plurality of through-holes 232G and 242G penetrating in the radial direction of the LED substrates 250. As shown in FIG. 84, the through-holes 232G in the partition wall 231G are arranged in two upper and lower rows extending in the circumferential direction of the LED substrates 250. That is, the through-holes 232G include a plurality of through-holes 232a positioned on the lower side in the figure (illumination side) and a plurality of through-holes 232b positioned on the upper side in the figure (installation side). The through-holes 242G in the partition wall 241G are arranged in two upper and lower rows extending in the circumferential direction of the LED substrates 250. That is, the through-holes 242G include a plurality of through-holes 242a positioned on the lower side in the figure (illumination side) and a plurality of through-holes 242b positioned on the upper side in the figure (installation side). The through-holes 232G (232a, 232b) formed in the partition wall 231G and the through-holes 242G (242a, 242b) formed in the partition wall 241G do not overlap each other in the radial direction of the LED substrates 250. The through-holes 232G and 242G account for 30% or less of the area of the partition walls 231G and 241G, respectively. With this proportion, reduction in strength of the partition walls 230G, 240G is prevented.

The upper ends of the inner and the outer partition members 230G, 240G overlap the connection portion 221G and are fixed to the connection portion 221G by using e.g. a screw. The lower end of the inner partition member 230G is fixed to the lower end of the outer partition member 240G. The lower end of the outer partition member 240G overlaps the central member 210 and is fixed to the central member 210 by using e.g. a screw.

As will be understood from FIG. 81, the central member 210, the connection portion 221G and the partition members 230G, 240G form a hollow ring-shaped portion having a rectangular cross section. As will be described later, the power source unit 400 and an adsorbent 700 are placed in the hollow ring-shaped portion. The LED accommodating space 201 (LED accommodating portion) in which the LED substrates 250 are accommodated and the power source accommodating space 202 (power source accommodating portion) in which the power source unit 400 is accommodated are partitioned by the partition walls 231G, 241G. However, the LED accommodating space 201 and the power source accommodating space 202 communicate with each other via the through-holes 232G, 242G formed in the partition walls 231G, 241G.

Figure 85:
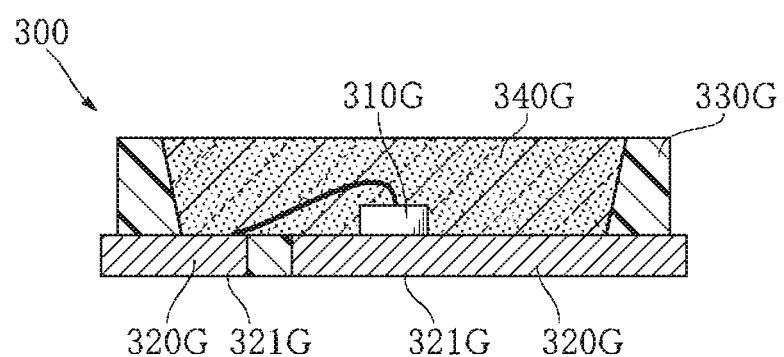
FIG. 85 is a sectional view showing an example of LED module used for the LED lighting apparatus of FIG. 78.

Each of the LED modules 300 is in the form of an elongated rectangle as viewed in plan. FIG. 85 is a sectional view of the LED module 300 in a plane perpendicular to the width direction. As shown in the figure, the LED module 300 includes a pair of leads 320G, an LED chip 310G, a sealing resin 340G and a case 330G. The paired leads 320G are made of e.g. Cu alloy. The LED chip 310G is mounted on one of the leads 320G. The surfaces of the leads 320G opposite from the surface on which the LED chip 310G is mounted serve as mounting terminals 321G for surface-mounting the LED module 300. The LED chip 310G is the light source of the LED module 300 and is configured to emit e.g. blue light. The sealing resin 340G protects the LED chip 310G. The sealing resin 340G is made of a light-transmitting resin material containing a fluorescent substance that emits yellow light when excited by light from the LED chip 310G. According to this structure, the LED module 300 can be configured to emit light of a desired color temperature. Instead of the fluorescent substance that emits yellow light, mixture of a fluorescent substance that emits red light and a fluorescent substance that emits green light may be used. The case 330G is made of e.g. white resin and reflects the light traveling toward the sides from the LED chip 310G in the upward direction. An LED of a type that uses two wires for connection to the paired leads 320G may be employed as the LED chip 310G.

All the LED modules 300 may be the LED modules configured to emit light of an incandescent color or those configured to emit light of a daylight white color. Alternatively, the LED modules 300 may comprise a combination of these two types of LED modules. In this embodiment, LED modules of an incandescent color and LED modules of a daylight white color are employed. That is, the LED modules 300 consist of LED modules 301 for emitting an incandescent color and LED modules 302 for emitting a daylight white color 302. For easier understanding, the incandescent color LED modules 301 are illustrated in black in FIG. 82.

In the present embodiment, the LED modules 300 are arranged on the LED mount region 222G to form seven concentric circles as viewed in plan. In each of the circles of the LED modules 300, the incandescent color LED modules 301 and the daylight white color LED modules 302 are alternately arranged.

In this embodiment, as shown in FIG. 81, a support stay 260 is provided in the cover 600. The support stay 260 is arranged below the central member 210 in the figure. Below the support stay 260 is provided a circular substrate 261. A plurality of LED modules 300 are mounted on a circle on the substrate 261. All the LED modules 300 are incandescent color modules 301.

The power source unit 400 converts e.g. commercial AC of 100 V supplied through a power supply portion 801 in the ceiling 800 to DC power suitable for lighting the LED chips 310F and supplies the power to the LED modules 300. The power source unit 400 includes e.g. a transformer, a capacitor, a resistor, a diode and an IC. The power source unit 400 is configured to individually control the brightness of the incandescent color LED modules 301 and the brightness of the daylight white color LED modules 302. With this arrangement, the LED lighting apparatus 101G can emit light of a desired color from the incandescent color to the daylight white color. The power source unit 400 can turn on or off the LED modules 300 supported on the support stay 260 (substrate 261) separately from other LED modules 300. In the present embodiment, as shown in FIG. 81, the power source unit 400 is accommodated in the power source accommodating space 202 in the hollow ring-shaped portion made up of the central member 210, the connection portion 221G, and the partition members 230G, 240G.

The receiver 500 receives a signal transmitted from a transmitting portion, not shown, and is mounted on the substrate 261 in the present embodiment. The signal received by the receiver 500 is sent to the power source unit 400. In accordance with the signal instruction, the power source unit 400 controls the lighting state of the LED modules 300.

The cover 600 constitutes most of the appearance of the LED lighting apparatus 101 and includes a main illumination portion 610, an outer frame 620 and a center portion 640. The main illumination portion 610 is made of e.g. milky-white translucent resin. Most part of the light from LED chips 310G (LED modules 300) passes through the main illumination portion 610 to be emitted to the outside. The main illumination portion 610 is in the form of a ring corresponding to the shape of the LED mount region 222G and covers the LED mount region 222G. As shown in FIG. 81, the main illumination portion 610 is slightly inclined to be displaced downward in the figure as proceeding toward the center.

The outer frame 620 surrounds main illumination portion 610 from outside and is in the form of a ring. The outer frame 620 is made of e.g. a transparent resin or a milky white translucent resin. The outer frame 620 is arranged to overlap the peripheral portion 223G of the support plate 220 and fixed to the peripheral portion 223G. The outer diameter of the outer frame 620 (cover 600) is e.g. about 600 mm. The center portion 640 is made of e.g. a milky white translucent resin and arranged on the inner side of the main illumination portion 610. The center portion 640 covers the support stay 260.

As shown in FIG. 81, the adsorbent 700 in the power source accommodating space 202 is filled in a hollow container 710 having vent holes (not shown). As the adsorbent 700, a porous material that adsorbs bromine compound well is suitably used. Examples of such material include zeolite and charcoal powder. The adsorbent 700 may contain either or both of zeolite and charcoal powder.

The advantages of the LED lighting apparatus 101G are described below.

According to this embodiment, as described with reference to FIG. 83, the connection directions d1, d4 and d2, d3 in which the connection ends 255a, 256a of the wirings 255, 256 are connected to the connectors 251, 254 and the connectors 252, 253 are along the radial direction of the LED substrates 250. With this arrangement, the female terminals (connection portions) of the connectors 251, 254 and the connectors 252, 253 are arranged side by side so as not to face each other. Thus, even when rotation moment is exerted between the connectors 251, 254 and the wiring 255 or between the connectors 252, 253 and the wiring 256, the wirings 255, 256 are prevented from unduly rotating. Thus, such a situation that light from the LED chips 310G (LED modules 300) is blocked due to unintentional movement of the curved portions of the wirings 255, 256 is avoided. Thus, the LED lighting apparatus 101G achieves more uniform illumination.

With the arrangement in which the connection directions d1, d4 and d2, d3 are along the radial direction of the LED substrates 250, the connection directions d1 and d4 are generally parallel to each other, so are the connection directions d2 and d3. This arrangement is suitable for reliably preventing rotation of the wires 255, 256 and hence achieving uniform illumination. Moreover, the generally parallel connection directions d1, d4 as well as the generally parallel connection directions d2, d3 facilitate the work of connecting the wirings 255, 256 (connection ends 255a, 256a) to the connectors 251-254.

In this embodiment, for adjacent ones of the LED substrates 250, a plurality of pairs of connectors 251, 254 and 252, 253 are provided. With this structure, when the LED modules 300 include a plurality of types of LED modules that emit light of different color temperatures, such as incandescent color LED modules 301 and daylight color LED modules 302, a plurality of pairs of connectors 251, 254 and 252, 253 are allotted to each type of the LED modules. This is favorable for individually controlling different types of LED modules 300.

Each of the connectors 252, 253 is arranged on the outer side with respect to the pair of the connectors 251, 254 in the circumferential direction of the LED substrates 250. Correspondingly to this arrangement of the connectors 251-254, the wiring 255 for connection to the inner connectors 251, 254 and the wiring 256 for connection to the outer connectors 252, 253 are made to have a considerable difference in length. Thus, connection of the wirings 255, 256 to wrong connectors 251-254 is prevented, so that improper connection of the wrings 255, 256 is reliably prevented.

In placing the LED substrates 250 on the support plate 220, the LED substrates 250 can be arranged at proper positions by positioning the cutouts 257 of the LED substrates 250 relative to the positioning portions 226 of the support plate 220. Thus, the LED substrates 250 are arranged at equal intervals. Accordingly, the wirings 255, 256 for connection to the connectors 251, 254 and the connectors 252, 253 do not need to be made insufficiently long to compensate for interval variations.

The partition walls 231G and 241G, which partition between the LED accommodating space 201 accommodating the LED substrates 250 and the power source accommodating space 202 accommodating the power source unit 400, have a plurality of through-holes 232G and a plurality of through-holes 242G, respectively. Generally, the volume of the power source accommodating space 202 is considerably small as compared with that of the LED accommodating space 201, and the power source accommodating space 202 tends to be heated up due to the heat generated by the power source unit 400. According to the LED lighting apparatus 101G, however, air in the power source accommodating space 202 flows into the LED accommodating space 201 through the through-holes 232G and 242G, so that the power source accommodating space 202 is prevented from being heated up.

Due to the heat of the power source unit 400, bromine in flux, which is used for the parts or the assembling of the power source unit 400, may be diffused into the power source accommodating space 202 and exists as a bromine compound. A bromine compound can be a cause for the deterioration of the LED modules 300, and the bromine compound in the power source accommodating space 202 may enter the LED accommodating space 201 via the through-holes 232G, 242G. In this embodiment, however, the adsorbent 700 is arranged in the power source accommodating space 202. Thus, by adsorbing the bromine compound by the adsorbent 700, the bromine compound is prevented from entering the LED accommodating space 201 side, whereby deterioration of the LED modules 300 is prevented.

The through-holes 232G and 242G formed in the partition walls 231G and 241G include through-holes 232a, 232b and through-holes 242a, 242b, respectively, arranged in two upper and lower rows. According to this arrangement, when the temperature of the power source accommodating space 202 becomes higher than that of the LED accommodating space 201, air of a higher temperature in the power source accommodating space 202 flows into the LED accommodating space 201 through the through-holes 232b and 242b in the upper rows, while air of a lower temperature in the LED accommodating space 201 flows into the power source accommodating space 202 through the through-holes 232a and 242a in the lower rows. Thus, air convection easily occurs between the LED accommodating space 201 and the power source accommodating space 202. This is favorable for preventing the power source accommodating space 202 from being excessively heated.

The through-holes 232G (232a, 232b) in the partition wall 231G and the through-holes 242G (242a, 242b) in the partition wall 241G do not overlap each other as viewed in the radial direction of the LED substrates 250. According to this arrangement, even when the light traveling within the LED accommodating space 201 inward in the radial direction of the substrates 250 passes through the through-holes 242G of the partition wall 241G positioned on the outer side in the radial direction, the light is reflected by the surface of the partition wall 231G on the inner side to return into the LED accommodating space 201 through the through-holes 242G. Thus, the light traveling within the LED accommodating space 201 is prevented from traveling into the power source accommodating space 202, which contributes to the uniform illumination by the LED lighting apparatus 101G.

The portion made up of the central member 210, the connection portion 221G and the partition members 230G, 240G support the weight of most part of LED lighting apparatus 101G including the support plate 220 and the cover 600, so that a large load is exerted on this portion. In the present embodiment, the central member 210, the connection portion 221G and the partition members 230G, 240G form a hollow ring-shaped portion having a rectangular cross section. The provision of such a hollow ring-shaped portion enhances the mechanical strength.

As shown in FIGS. 81 and 82, on the inner side of the center portion 640 of the cover 600, the substrate 261 in the form of a ring is arranged on the inner side of the LED substrates 250 in the radial direction, and a plurality of LED modules 300 are mounted on the substrate 261 to form a circle. In this LED lighting apparatus 101G, the LED modules 300 on the substrate 261 can be configured to be turned on separately from other LED modules, to function as a circular night light.

Figure 86:
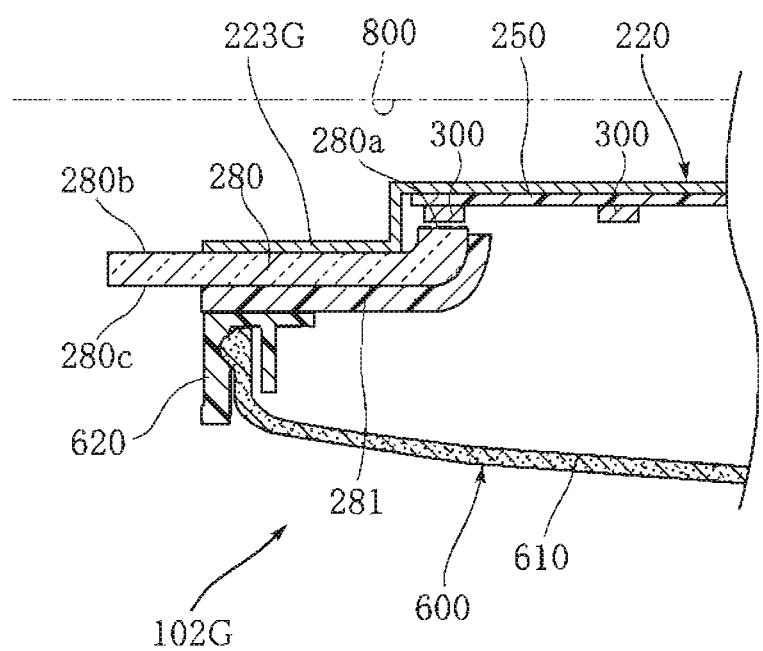
FIG. 86 is a sectional view corresponding to FIG. 81, showing a principal portion of another example of the LED lighting apparatus according to a variation of the present invention.

FIG. 86 shows another embodiment of this variation of the present invention. In these figures, the elements that are identical or similar to those of the foregoing embodiment are designated by the same reference signs as those used for the foregoing embodiment.

In the LED lighting apparatus 101G of the foregoing embodiment, a light emitting portion in the form of a ring (LED modules 300 on the substrate 261) is provided on the inner side of the center portion 640 of the cover 600. Unlike this, in the LED lighting apparatus 102G of this embodiment shown in FIG. 86, a light emitting portion in the form of a ring is arranged near the outer frame 620 of the cover 600. In FIG. 86, only the portions of the LED lighting apparatus 102G which need to be illustrated for describing the difference from the foregoing embodiment are shown, and illustration of other portions is omitted.

The LED lighting apparatus 102G of this embodiment includes a light guide 280 and a reflector 281 that covers part of the light guide 28. The light guide 280 is made of e.g. transparent acrylic resin and generally in the form of a ring-shaped plate. The light guide 280 serves to guide the light from the LED modules 300 provided adjacent to the outer periphery of the LED substrates 250 outward in the radial direction of the cover 60. The light guide 280 includes an incident surface 280a facing the LED modules 300 and emission surfaces 280b, 280c. The reflector 281 in made of e.g. white resin. The portion of the light guide 280 from the inner side to the center in the radial direction is sandwiched between the reflector 281 and the peripheral portion 223G of the support plate 220. The outer end in the radial direction of the light guide 280 is exposed from the reflector 281 and the peripheral portion 223G. Of the exposed portion, the surface facing upward in the figure (ceiling 800 side) provides the emission surface 280b, whereas the surface facing downward in the figure provides the emission surface 280c. The emission surfaces 280b, 280c are rough surfaces with minute irregularities.

Light emitted from the LED modules 300 facing the incident surface 280a of the light guide 280 enters the light guide 280 through the incident surface 280a and travels outward in the radial direction while being repetitively reflected within the light guide 280. The radially inner region of the light guide 280 is sandwiched between the reflector 281 and the peripheral portion 223G, so that the light within the light guide 280 does not easily travel to the outside. The light traveling in the light guide 280 in the radial direction is emitted to the outside through the emission surfaces 280b, 280c. The LED modules 300 facing the incident surface 280a are configured to be turned on or of separately from other LED modules 300 on the LED substrates 250.

In the LED lighting apparatus 102G of this embodiment, only the LED modules 300 facing the incident surface 280a can be turned on to emit light from the emission surfaces 280b and 280c, which are positioned on the outer periphery of the LED lighting apparatus 102G, toward the ceiling 800 side and the opposite side, to function as a circular night light.

The LED lighting apparatus according to the variation of the invention is not limited to the foregoing embodiment. The specific structure of each part of the LED lighting apparatus according to the variation of the invention may be varied in design in many ways.

Figure 87:
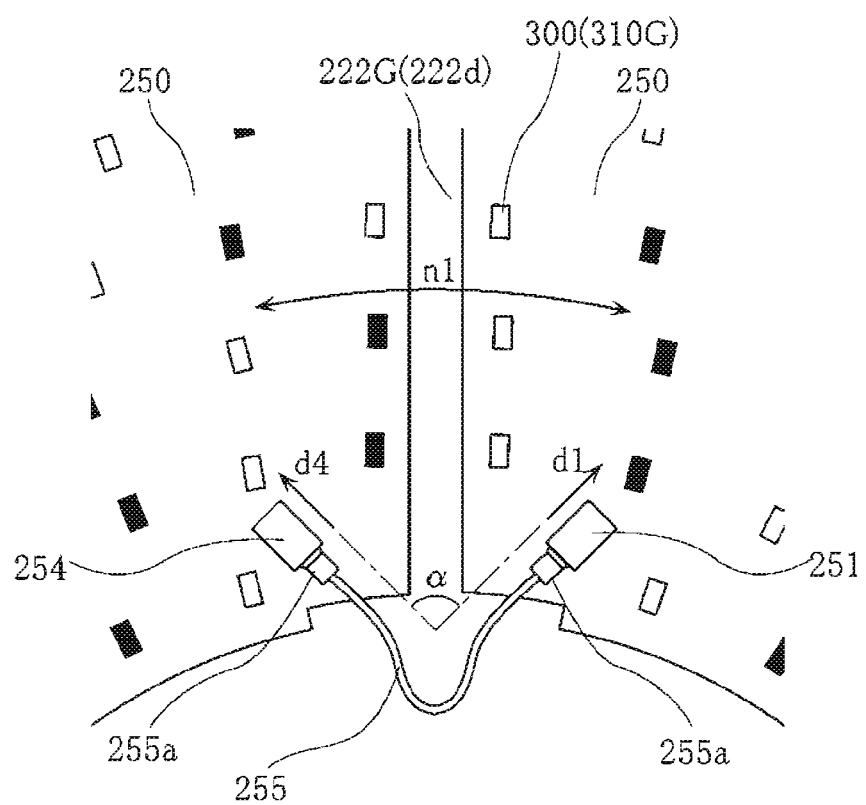
FIG. 87 is a plan view corresponding to FIG. 83, showing a principal portion of another example of the LED lighting apparatus according to a variation of the present invention.
Figure 88:
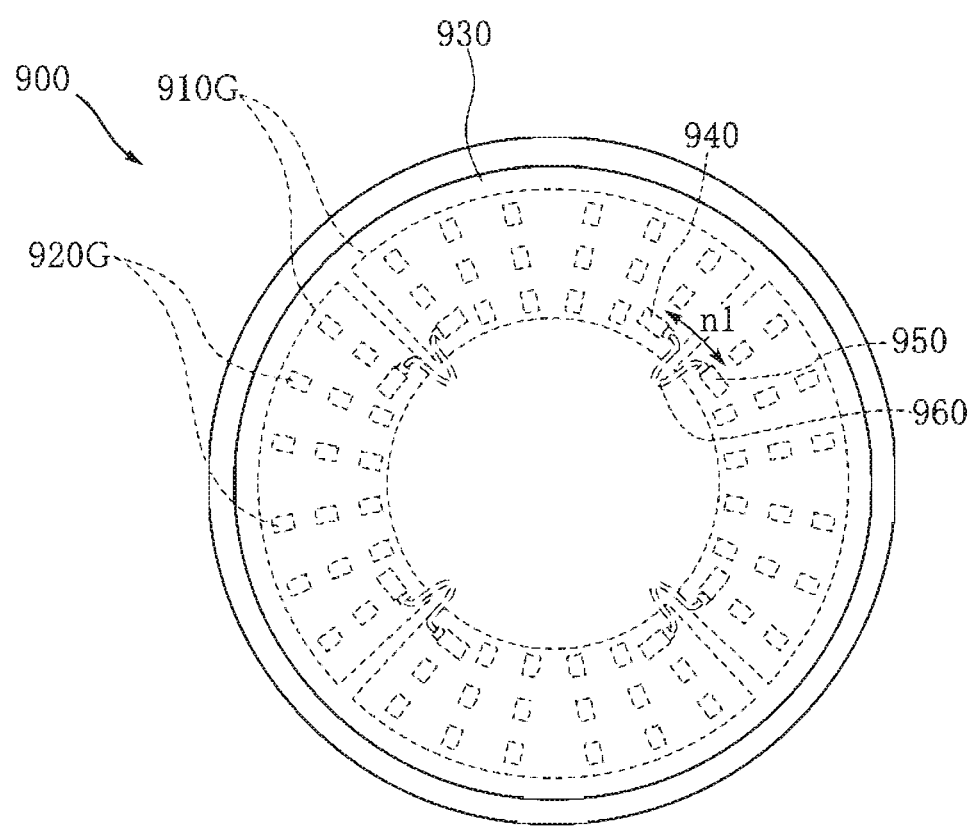
FIG. 88 is a plan view showing an example of conventional LED lighting apparatus.

In the above-described embodiment, the connection directions (first and second connection directions) of the connection ends of the wirings to the connectors (first connector and second connector) making one pair with respect to two adjacent LED substrates are along the radial direction of the LED substrates. However, the invention is not limited to this arrangement, and the first and the second connection directions may cross the radial direction of the LED substrates. In this case, the first and the second connectors may be arranged such that the first and the second connection directions be parallel to each other or gradually separate from each other as proceeding from the inner side toward the outer side (forward in the connection directions) in the radial direction. With this arrangement again, undesirable rotation of the wirings connected to the first and the second connectors is prevented. FIG. 87 shows the example in which the first and the second connection directions gradually separate from each other as proceeding forward in the connection directions. In this figure, only the elements corresponding to the connectors 251, 254, the wiring 255 and the adjacent elements shown in FIG. 83 are illustrated as designated by the same reference signs as those used in FIG. 83. As shown in FIG. 87, it is preferable that the connection direction d1 of the connection end 255a to the connector 251 and the connection direction d4 of the connection end 255a to the connector 254 form an angle α of 90° or less. When the angle α is 90°, the rotation direction of the wiring 255 relative to the connector 251 and the rotation direction of the wiring 255 relative to the connector 254 form a right angle, so that rotation of the wiring 255 relative to the connectors 251, 254 is properly prevented. As will be understood from this, when the angle α formed by the connection directions d1 and d4 is smaller than 90°, rotation of the wiring 255 is less likely to occur than when the angle α is 90°, so that rotation of the wiring 255 relative to the connectors 251, 254 is properly prevented.

Although the first and the second connectors are arranged on the inner portion in the radial direction of the LED substrates in the above-described embodiment, the first and the second connectors may be arranged on the outer portion in the radial direction of the LED substrate. When a plurality of pairs, each consisting of a first connector and a second connector, are to be provided, some of these of pairs may be arranged on the inner side in the radial direction of the LED substrates, while others may be arranged on the outer side in the radial direction of the LED substrates.

The feature of the present variation of the invention is described below as Appendixes.

Appendix 1

An LED lighting apparatus comprising:
a support plate including a support surface facing an illumination side which is one side in a first direction;
a plurality of LED substrates supported on the support surface and arranged with respective edges thereof facing each other to form a ring-like shape as a whole;
a plurality of LED chips mounted on each of the LED substrates;
a cover that is arranged on the illumination side in the first direction with respect to the LED substrates and transmits light from the LED chips;
a first connector and a second connector respectively provided on one and the other of adjacent ones of the LED substrates; and
a wiring including a pair of connection ends one of which is connected to the first connector and the other one of which is connected to the second connector;
wherein the connection ends of the wiring are connected to the first connector and the second connector in a first connection direction and a second connection direction, respectively, that cross a circumferential direction of the LED substrates.

Appendix 2

The LED lighting apparatus as set forth in Appendix 1, wherein the first and the second connectors are arranged on the LED substrates at portions close to edges that are adjacent to each other in the circumferential direction.

Appendix 3

The LED lighting apparatus as set forth in Appendix 1 or 2, wherein each of the first connection direction and the second connection direction is from an inner side toward an outer side in a radial direction of the LED substrates.

Appendix 4

The LED lighting apparatus as set forth in Appendix 3, wherein the first connector and the second connector are provided on an inner portion of the LED substrates in the radial direction.

Appendix 5

The LED lighting apparatus as set forth in Appendix 1 or 2, wherein each of the first connection direction and the second connection direction is from an outer side toward an inner side in the radial direction.

Appendix 6

The LED lighting apparatus as set forth in Appendix 5, wherein the first connector and the second connector are provided on an outer portion of the LED substrates in the radial direction.

Appendix 7

The LED lighting apparatus as set forth in any one of Appendixes 2-6, wherein the first connection direction and the second connection direction are along the radial direction.

Appendix 8

The LED lighting apparatus as set forth in any one of Appendixes 2-6, wherein the first connection direction and the second connection direction are parallel to each other or gradually separate from each other as proceeding forward in the connection directions.

Appendix 9

The LED lighting apparatus as set forth in Appendix 8, wherein the first connection direction and the second connection direction form an angle of 90° or less.

Appendix 10

The LED lighting apparatus as set forth in any one of Appendixes 1-9, wherein a plurality of pairs of connectors, each pair consisting of the first connector and the second connector, are provided on the LED substrates at portions close to edges that are adjacent to each other in the circumferential direction.

Appendix 11

The LED lighting apparatus as set forth in Appendix 10, wherein the plurality of pairs of the first and the second connectors include a first pair and a second pair, the first connector and the second connector of the second pair being arranged on an outer side in the circumferential direction with respect to the first pair.

Appendix 12

The LED lighting apparatus as set forth in Appendix 10 or 11, wherein the plurality of pairs of the first and the second connectors include a third pair arranged on an outer portion in the radial direction and a fourth pair arranged on an inner portion in the radial direction.

Appendix 13

The LED lighting apparatus as set forth in any one of Appendixes 1-12, wherein the support surface or the LED substrates are provided with a positioner for showing an attachment position of each of the LED substrates relative to the support surface.

Appendix 14

The LED lighting apparatus as set forth in Appendix 13, wherein the positioner includes a cutout formed at an outer periphery of each of the LED substrates and a positioning portion provided in the support surface at a position corresponding to the cutout.

Appendix 15

The LED lighting apparatus as set forth in any one of Appendixes 1-14, further comprising:
an LED accommodating portion in which the plurality of LED substrates are arranged;
a power source accommodating portion positioned on an inner side in the radial direction with respect to the LED accommodating portion and accommodating a power source for supplying power to the LED chips; and
a partition that partitions between the LED accommodating portion and the power source accommodating portion;
wherein the partition includes a plurality of through-holes that provide communication between the LED accommodating portion and the power source accommodating portion.

Appendix 16

The LED lighting apparatus as set forth in Appendix 15, wherein: the partition includes a first partition wall and a second partition wall spaced from each other in the radial direction,
the through-holes include a plurality of first through-holes formed in the first partition wall and a plurality of second through-holes formed in the second partition wall, and
the first through-holes and the second through-holes are arranged at positions that do not overlap each other as viewed in the radial direction.

Appendix 17

The LED lighting apparatus as set forth in Appendix 15 or 16, wherein the through-holes include:
a plurality of illumination-side through-holes positioned on the illumination side in the first direction and arranged in the circumferential direction; and a plurality of installation-side through-holes positioned on an installation side opposite from the illumination side in the first direction and arranged in the circumferential direction.

Appendix 18

The LED lighting apparatus as set forth in any one of Appendixes 15-17, wherein the through-holes account for 30% or less of an area of the partition.

Appendix 19

The LED lighting apparatus as set forth in any one of Appendixes 15-18, comprising a hollow ring-shaped portion including the partition as part thereof, wherein the power source is arranged in the hollow ring-shaped portion.

Appendix 20

The LED lighting apparatus as set forth in any one of Appendixes 15-19, wherein the power source accommodating portion accommodates therein an adsorbent.

Appendix 21

The LED lighting apparatus as set forth in Appendix 20, wherein the adsorbent includes at least one of zeolite and charcoal powder.

Appendix 22

The LED lighting apparatus as set forth in any one of Appendixes 1-21, comprising a ring-shaped light emitting portion that is arranged on an inner side or an outer side in the radial direction with respect to the LED substrates and emits light from an LED chip.

Appendix 23

The LED lighting apparatus as set forth in Appendix 22, wherein the ring-shaped light emitting portion includes a ring-shaped light guide that transmits light from the LED chip for emission to outside.

The invention claimed is:
1. A lighting system comprising:
a main power source;
a power switch including a first terminal, a second terminal and a control terminal, the first terminal being connected to the main power source;
a first light source driver connected to the second terminal of the power switch;
a second light source driver connected to the second terminal of the power switch;
a first light source unit driven by the first light source driver;
a second light source unit driven by the second light source driver;
a signal processing circuit for supplying to the control terminal of the power switch a switching signal for electrically connecting or disconnecting the power switch, the signal processing circuit being configured to supply a control signal for controlling the first light source driver and the second light source driver; and
an AC/DC converter connected between the second terminal of the power switch and each of the first light source driver and the second light source driver;
wherein the AC/DC converter comprises a diode bridge circuit and a smoothing capacitor, and the second terminal of the power switch is connected to the diode bridge circuit, and
the power switch comprises a solid state relay comprising a triac.

2. The lighting system according to claim 1, wherein the first light source unit and the second light source unit include at least two white light sources of colors selected from a daylight color, a daylight white color, a white color, a warm white color and an incandescent color.

3. The lighting system according to claim 2, wherein the first light source unit comprises an LED for a daylight white color, whereas the second light source unit comprises an LED for an incandescent color.

4. The lighting system according to claim 1, wherein the AC/DC converter and a DC/DC converter are connected in this order between the power switch and each of the first light source driver and the second light source driver.

5. The lighting system according to claim 1, wherein the switching signal responds to an optical signal transmitted to the signal processing circuit.

6. The lighting system according to claim 1, further comprising a switch driving circuit provided with a bipolar transistor, wherein the switching signal outputted from the signal processing circuit is supplied to the control terminal of the power switch via the switch driving circuit.

7. The lighting system according to claim 1, wherein each of the first light source driver and the second light source driver is driven by a pulse width modulation signal outputted from the signal processing circuit.

8. The lighting system according to claim 1, wherein the main power source comprises a DC power source.

9. The lighting system according to claim 1, wherein the triac is a photo triac.

10. The lighting system according to claim 1, further comprising a single connection line including a first end and a second end opposite to the first end, wherein the first end of the connection line is connected directly to the main power source, and the second end of the connection line is connected directly to the first terminal of the power switch.

11. The lighting system according to claim 1, wherein each of the first light source unit and the second light source unit includes a current input portion and a current output portion, and both the current input portion and the current output portion are connected to a corresponding one of the first light source driver and the second light source driver.

12. The lighting system according to claim 11, wherein the first light source driver is connected between the first light source unit and the second terminal of the power switch, and the second light source driver is connected between the second light source unit and the second terminal of the power switch.

* * * * *